(12) United States Patent
Ikeda

(10) Patent No.: US 7,655,516 B2
(45) Date of Patent: Feb. 2, 2010

(54) SEMICONDUCTOR DEVICE AND METHOD OF MANUFACTURING THE SAME

(75) Inventor: Keiji Ikeda, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 274 days.

(21) Appl. No.: 11/790,549

(22) Filed: Apr. 26, 2007

(65) Prior Publication Data

US 2008/0064156 A1 Mar. 13, 2008

(30) Foreign Application Priority Data

Sep. 12, 2006 (JP) ............................. 2006-246989

(51) Int. Cl.
*H01L 21/8238* (2006.01)
*H01L 29/76* (2006.01)

(52) U.S. Cl. ................ 438/199; 438/229; 438/299; 257/369; 257/382; 257/407

(58) Field of Classification Search ................ 257/369, 257/377, 382, 407; 438/151, 154, 199, 229, 438/230, 299, 301, 303, 581
See application file for complete search history.

(56) References Cited

U.S. PATENT DOCUMENTS

| 6,621,131 | B2 | 9/2003 | Murthy et al. | |
| 6,703,291 | B1 * | 3/2004 | Boyanov et al. | 438/507 |
| 2007/0215956 | A1 * | 9/2007 | Tsuchiya et al. | 257/407 |

* cited by examiner

*Primary Examiner*—Kevin M Picardat
(74) *Attorney, Agent, or Firm*—Westerman, Hattori, Daniels & Adrian, LLP

(57) ABSTRACT

In an nMOSFET, a gate electrode is formed by a silicide layer comprised of NiSi. In a surface layer of a Ge substrate on both sides of the gate electrode, NiGe layers which are germanide layers comprised of NiGe are formed. On junction interfaces between the NiGe layers and the Ge substrate, first layers are formed which are formed by segregating a predetermined atom with high concentration, and on an interface between the gate electrode and an insulation film, a second layer is formed which is formed by segregating the same atom as that of the first layer with high concentration.

16 Claims, 44 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2006-246989, filed on Sep. 12, 2006, the entire contents of which are incorporated herein by reference.

BACKGROUND OF THE INVENTION

1. Field of the Invention

The present invention relates to a semiconductor device and a method of manufacturing the same, more particularly, to a complementary field-effect transistor (CMOSFET) which uses germanium (Ge) and silicon germanium (SiGe) as a material of its channel.

2. Description of the Related Art

Currently, MOSFETs using silicon (Si) as a channel material are widely in practical use. In recent years, designs to improve carrier mobility of the MOSFETs are attempted, such as giving strain in a channel region or the like (see, for example, the specification of U.S. Pat. No. 6,621,131). As another design to improve carrier mobility, MOSFETs and the like using Ge as their channel material have been developed.

A conventional Ge-channel CMOSFET using Ge as its channel material has a similar structure to that of an existing Si-channel MOSFET using Si as its channel material, and as its source/drain regions, diffusion layers doped with impurities are mainly used.

However, at present, the development of the Ge-channel MOSFET is targeted mostly at a p-channel type. To form a Ge-channel CMOSFET by using a Ge substrate or the like, used is a method to form source/drain regions by pn junctions in such a manner that diffusion layers are formed by doping a Ge substrate or the like with an n-type impurity atom. When this method is adopted, it is essentially difficult to form the source/drain junctions by an n-type impurity because the n-type impurity is generally large in diffusion coefficient and small in solubility limit. This is one of the reasons why it has been difficult to realize an extremely scaled Ge-channel CMOSFET of an n-channel type. Therefore, at present, a scaled and high-speed CMOSFET including Ge-channel CMOSFETs of both a p-channel type and an n-channel type has not been realized.

In a Ge-channel CMOSFET, a metal gate comprised of TaN, TiN, or the like is in the mainstream as a gate electrode, but etching for pattern formation of the metal gate is difficult and an aggressively scaled gate electrode is difficult to form. Further, a threshold voltage is determined depending on its work function, and therefore, it is essentially difficult to adjust the threshold voltage.

In this respect, if reactive ion etching (RIE) is used, a gate electrode is relatively easily formed and there is a possibility that the threshold voltage can be adjusted by doping, and in view of the above, the use of polycrystalline silicon as a material of the gate electrode is also conceivable. However, this method is not suitable for forming a Ge-channel CMOSFET because this method requires high-temperature heat treatment at about 700° C. when the polycrystalline silicon is deposited and when an impurity with which the inside of the polycrystalline silicon is activated. Moreover, no study has been made regarding the control of a threshold voltage in a case where the polycrystalline silicon is used as the material of the gate electrode.

As another method, the use of high Ge-concentration SiGe as a channel material to realize higher speed has conventionally been considered, but such a SiGe-channel CMOSFET has the same disadvantages as those of the Ge-channel CMOSFET.

SUMMARY OF THE INVENTION

The present invention was made in view of the above problems, and it is an object of the present invention to provide a semiconductor device and a method of manufacturing the same which can realize a high-speed operation by using Ge or SiGe as a semiconductor material forming a channel and which can achieve desired threshold voltage control and a high effective mobility characteristic by low-temperature and simple manufacturing processes.

A semiconductor device of the present invention is a complementary semiconductor device including an n-channel transistor and a p-channel transistor, wherein each of the n-channel transistor and the p-channel transistor includes: a semiconductor region comprised of germanium (Ge) or $Si_xGe_{1-x}$ (0<x<1); a gate electrode which is formed on the semiconductor region via a gate insulation film and comprised of an intermetallic compound containing silicon (Si), germanium (Ge), or $Si_xGe_{1-x}$ (0<x<1); and a pair of first junction regions formed in the semiconductor region on both sides of the gate electrode and each comprised of an intermetallic compound containing Ge.

A method of manufacturing a semiconductor device of the present invention is a method of manufacturing a complementary semiconductor device including an n-channel transistor and a p-channel transistor, the method including: depositing an electrode film comprised of silicon (Si), germanium (Ge), or $Si_xGe_{1-x}$ (0<x<1) on a semiconductor region comprised of silicon (Si), germanium (Ge), or $Si_xGe_{1-x}$ (0<x<1) via a gate insulation film, thereafter processing the electrode film into an electrode shape, and leaving the electrode film both in a region for forming the n-channel transistor and a region for forming the p-cannel transistor in the semiconductor region; forming sidewall insulation films on both side surfaces of each of the electrode films; depositing a metal film which is capable of forming an intermetallic compound with silicon (Si) and germanium (Ge), on an entire surface of the semiconductor region including the electrode films; and performing heat treatment, thereby making the metal film react with portions, of the electrode films, in contact with the metal film to form gate electrodes each comprised of an intermetallic compound containing silicon (Si), germanium (Ge), or $Si_xGe_{1-x}$ (0<x<1), as well as making the metal film react with portions, of the semiconductor region, in contact with the metal film to form a pair of first junction regions each comprised of an intermetallic compound containing germanium (Ge) in a surface layer of the semiconductor region on both sides of each of the electrode films.

DETAILED DESCRIPTION OF THE PREFERRED EMBODIMENTS

Basic Gist of the Present Invention

Figure 1A:
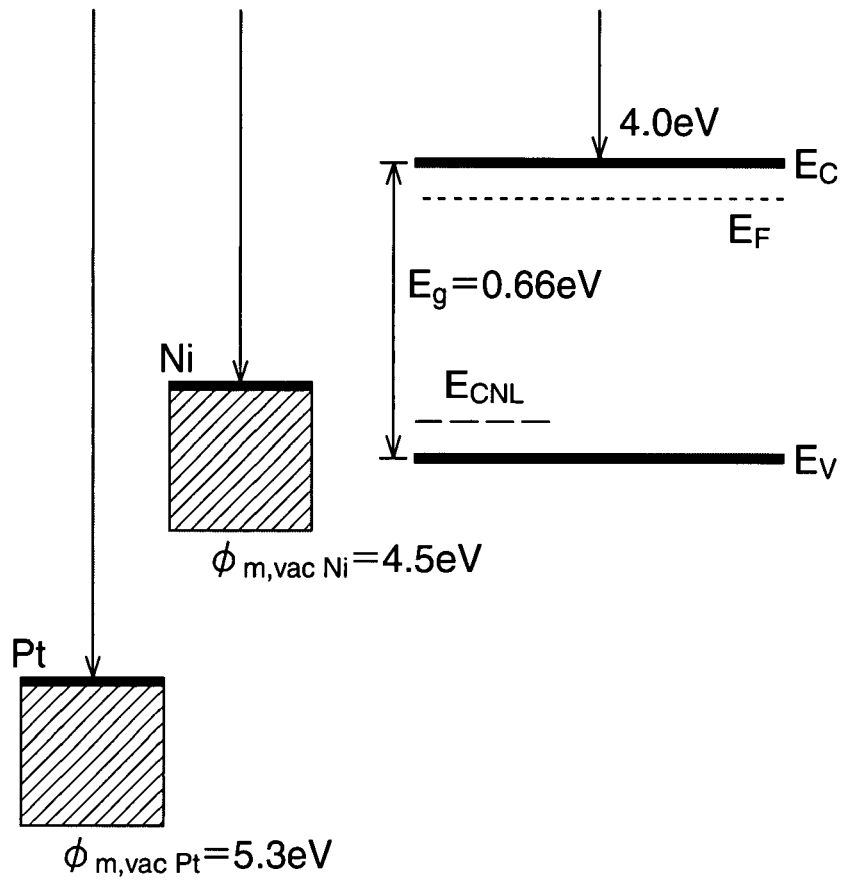
FIG. 1A and FIG. 1B are charts showing a band structure of Ge.

Hereinafter, a basic gist of the present invention will be described in detail with reference to the drawings, taking a CMOSFET as an example.

A CMOSFET will be described as an example in which each of an n-channel MOSFET (nMOSFET) and a p-channel MOSFET (pMOSFET) has a Ge channel (in other words, channel regions are formed in a Ge semiconductor region), and a Ge intermetallic compound is used for a source region and a drain region (source/drain regions) which are a pair of junction regions in each of the MOSFETs, and a Si intermetallic compound containing the same metal as that contained in the intermetallic compound of the source/drain regions is used for gate electrodes.

In the bulk of Ge, electron mobility is twice as high and hole mobility is four times as high as those in Si. In a simple comparison, such a Ge-channel CMOSFET using Ge as a channel material is expected to have a current driving capability twice as high in the nMOSFET and four times as high in the p-MOSFET as that of a Si-channel MOSFET, though the situation slightly differs in inversion layers.

Further, when the source/drain regions in the Ge-channel CMOSFET are comprised of the intermetallic compound, the source/drain regions can be formed shallower both in the nMOSFET and the pMOSFET and parasitic resistance can be made lower by about 1 order than when the source/drain regions are comprised of impurity diffusion regions. The source/drain regions of the Ge-channel CMOSFET can be comprised of, for example, an intermetallic compound containing Ge. Such an intermetallic compound can be formed by heat-treating a predetermined metal film formed on a Ge substrate or a Ge layer, as will be described later.

Further, in the present invention, the gate electrodes are formed by using a Si intermetallic compound containing the same metal as that contained in the intermetallic compound of the source/drain regions. In the Ge-channel CMOSFET, high-temperature heat treatment in its manufacturing processes poses a problem of deteriorating an electric characteristic of a channel interface of a gate insulation film and thus is not suitable. Therefore, amorphous Si which can be deposited at lower temperature than polycrystalline silicon is used as a gate material, and the amorphous Si is processed into an electrode shape. Then, a predetermined metal film is formed on the Ge substrate or the Ge layer to be heat-treated, whereby the gate electrodes comprised of the Si intermetallic compound can be formed simultaneously with the formation of the aforesaid source/drain regions. Here, appropriate selection of used metal enables easy and sure threshold voltage control.

Forming the channel regions by using Ge in both the nMOSFET and the pMOSFET, forming the source/drain regions by using the intermetallic compound containing Ge, and forming the gate electrodes by using the intermetallic compound containing Si simultaneously with the formation of the source/drain regions as described above makes it possible to realize a high-speed CMOSFET in which various characteristics of the Ge-channel CMOSFET are not impaired and appropriate threshold voltage control is enabled.

Incidentally, Ge, when used to form a metal/semiconductor junction (Schottky junction), has a property of causing a level of an interface of the junction to be strongly pinned within a Ge bandgap irrespective of a work function of the metal.

Figure 1B:
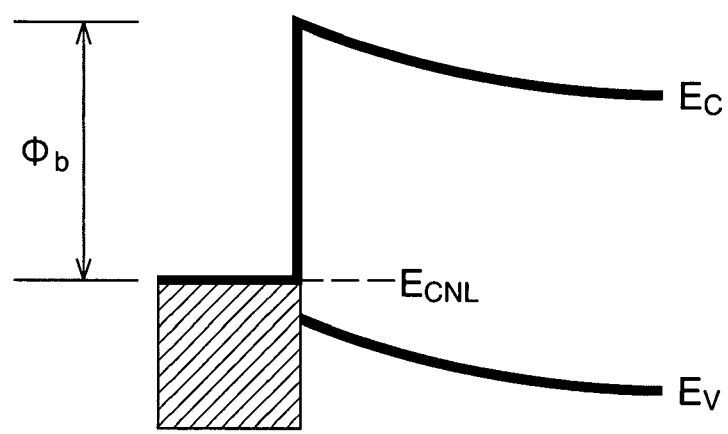

FIG. 1A and FIG. 1B are charts showing a band structure, FIG. 1A showing the relation with work functions of metals and FIG. 1B showing a state at the time of junction.

With the vacuum level as a reference, a conduction band (Ec) is 4.0 eV and a bandgap (Eg) is 0.66 eV in Ge, as shown in FIG. 1A. A work function ($\phi$m, vac Ni) of nickel (Ni) is 4.5 eV, and a work function ($\phi$m, vac Pt) of platinum (Pt) is 5.3 eV, for instance. In particular, the work function of Pt exceeds the bandgap of Ge. Whichever of Ni and Pt thus greatly different in work function is used, the level of a junction interface is pinned to a certain level, that is, to ECNL (Charge Neutrality Level) as shown in FIG. 1A and FIG. 1B. In a case of Ge, ECNL is at a position higher than its valence band (EV) by about 0.06 eV to about 0.1 eV. Note that in FIG. 1A and FIG. 1B, EF is a Fermi level and $\Phi$b is a Schottky barrier height of Ge for electrons.

The pinning phenomenon in the Schottky junction interface is often evaluated by an S value. The S value is an index indicating metal work function dependency of the Schottky barrier height and represents a gradient when the Schottky barrier heights obtained by using metals of a plurality of kinds are plotted against the work functions of the metals. For example, Ge exhibits an S value extremely approximate to 0 (zero). That is, in a junction interface of metal and Ge, substantially constant Schottky barrier height is obtained irrespective of the kind of the metal and very strong pinning occurs. Si which has conventionally been in wide use as a channel material exhibits a higher S value than Ge, and an S value of oxide silicon ($SiO_2$) in wide use for a gate insulation film and so on is nearly 1.

Figure 2:
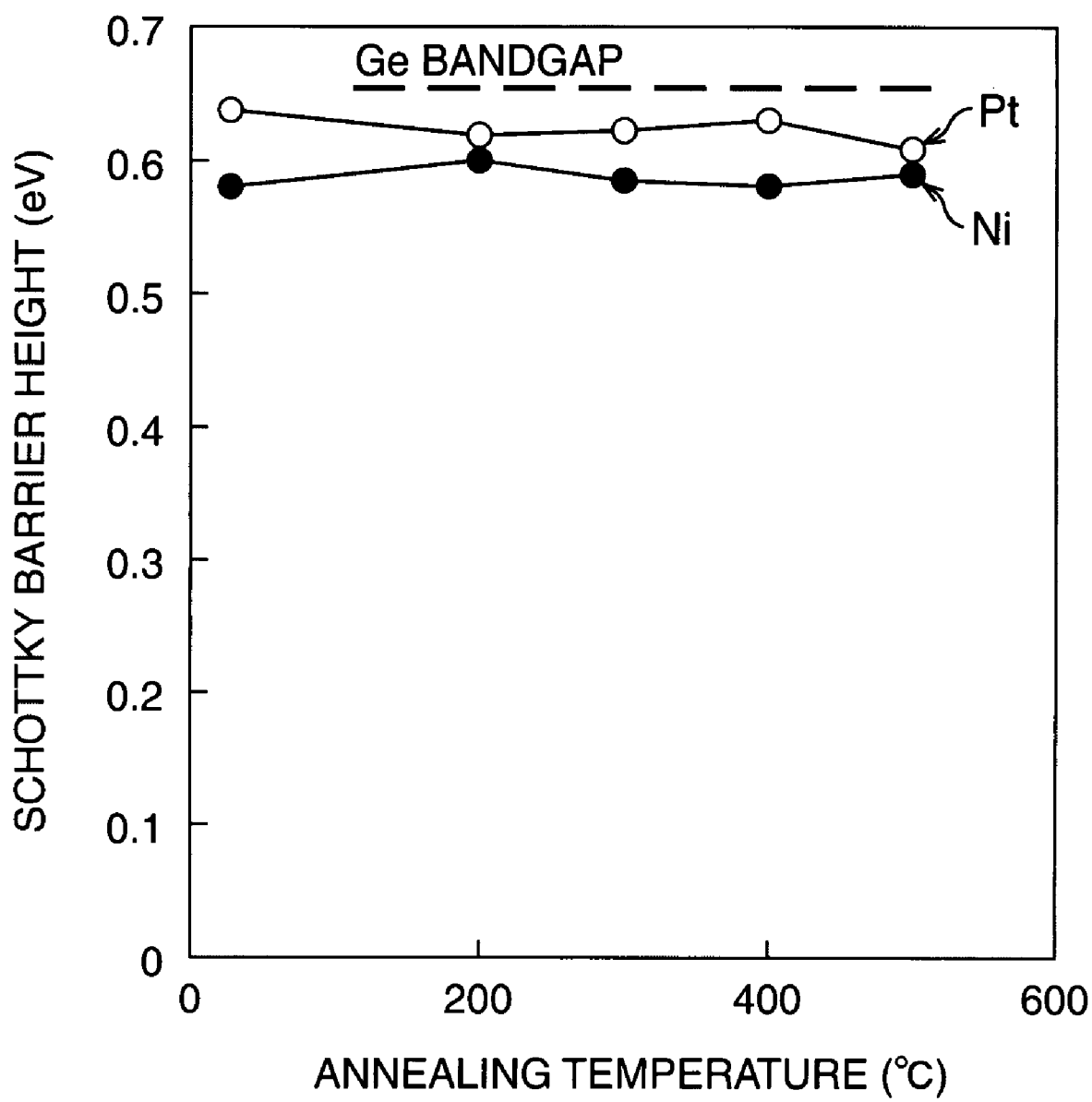
FIG. 2 is a graph showing the correlation between annealing temperature and Schottky barrier height.

FIG. 2 is a graph showing the correlation between annealing temperature and the Schottky barrier height. In FIG. 2, the horizontal axis shows the annealing temperature (° C.) and the vertical axis shows the Schottky barrier height (eV).

In cases where a germanide/Ge junction is formed by the combination of Ni and Ge and of the combination of Pt and Ge, the correlation between the annealing temperature and the Schottky barrier height for electrons in these cases is as shown in FIG. 2. In both cases where metal Ni is used and where metal Pt is used, the obtained Schottky barrier height shows a substantially constant value of around 0.6 eV regardless of the annealing temperature and very strong pinning occurs in a junction interface of the intermetallic compound and Ge. This shows that a pinning property of Ge is very strong.

It is assumed that, in forming a CMOSFET, channel regions of an nMOSFET and a pMOSFET are both formed of Ge and source/drain regions thereof are formed by using an intermetallic compound containing Ge as described above. In this case, in the pMOSFET, the Schottky barrier height is about 0.06 eV to about 0.1 eV for holes in an ON state irrespective of the kind of the metal, while in the nMOSFET, an energy barrier height is about 0.56 V to about 0.6 eV for electrons in an ON state irrespective of the kind of the metal.

As described above, in a case where Ge is used as a channel material and an intermetallic compound such as nickel germanide (NiGe) or platinum germanide (PtGe) is formed in the source/drain regions, since the pinning position is close to the valence band, the Schottky barrier height for holes becomes low but on the other hand, the Schottky barrier height for electrons becomes high.

In the present invention, as will be described below, on junction interfaces between Ge as a channel region and source/drain regions comprised of an intermetallic compound containing Ge, layers made by segregating a predetermined atom (first layers) are formed. With this, the Schottky barrier height for each carrier, in particular, the Schottky barrier height for electrons on an nMOSFET side is made further lower, thereby realizing further improvement in driving force of the CMOSFET.

Furthermore, in the present invention, as will be described below, on an interface between the gate electrode comprised of an intermetallic compound containing Si and the gate insulation film, a layer (second layer) made by segregating the same atom as that of the first layers is formed. Consequently, an effective work function is modulated and a threshold voltage is desirably controlled.

Figure 3:
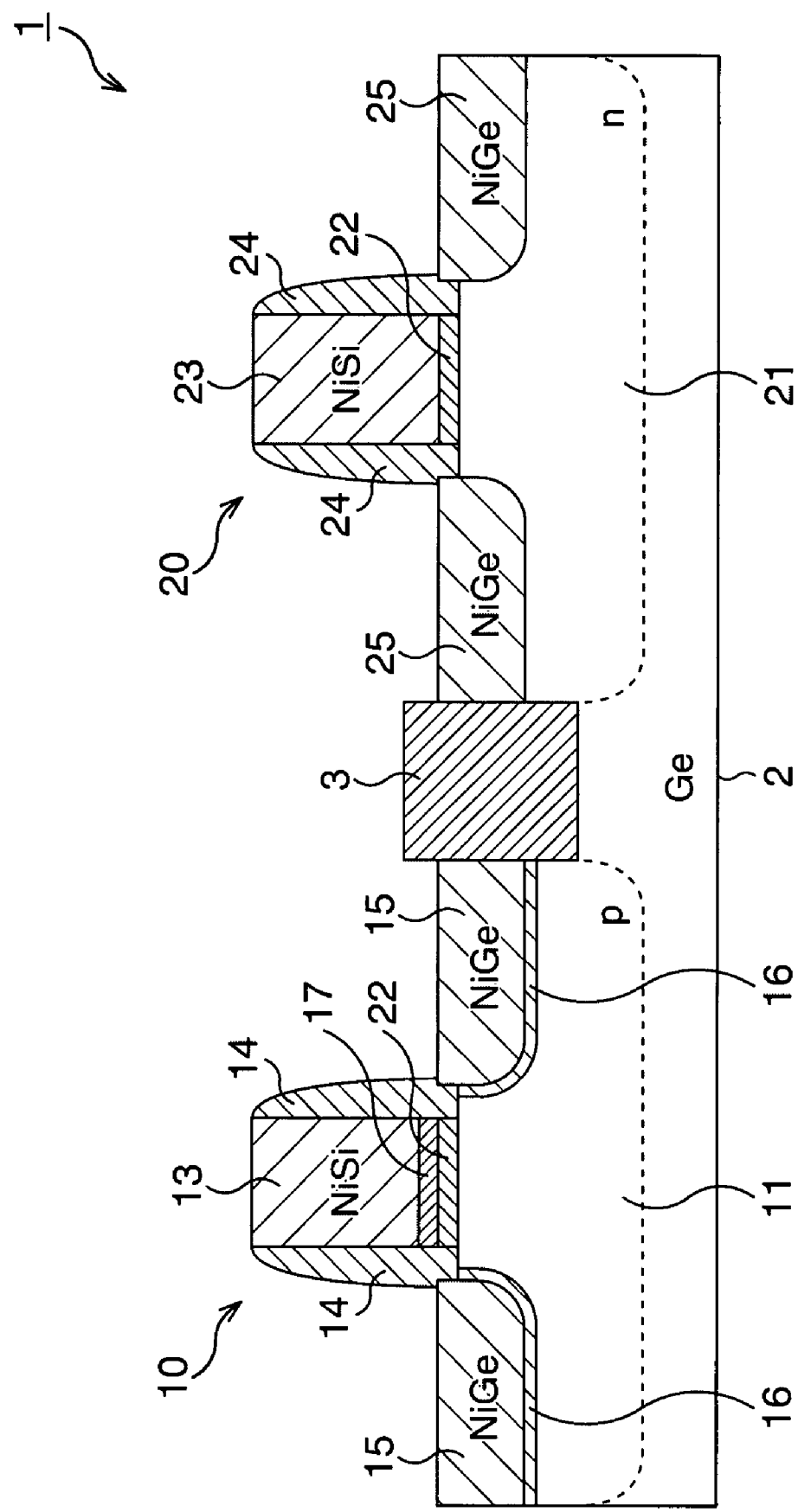
FIG. 3 is a schematic cross-sectional view showing an example of the structure of a CMOSFET according to the present invention.

FIG. 3 is a schematic cross-sectional view showing an example of the structure of a CMOSFET according to the present invention.

In a CMOSFET 1 shown in FIG. 3, an nMOSFET 10 and a pMOSFET 20 are formed by using a Ge substrate 2. The nMOSFET 10 and the pMOSFET 20 are element-isolated on the Ge substrate 2 by an element isolation structure, here STI (Shallow Trench Isolation) 3, demarcating active regions.

The nMOSFET 10 has a gate electrode 13 which is formed, via a gate insulation film 12, on a portion, in the Ge substrate 2, in which a p-well 11 is formed. On side surfaces of the gate insulation film 12 and the gate electrode 13, sidewalls 14 are formed. The gate electrode 13 is formed by an intermetallic compound layer (silicide layer) comprised of NiSi. In a surface layer of the Ge substrate 2 on both sides of the gate electrode 13 on which the sidewalls 14 are formed, formed are NiGe layers 15 which are intermetallic compound layers (germanide layers) comprised of NiGe and are to be source/drain regions. On junction interfaces between the NiGe layers 15 and the Ge substrate 2, formed are first layers 16 which are extremely thin segregation layers formed by a predetermined atom segregated with high concentration, as will be described later. Further, on an interface between the gate electrode 13 and the gate insulation film 12, formed is a second layer 17 which is an extremely thin segregation layer formed by an atom, which is the same as the atom of the first layers 16, segregated with high concentration.

Similarly, the pMOSFET 20 has a gate electrode 23 which is formed, via a gate insulation film 22, on a portion of the Ge substrate 2 in which an n-well 21 is formed. On side surfaces of the gate insulation film 22 and the gate electrode 23, sidewalls 24 are formed. The gate electrode 23 is formed by an intermetallic compound layer (silicide layer) comprised of NiSi, similarly to the gate electrode 13. In the surface layer of the Ge substrate 2 on both sides of the gate electrode 23 on which the sidewalls 24 are formed, formed are NiGe layers 25 which are intermetallic compound layers (germanide layers) comprised of NiGe and are to be source/drain regions, similarly to the NiGe layer 15.

As each of the gate insulation films 12, 22, a germanium oxynitride (GeON) film which is formed by oxynitriding a surface of the Ge substrate 2 is usable, and also usable is a $SiO_2$ film or a silicon oxynitride (SiON) film formed by being deposited on the Ge substrate 2, a high-dielectric-constant (high-k) insulation film, or the like. As the high-k insulation film, usable is a zirconium oxide ($ZrO_2$) film, a zirconium oxynitride (ZrON) film, a zirconium silicate (ZrSiO) film, a zirconium silicate nitride (ZrSiON) film, a hafnium oxide ($HfO_2$) film, a hafnium oxynitride (HfON) film, a hafnium silicate (HfSiO) film, a hafnium silicate nitride (HfSiON) film, an aluminum oxide ($Al_2O_3$) film, a hafnium aluminate (HfAlO) film, a hafnium aluminate nitride (HfAlNO) film, a lanthanum oxide ($La_2O_3$) film, a lanthanum aluminate (LaAlO) film, or the like.

As described above, in the CMOSFET 1 shown in FIG. 3, the gate electrodes 13, 23 of the nMOSFET 10 and the pMOSFET 20 are each comprised of NiSi which is an intermetallic compound containing Si, and the source/drain regions are formed by the NiGe layers 15, 25 each comprised of the intermetallic compound containing Ge. In other words, the source/drain junctions are realized not by conventional pn junctions using diffusion layers but by junctions of the NiGe layers 15, 25 and the Ge substrate 2, that is, Schottky junctions.

As describe above, in the present invention, the source/drain regions are formed by the NiGe layers 15, 25 each comprised of the intermetallic compound containing Ge. In this case, the Schottky barrier heights formed by the junctions of the NiGe layers 15, 25 and the Ge substrate 2 serve as important parameters determining ON currents of the nMOSFET 10 and the pMOSFET 20.

Generally, in a case where a CMOSFET having a Ge channel is formed by utilizing the Schottky junction, a suitable Schottky barrier height can be obtained only for the pMOSFET due to the strong pinning in the germanide/Ge junction. Therefore, here, an impurity atom such as phosphorus (P), arsenic (As), antimony (Sb), boron (B), aluminum (Al), or gallium (Ga), or an atom such as sulfur (S), selenium (Se) or tellurium (Te) is segregated on the n-side or p-side Schottky junction interface to form the first layers which are extremely thin and high-concentration segregation films. The Schottky barrier height is modulated by the first layers, and appropriate Schottky barrier height is realized both for the nMOSFET and the pMOSFET.

In this case, as each of the first layers, on the n-side Schottky junction interfaces, a segregation layer is formed which uses at least one kind of atom selected from an impurity atom of group V such as P, As, or Sb, an atom of group VI such as S, Se, or Te, and an impurity atom of group VII such as ytterbium (Yb), Er, Gd, or Sm. On the other hand, on each of the p-type Schottky junction interfaces, a segregation layer which uses at least one kind of atom selected from an impurity atom of group III such as B, Al, or Ga and an atom of group VI such as S, Se, or Te may be formed.

Figure 4:
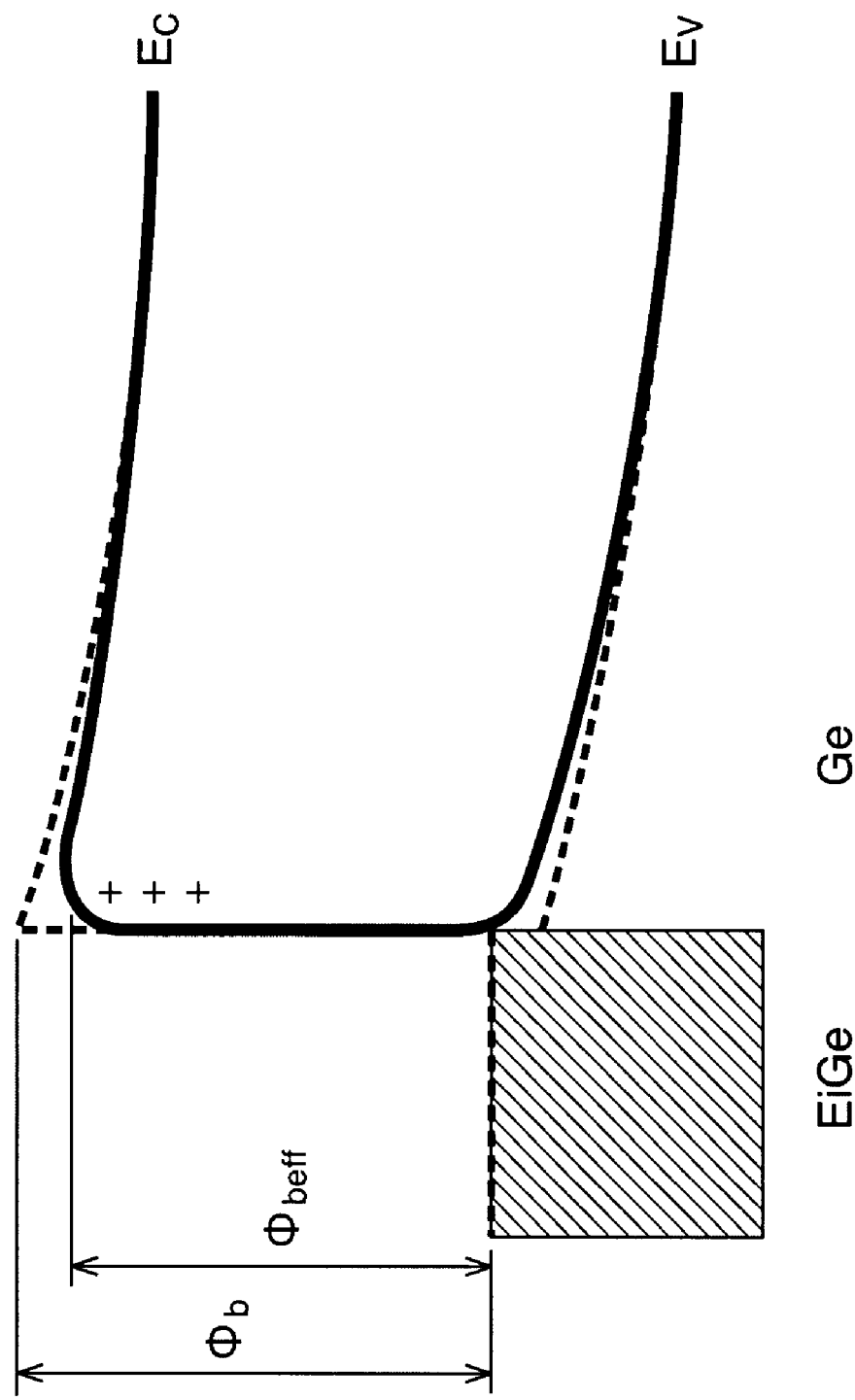
FIG. 4 is an explanatory chart of a modulation mechanism of the Schottky barrier height.
Figure 5:
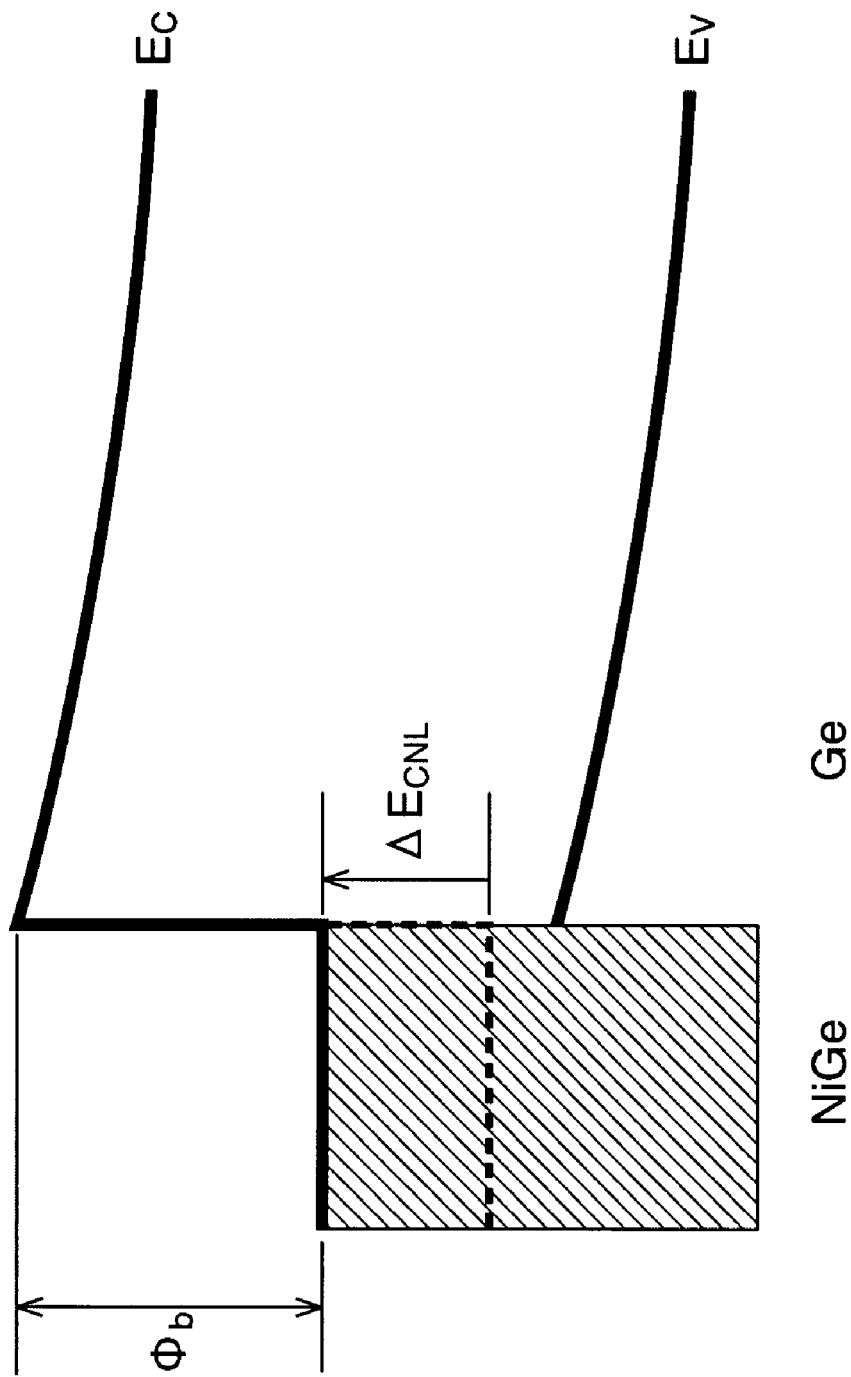
FIG. 5 is an explanatory chart of a modulation mechanism of the Schottky barrier height.

FIG. 4 and FIG. 5 are explanatory charts of modulation mechanisms of the Schottky barrier height.

In a case where the impurity atom of group V such as P, As, or Sb is used as the segregation layers, the Schottky barrier height is modulated by the mechanism shown in FIG. 4. Specifically, first, an impurity atom of group V introduced in a segregation layer on a Schottky junction interface, after emitting electrons, turns into plus ions to be fixed in a region near the junction interface. At this time, since many of the electrons exist on the intermetallic compound side, a so-called image force is generated, the image force being generated when these electrons and the plus ions on the segregation layer side are attracted by each other by a Coulomb force. On the whole, this image force becomes stronger as the impurity atom of group V with higher concentration exists extremely close to the intermetallic compound. By forming the segregation layer extremely close to the intermetallic compound to generate the image force, it is possible to obtain an effective Schottky barrier height ($\Phi_{beff}$) which is artificially made lower than the Schottky barrier height generated by the junction of the intermetallic compound and Ge (the Schottky barrier height ($\Phi b$) when the segregation layer is not formed). Consequently, a tunnel current passing through the junction interface increases.

To effectively achieve such a decrease in the effective Schottky barrier height, the segregation layer is formed in a region so that the aforesaid plus ions of the impurity atom exist in a depletion layer formed on the junction interface between the intermetallic compound and Ge.

In a case where an impurity atom of group III such as B, Al, or Ga is used for the segregation layer, by forming the segregation layer containing such an impurity atom with high concentration extremely close to the intermetallic compound, it is also possible to artificially reduce the Schottky barrier height for holes by the image force generated as a result.

Further, in a case where an atom of group VI such as S, Se, or Te is used for the segregation layer, the Schottky barrier height is modulated by the mechanism shown in FIG. 5. Specifically, the atom of S, Se, or Te is adsorbed by a dangling bond existing in the Schottky junction interface, and an interface level thereof is varied to vary the pinning position, whereby the Schottky barrier height is modulated. The atom of group VI such as S, Se, or Te used here is high in electronegativity and, when introduced in the Schottky junction interface, is adsorbed by the dangling bond existing in the junction interface to bridge the atoms having the dangling bond.

Consequently, the Schottky junction interface is energetically stabilized and its interface level varies. As a result, a charge neutral level shifts ($\Delta ECNL$), so that the Schottky barrier height for electrons is reduced.

As described above, when P, As, Sb, or the like is used as the segregation layer and when B, Al, Ga, or the like is used as the segregation layer, the mechanism for modulating the Schottky barrier height is different from that when S, Se, Te, or the like is used as the segregation layer. Incidentally, for example, it is also possible to form the segregation layer on the Schottky junction interface of the nMOSFET by using an atom such as S, Se, or Te together with an impurity atom such as P, As, or Sb, and to form the segregation layer on the Schottky junction interface of the pMOSFET by using an atom such as S, Se, or Te together with an impurity atom such as B, Al, or Ga. By forming the segregation layer by combining the atoms whose mechanisms for modulating the Schottky barrier height are different, it is also possible to obtain a modulation effect by each of the atoms.

Next, the modulation effect of the Schottky barrier height by such a segregation layer will be described.

Figure 6:
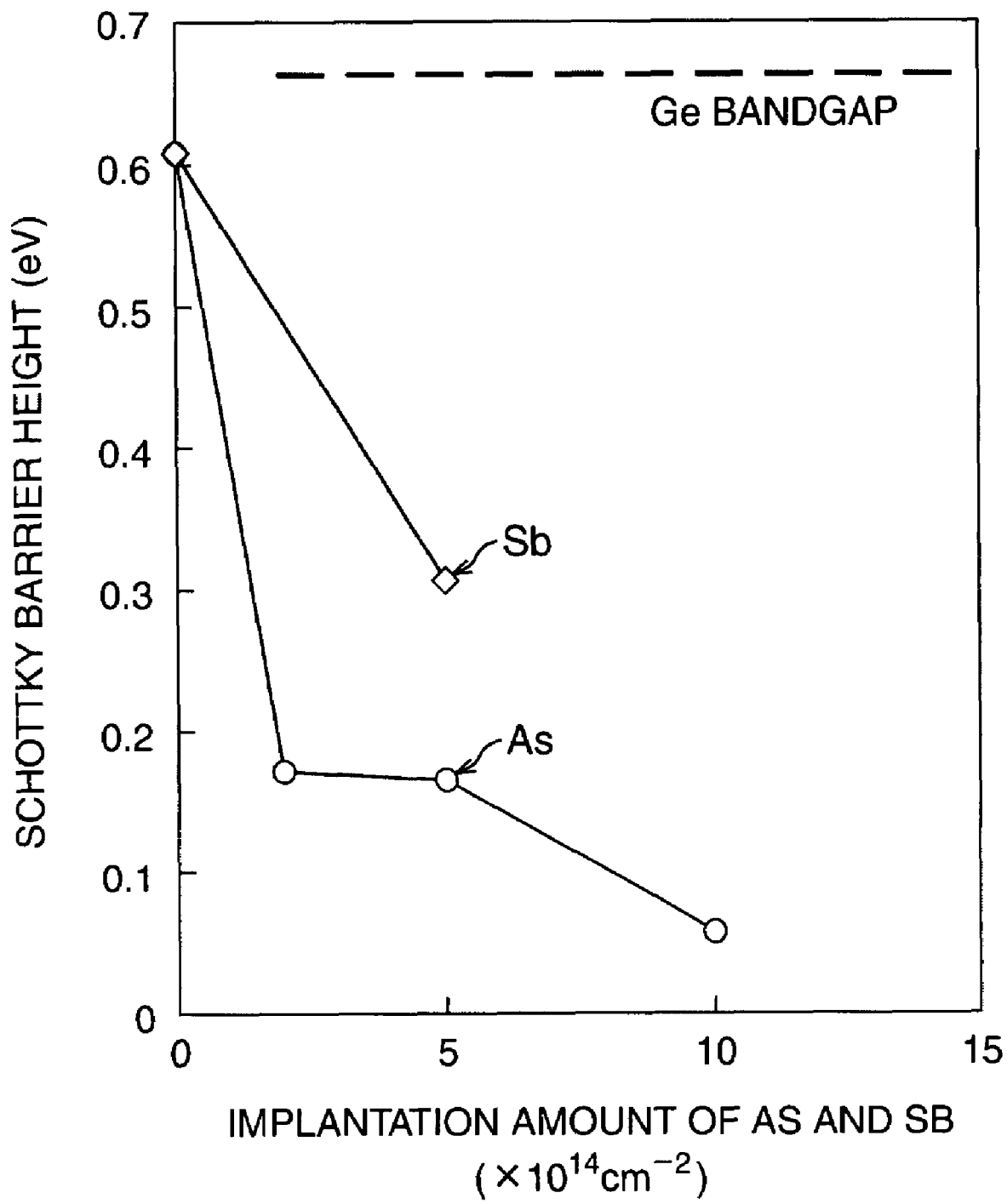
FIG. 6 is a graph showing the correlation between implantation amounts of As and Sb and the Schottky barrier height.
Figure 7:
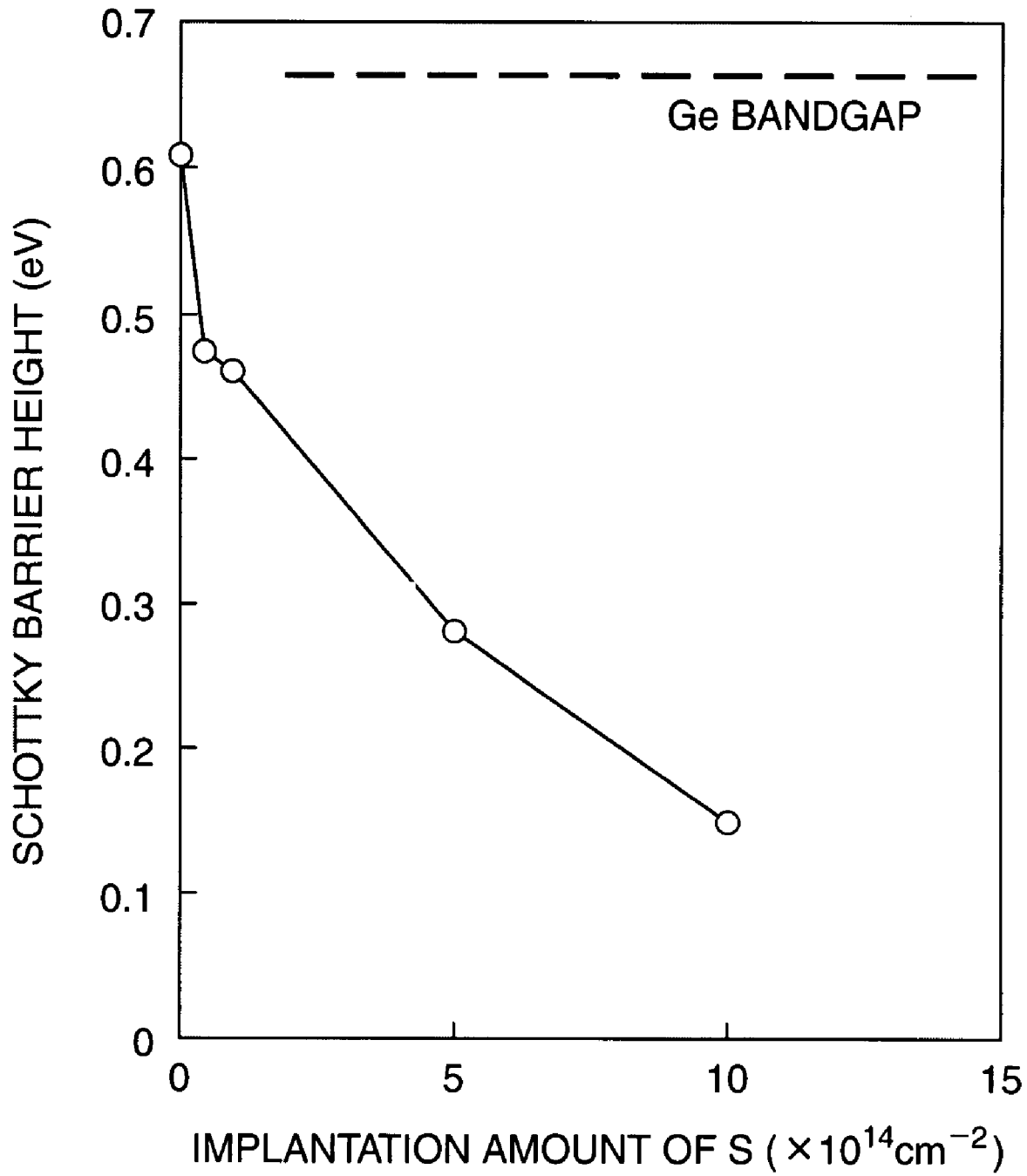
FIG. 7 is a graph showing the correlation between an implantation amount of S and the Schottky barrier height.

FIG. 6 is a graph showing the correlation between implantation amounts of As and Sb and the Schottky barrier height, and FIG. 7 is a graph showing the correlation between an implantation amount of S and the Schottky barrier height. Note that in FIG. 6 and FIG. 7, the horizontal axis shows the implantation amounts of As and Sb or the implantation amount of S ($\times 10^{14}/cm^2$), and the vertical axis shows the Schottky barrier height (eV). In FIG. 6 and FIG. 7, a bandgap of Ge is also shown.

In a case where a segregation layer of an impurity atom such as As or Sb is formed on a NiGe/Ge junction interface, the Schottky barrier height shows a decreasing tendency in accordance with an increase in implantation amounts of both As and Sb as shown in FIG. 6. Similarly, in a case where a segregation layer of an S atom is formed on the NiGe/Ge junction interface, the Schottky barrier height shows a decreasing tendency in accordance with an increase in an implantation amount of S as shown in FIG. 7.

As described above, by forming the segregation layer on the NiGe/Ge junction interface by using an appropriate atom such as As, Sb, or S, it is possible to modulate the Schottky barrier height up to a range suitable for the nMOSFET and to the substantially whole range of the Ge bandgap.

Further, in the present invention, as shown in FIG. 3, each of the gate electrodes 13, 23 is comprised of NiSi which is an intermetallic compound containing Si. In this case, the work functions of the gate electrodes 13, 23 are important parameters determining threshold voltages of the nMOSFET 10 and the pMOSFET 20.

Figure 8:
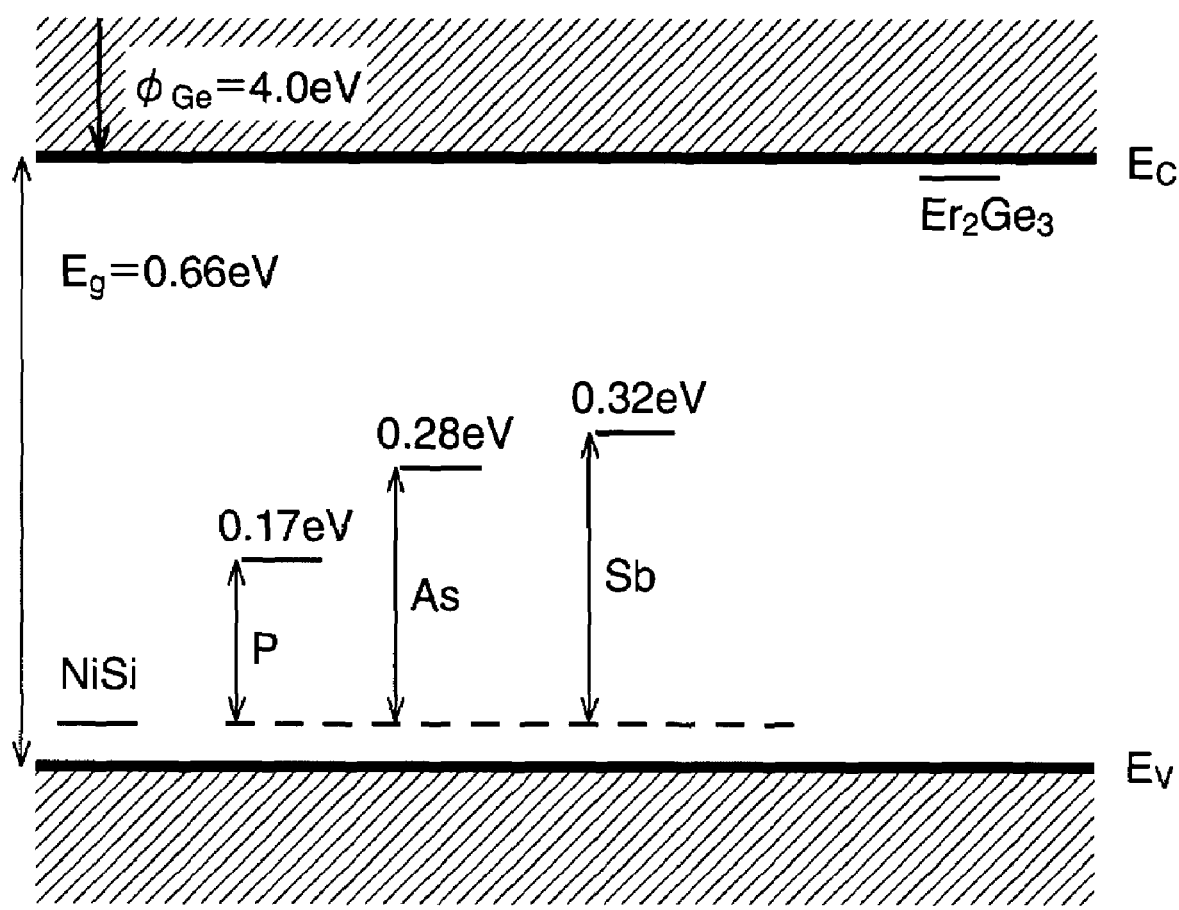
FIG. 8 is a chart showing a work function of a gate electrode of a Ge-channel CMOSFET in which the gate electrode is comprised of NiSi.

FIG. 8 is a chart showing a work function of a gate electrode of a Ge-channel CMOSFET in which the gate electrode is comprised of NiSi.

In the case where the gate electrode is comprised of NiSi, if an impurity atom is not introduced in the gate electrode (non-doped), a threshold voltage in a pMOSFET becomes a small value (value approximate to 0), which is an appropriate value for the pMOSFET. More specifically, with a vacuum level being a reference, the work function of the non-doped NiSi is 4.62 eV, a conduction band (Ec) of Ge is 4.0 eV, and a bandgap (Eg) is 0.66 eV, and therefore, energy between NiSi and a valence band (Ev) becomes a small value of 0.04. This means that in the Ge-channel CMOSFET, the threshold voltage of the pMOSFET including the non-doped gate electrode comprised of NiSi becomes a small value, and this gate electrode is suitable for the pMOSFET.

FIG. 8 also shows work functions of a gate electrode when P, As, or Sb which is an impurity atom of group V is introduced to the non-doped gate electrode comprised of NiSi to form a segregation layer (second layer) on an interface between the gate electrode and a gate insulation film.

As shown in FIG. 8, with the work function of the non-doped NiSi as a reference, in a case where P is doped, the work function comes closer to Ec by 0.17 eV. Similarly, in a case where As is doped, the work function comes closer to Ec by 0.28 eV, and in a case where Sb is doped, the work function comes closer to Ec by 0.32 eV. This indicates that by introducing an impurity atom such as P, As, or Sb to the gate electrode comprised of NiSi and segregating an impurity on the interface between the gate electrode and the gate insulation film to form the second layer, it is possible to modulate the effective work function of the gate electrode. Specifically, in a Ge-channel CMOSFET, in an nMOSFET including a gate electrode comprised of NiSi, forming the second layer on the interface between the gate electrode and a gate insulation film by introducing an impurity atom such as P, As, or Sb, or an atom such as S, Se, or Te to the gate electrode makes it possible to appropriately adjust a threshold voltage of the nMOSFET.

Here, instead of using the impurity atom of group V such as P, As, or Sb, also usable to form the second layer in the nMOSFET is an atom of group VI such as S, Se, or Te, or are atoms of two kinds or more selected from an impurity atom of group V and an atom of group VI.

Based on the above, according to the present invention, in a Ge-channel CMOSFET including a gate electrode comprised of an intermetallic compound containing Si, first layers and a second layer are formed in an nMOSFET. The first layers are formed on junction interfaces between Ge as a channel region and source/drain regions comprised of an intermetallic compound containing Ge, and the second layer is formed on an interface between the gate electrode and a gate insulation film. On the other hand, in a pMOSFET, it is appropriate not to dope an impurity atom since an appropriate threshold voltage can be obtained in a state where a gate electrode is non-doped as described above.

With this structure, it is possible to further lower the Schottky barrier height for electrons in the nMOSFET and to obtain an appropriate threshold voltage not only for the pMOSFET but also for the nMOSFET.

As will be described in detail below, according to the present invention, in view of simplifying manufacturing processes, the first and second layers are formed by the same process by the segregation of the same impurity atom or by ion implantation of the same impurity atom at the time of the germanidation reaction of the source/drain regions and the silicidation reaction of the gate electrode.

Here, description will be given of an appropriate processing temperature at the time of forming a gate electrode and at the time of forming NiGe/Ge junctions which will be source/drain regions, in a Ge-cannel CMOSFET including a gate electrode of NiSi and source/drain regions of NiGe.

Figure 9:
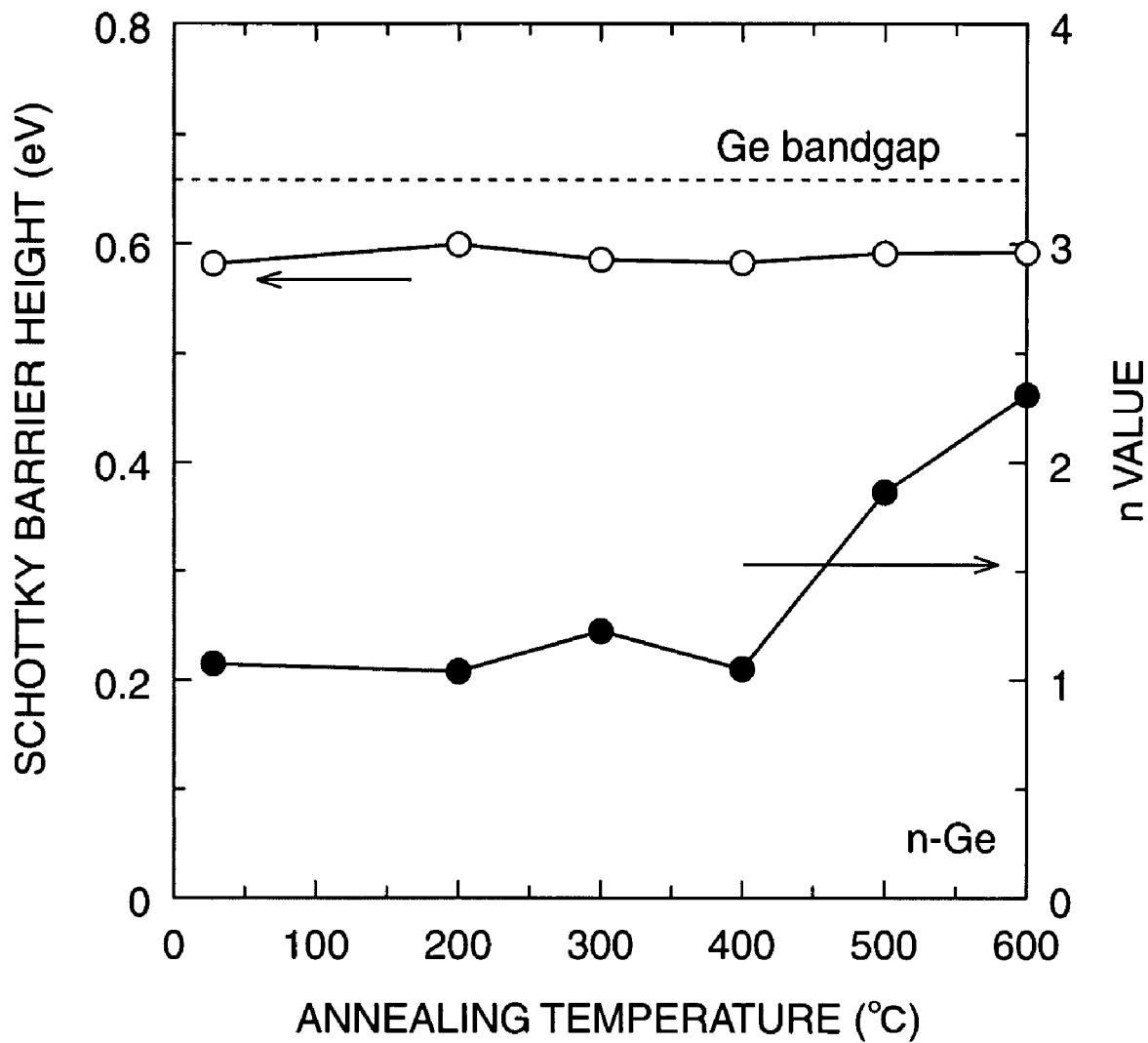
FIG. 9 is a graph showing the correlation of the Schottky barrier height and an n value vs. processing temperature when NiGe/Ge junctions to be source/drain regions are formed.
Figure 10:
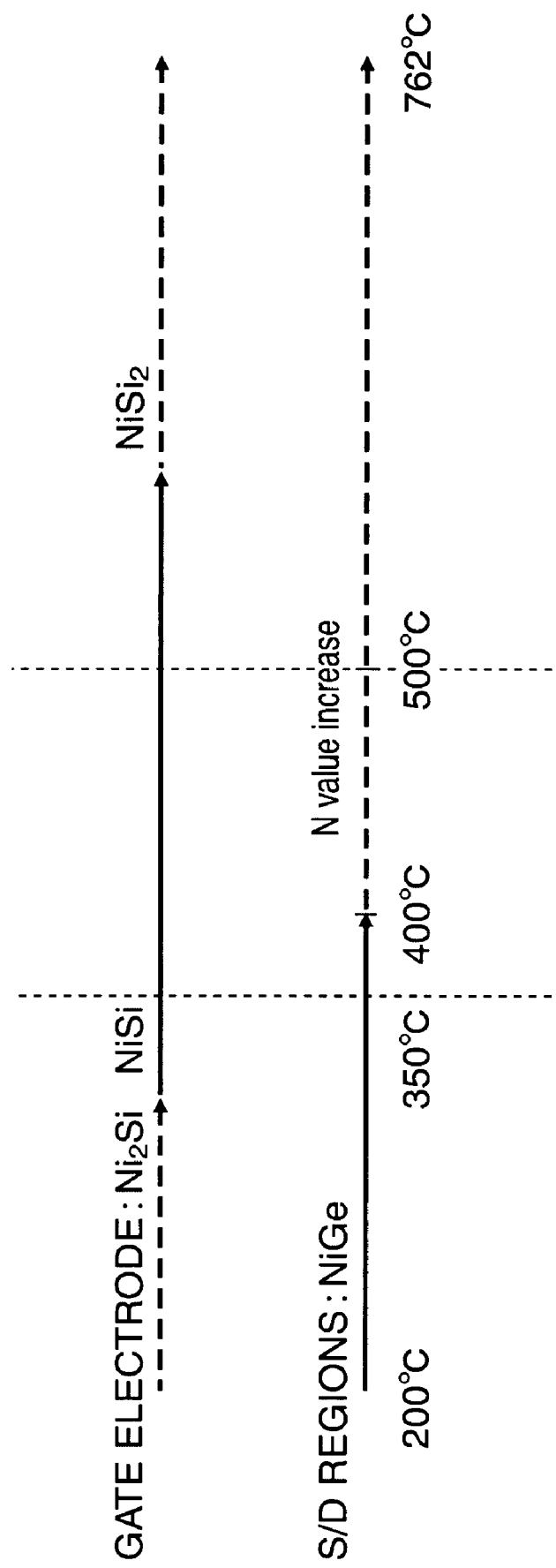
FIG. 10 is a chart to explain an optimum processing temperature for forming the gate electrode and the source/drain regions.

FIG. 9 is a graph showing the correlation of the Schottky barrier height and an n value vs. the processing temperature at the time of forming the NiGe/Ge junctions which will be the source/drain regions. FIG. 10 is a chart to explain the optimum processing temperature at the time of forming the gate electrode and the source/drain regions.

In the present invention, in each of regions for forming the pMOSFET and the nMOSFET, amorphous Si is processed into an electrode shape and sidewall insulation films are formed. Thereafter, an impurity atom such as P, As, or Sb, alternatively S, Se, or Te is ion-implanted, for example, only to the region for forming the nMOSFET. Then, a Ni film is formed on the whole surface of the formation regions. Then, the silicidation to form the gate electrode and the germanidation to form the source/drain regions are caused at the same time by annealing.

First, the proper temperature range for the above annealing will be studied from the correlation with the Schottky barrier height and the n value. Here, the n value is a value often used as an index of a characteristic value of a diode and ideally n=1.

As shown in FIG. 9 and FIG. 10, the Schottky barrier height has little dependency on the annealing temperature and exhibits a constant value. On the other hand, the n value starts to gradually deteriorate around a point when the annealing temperature exceeds 400° C., and the n value becomes n=2 around 550° C. Therefore, according to the result in FIG. 9, to obtain a good n value (and Schottky barrier height), the annealing temperature has to be set to about 500° C. or lower.

Next, the proper temperature range of the above annealing will be studied from the composition state of silicide of the gate electrode.

As shown in FIG. 10, in the silicidation of Ni—Si, the composition state when the annealing temperature is lower than about 350° C. is Ni-rich, that is $Ni_2Si$. On the other hand, the composition state when the annealing temperature is higher than 650° C. is Si-rich, that is $NiSi_2$. Therefore, to obtain desired NiSi, the annealing temperature has to be set to not lower than 350° C. nor higher than 650° C.

From the above studies, by setting the annealing temperature to not lower than 350° nor higher than 500° C., it is possible to obtain appropriate Schottky barrier height and n value and to obtain desired NiSi as the composition state of the silicide of the gate electrode.

Here, the case where Ge is used as the channel region is shown as an example, but it should be noted that in the present invention, $Si_xGe_{1-x}$ (0<x<1) may be used instead of Ge as the channel region. Here, it is preferable to use $Si_xGe_{1-x}$ (0<x≦0.3) to form a SiGe channel with the concentration of Ge being as high as 70% or higher. In the SiGe channel region, if a ratio of Ge is lower than 70%, it becomes difficult to obtain desired Schottky barrier height and threshold voltage.

When SiGe is used as the channel region, a bandgap of SiGe becomes a value between a bandgap of Si (1.12 eV) and a bandgap of Ge (0.66 eV), and this value depends on the Ge composition. As the Ge composition of SiGe is made higher, the bandgap of SiGe becomes lower to become close to the bandgap of Ge. What makes the case where the channel region of the CMOSFET is comprised of SiGe different from the case where Ge is used are only the Schottky barrier height when the first layer as the segregation layer does not exist (initial value of the Schottky barrier height) and the threshold voltage when the second layer as the segregation layer does not exist (initial value of the threshold voltage). Therefore, in the case where SiGe is used as the channel region, the same method as in the case of the CMOSFET using Ge as its channel region is also applicable, and the same effects can be obtained.

Further, the case where Ni is used as metal which forms the intermetallic compound with Ge and Si is shown as an example, but in a case where the Schottky barrier height and the threshold voltage of the nMOSFET are modulated, Pt, titanium (Ti), cobalt (Co), or the like may be used instead of Ni. For example, in a case where Ti or Co is used, by depositing it on Ge followed by RTA at a predetermined temperature, it is possible to form a titanium germanide (TiGe) layer or a cobalt germanide (CoGe) layer with good quality. Further, in a case where Pt is used, it is possible to form a good-quality PtGe layer under the same conditions as those when Ni is used.

Further, the case where the Schottky barrier height and the threshold voltage of the nMOSFET are modulated is described, but the Schottky barrier height and the threshold voltage of the pMOSFET can also be modulated in the same manner by using an appropriate impurity atom.

Concretely, to modulate the Schottky barrier height of the pMOSFET, preferably, Ni, Pt, erbium (Er), ytterbium (Yb), or the like is used as metal forming the intermetallic compound which will form the source/drain regions, and as the appropriate impurity atom, it is preferable that, for example, an atom of group III or an atom of group VI is used, or an atom of group III and an atom of group VI, for example, B, indium (In), Ga, S, and the like are used independently or in an appropriate combination.

Further, the case where (amorphous) Si is used as the material of the gate electrode is shown as an example, but in the present invention, Ge or $Si_xGe_{1-x}$ (0<x<1) may be used instead of Si as the material of the gate electrode. In a case where, for example, Ge is used as the gate electrode, the germanidation for forming the source/drain regions and the germanidation for forming the gate electrode are performed.

A work function of the gate electrode of $Er_2Ge_3$ formed by the germanidation of a Ge electrode layer and an Er metal film is shown in FIG. 8 together with the work function of the gate electrode of NiSi. As is seen, in the Ge-channel CMOSFET, the threshold voltage of the nMOSFET including the non-doped gate electrode comprised of $Er_2Ge_3$ becomes a small value, which indicates that this gate electrode is suitable for the nMOSFET. In this case, in the pMOSFET including the gate electrode comprised of $Er_2Ge_3$, by introducing an impurity atom such as B, Al, or Ga or an atom such as S, Se, or Te to the gate electrode to form a second layer on the interface between the gate electrode and the gate insulation film, it is possible to appropriately adjust the threshold voltage of the pMOSFET.

Concrete Embodiments to which the Present Invention is Applied

Based on the basic gist of the present invention described above, concrete embodiments to which the present invention is applied will be described in detail with reference to the drawings.

First Embodiment

In this embodiment, a method of manufacturing the Ge-channel CMOSFET shown in FIG. 3 will be described.

FIG. 11 to FIG. 14 are schematic cross-sectional views showing the method of manufacturing the Ge-channel CMOSFET according to the first embodiment, in order of processes.

Figure 11:
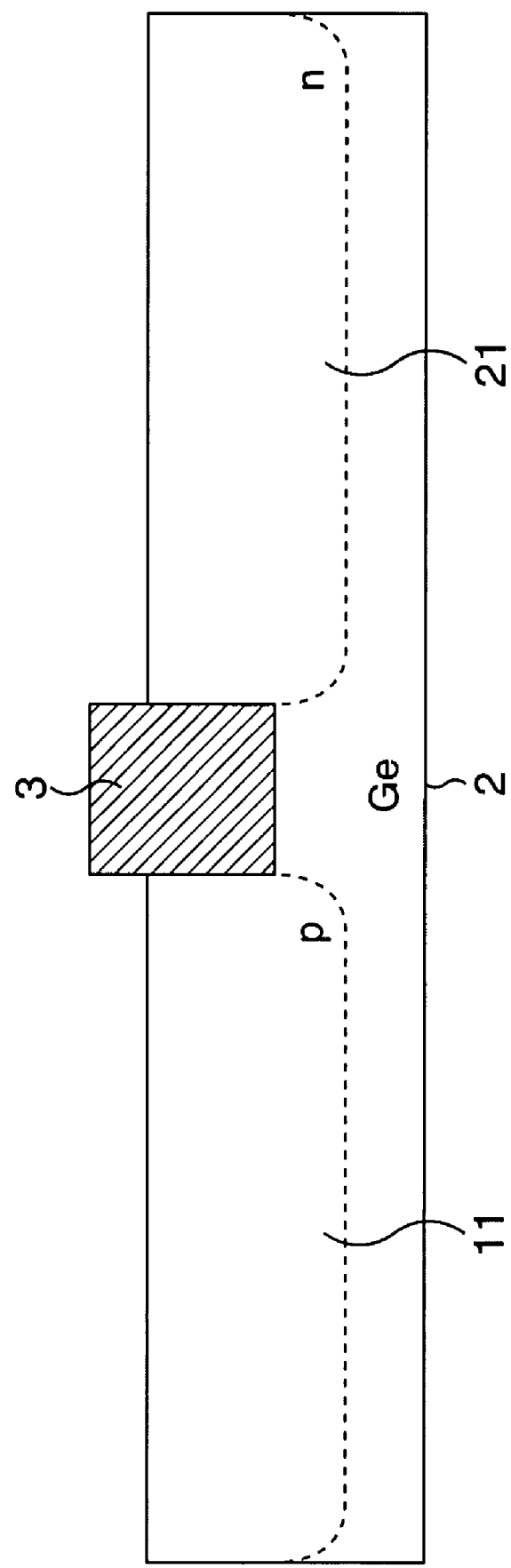
FIG. 11 is a schematic cross-sectional view showing a manufacturing method of a Ge-channel CMOSFET according to a first embodiment, in order of processes.

First, as shown in FIG. 11, an STI 3 demarcating regions for forming the nMOSFET 10 and the pMOSFET 2 is formed on the Ge substrate 2. Then, a predetermined dose amount of an impurity of a predetermined conduction type is ion-implanted with a predetermined acceleration energy to each of the regions demarcated by the STI 3 and further the impurity is activated by heat treatment, whereby the p-well 11 and the n-well 21 are formed.

Figure 12:
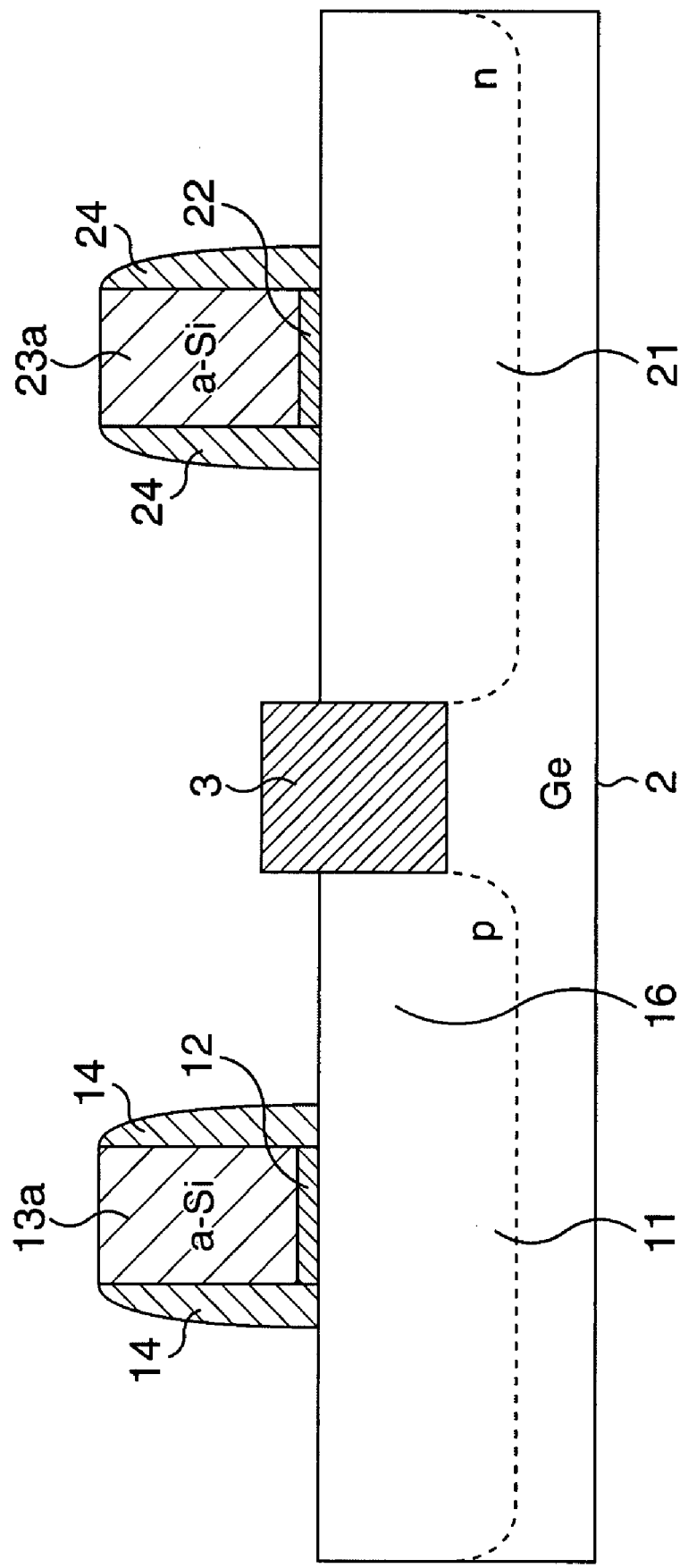
FIG. 12 is a schematic cross-sectional view, continued from FIG. 11, showing the manufacturing method of the Ge-channel CMOSFET according to the first embodiment, in order of processes.

Subsequently, as shown in FIG. 12, a film of an insulative material such as GeON, $SiO_2$, SiON, or a high-k insulative material is formed on the regions for forming the nMOSFET 10 and the pMOSFET 20, and thereafter amorphous Si is deposited thereon. A film of this amorphous Si is formed by, for example, a CVD method at a relatively low temperature, here, at about 525° C. Here, a film thickness of the amorphous Si is a value with which the amorphous Si becomes completely NiSi in a later-described silicidation process, here, about 30 nm.

Next, the amorphous Si and the insulative material are processed into an electrode shape, whereby the gate insulation films 12, 22 and electrode layers 13a, 23a are formed. Then, the whole surface is covered with an insulative material, and the insulative material is subjected to full anisotropic etching (etchback), whereby the sidewalls 14, 24 are formed on both side surfaces of the electrode layers 13a, 23a.

Figure 13:
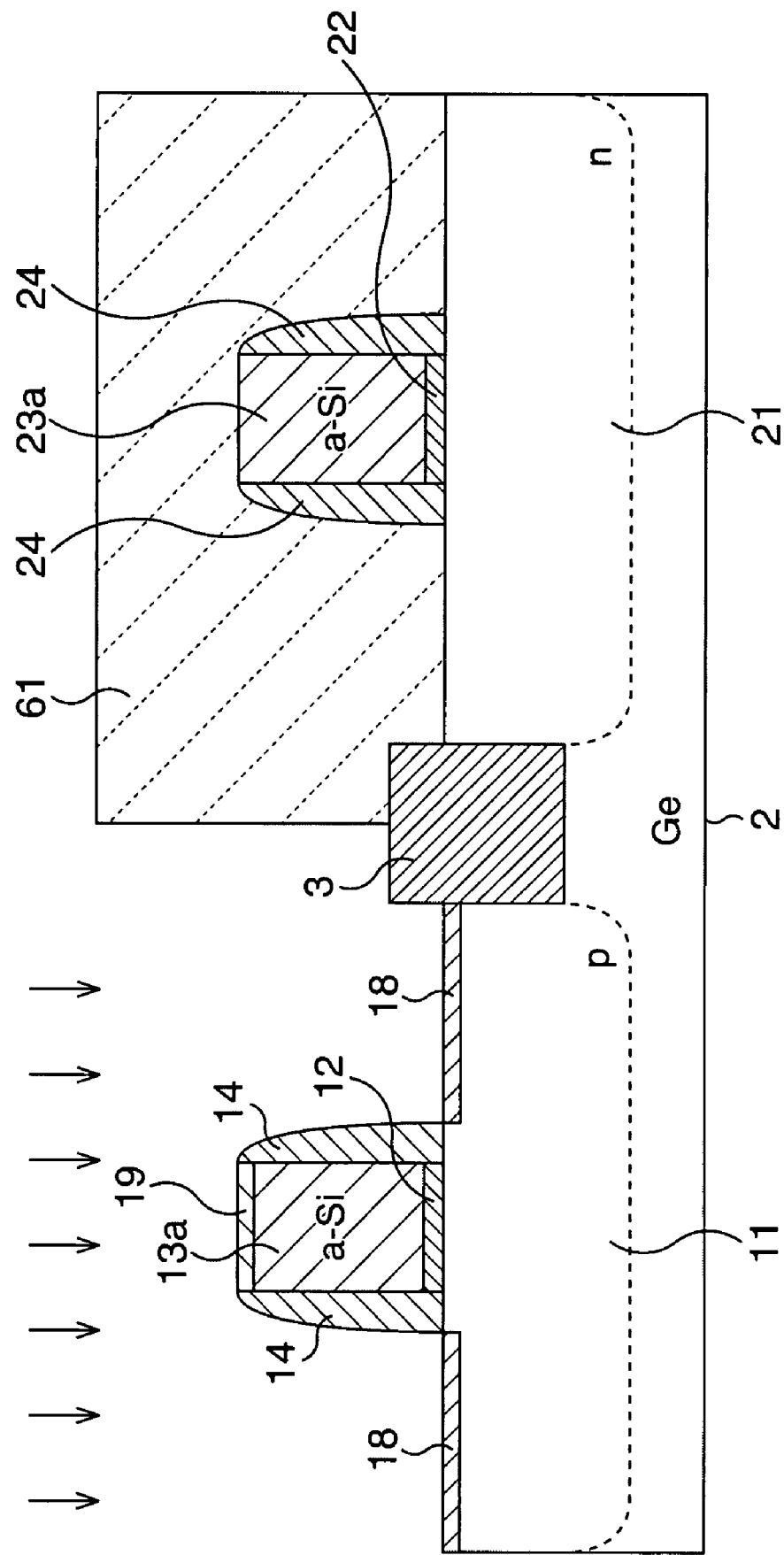
FIG. 13 is a schematic cross-sectional view, continued from FIG. 12, showing the manufacturing method of the Ge-channel CMOSFET according to the first embodiment, in order of processes.

Subsequently, as shown in FIG. 13, the region for forming the pMOSFET 20 is masked with a resist 61 and P, As, Sb, or the like, or S, Se, Te, or the like is ion-implanted as a predetermined impurity atom to the region for forming the nMOSFET 10. Consequently, implanted regions 18 are formed in the surface layer of the Ge substrate 2 on both sides of the electrode layer 13a, and an implanted region 19 is formed in a surface layer of the electrode 13a. As conditions of this ion implantation, in a case where P, As, Sb or the like is used as the impurity atom, an accelerating voltage is set to about 1 keV and a dose amount is set to about $2\times10^{14}/cm^2$ to about $1\times10^{15}/cm^2$, for instance. Further, in a case where S, Se, Te, or the like is used as the impurity atom, the accelerating voltage is set to about 10 kV and the dose amount is set to about $5\times10^{13}/cm^2$ to about $1\times10^{15}/cm^2$, for instance.

After the ion implantation, the resist 61 is removed by ashing or the like.

Figure 14:
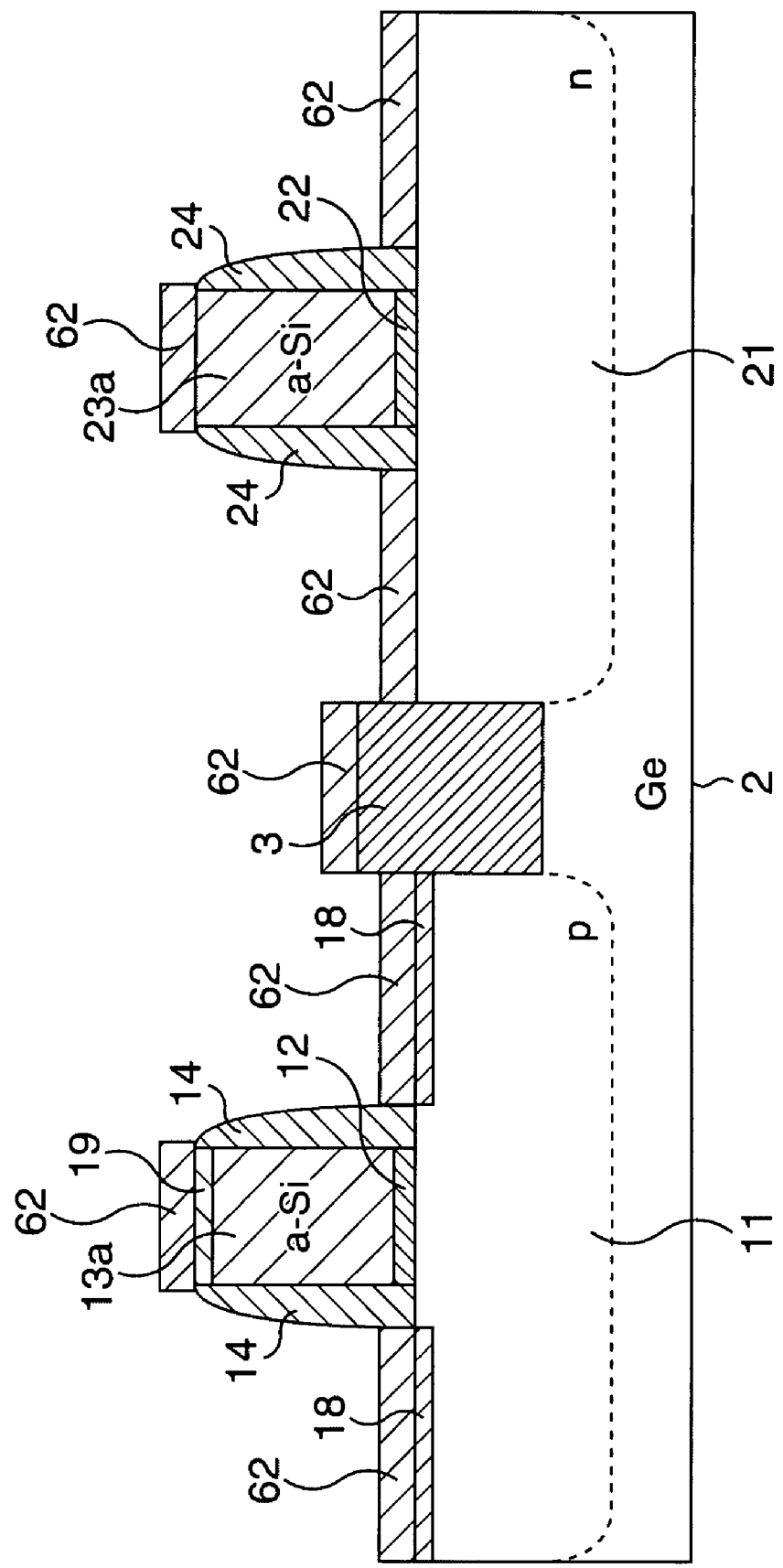
FIG. 14 is a schematic cross-sectional view, continued from FIG. 13, showing the manufacturing method of the Ge-channel CMOSFET according to the first embodiment, in order of processes.

Subsequently, as shown in FIG. 14, a Ni film 62 is deposited on the whole surface including the regions for forming the nMOSFET 10 and the pMOSFET 20 by a sputtering method or the like. A thickness of the Ni film 62 is set here to about 15 nm so that the NiGe layers 15, 25 which will be described later have an appropriate thickness (junction depth).

Then, after the Ni film 62 is deposited, RTA is performed in a $N_2$ atmosphere at a hold temperature of about 400° C. (the temperature is increased from room temperature in two minutes) for a hold time of about one minute, whereby the Ni film 62 is caused to react with the Ge substrate 2 and the electrode layers 13a, 23a. Here, the reason why the hold temperature for the RTA is set to 400° is to make a value of the temperature fall within a range from 350° C. to 500° C. which is the proper temperature range obtained from the above studies by using FIG. 10.

Thereafter, the Ni film 62 which has not reacted is removed. Consequently, as shown in FIG. 3, the gate electrodes 13, 23 of NiSi are formed by the silicidation of the electrode layers 13a, 23a and the NiGe layers 15, 25 to be the source/drain regions with a thickness (junction depth) of about 30 nm are formed by the germanidation of the surface layer of the Ge substrate 2 on both sides of the electrode layers 13a, 23a. Further, at this time, the impurity atom of the implanted regions 18 is segregated on the junction interfaces between the NiGe layers 15 and the Ge substrate 2 by being pressed by NiGe in the course of the reaction, whereby the first layers 16 are formed. At the same time, the impurity atom of the implanted region 19 is segregated on an interface between the gate electrode 13 and the gate insulation film 12 by being pressed by NiSi in the course of the reaction, whereby the second layer 17 is formed.

Thereafter, interlayer insulation films, wirings, and so on are formed in the usual manner, whereby the Ge-channel CMOSFET 1 according to this embodiment is completed.

Figure 15:
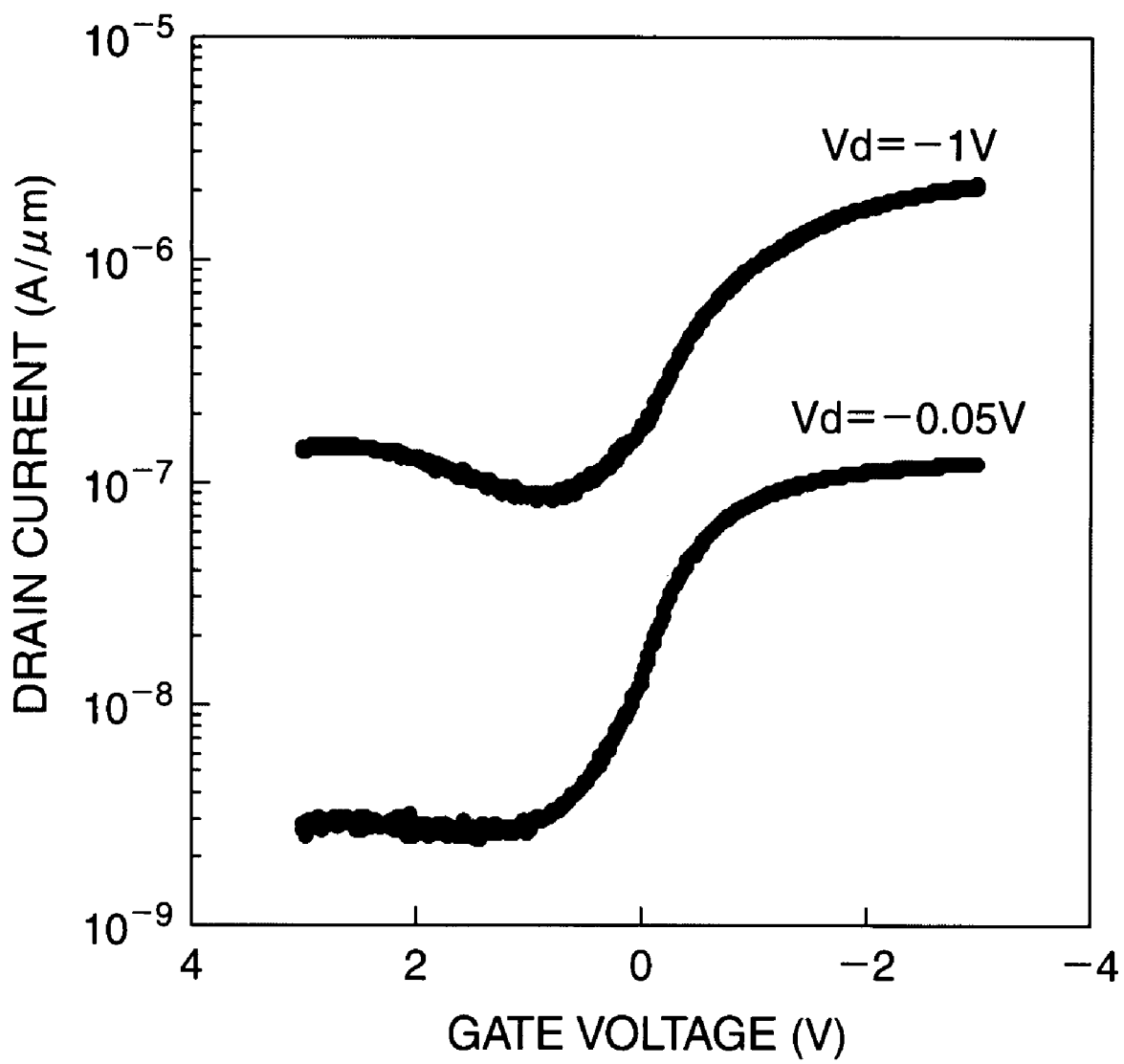
FIG. 15 is a graph showing an I-V characteristic obtained in the present invention.
Figure 16:
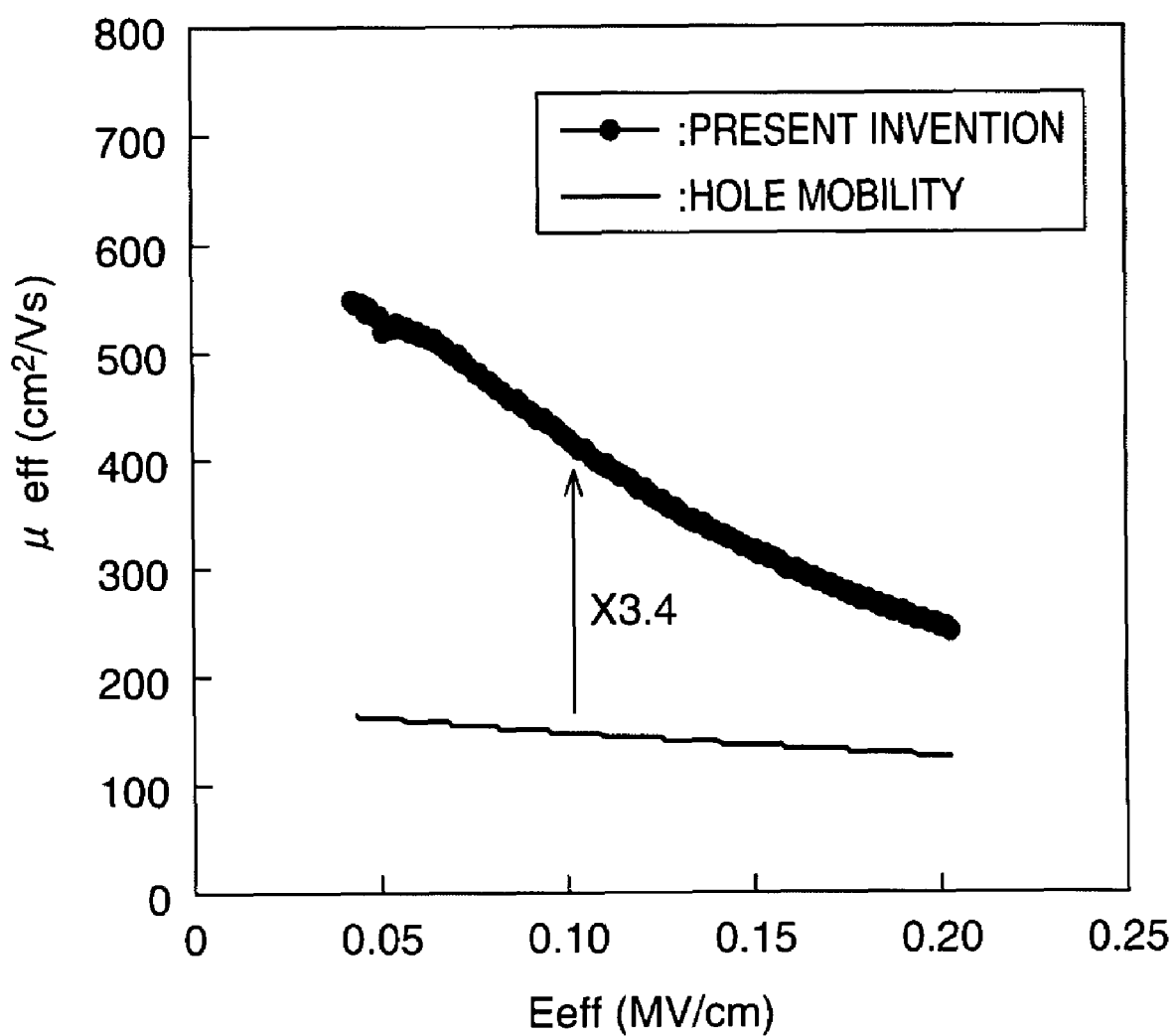
FIG. 16 is a graph showing effective mobility obtained in the present invention.

In the Ge-channel CMOSFET fabricated in the above-described manner, a suitable I-V characteristic was obtained as shown in FIG. 15. Further, as shown in FIG. 16, excellent effective hole mobility about three to four times as high as that when Si is used was obtained.

As described above, according to this embodiment, in the Ge-channel CMOSFET, a high-speed operation is enabled by using Ge as a semiconductor material forming a channel, and desired threshold voltage control and a high effective mobility characteristic are achieved by low-temperature and simple manufacturing processes.

MODIFIED EXAMPLE

Here, a modified example of the first embodiment will be described. The same reference numerals and symbols are used here to designate the same constituent members and so on as those described in the first embodiment.

Figure 17:
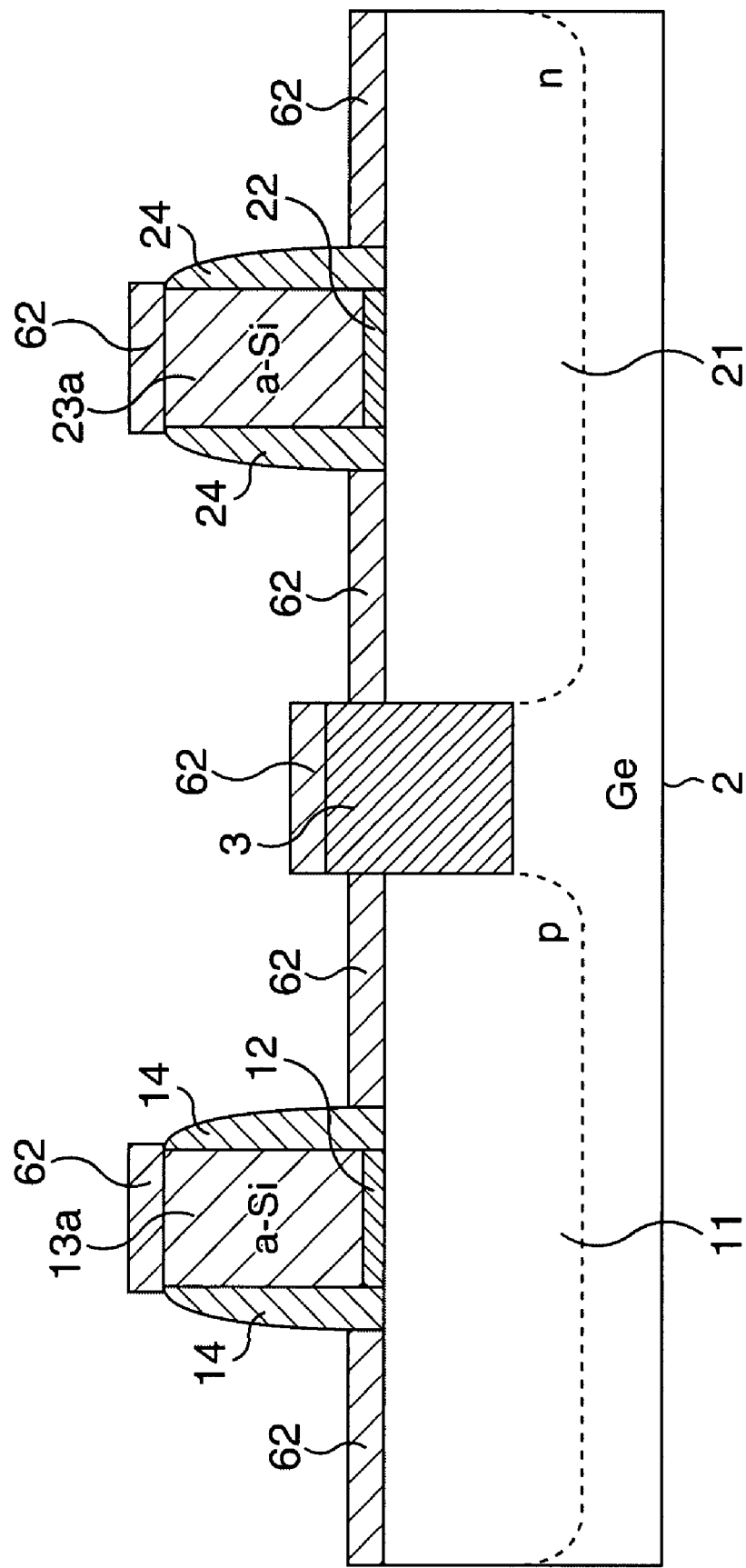
FIG. 17 is a schematic cross-sectional view showing a major process in a manufacturing method of a Ge-channel CMOSFET according to a modified example of the first embodiment, in order of processes.
Figure 18:
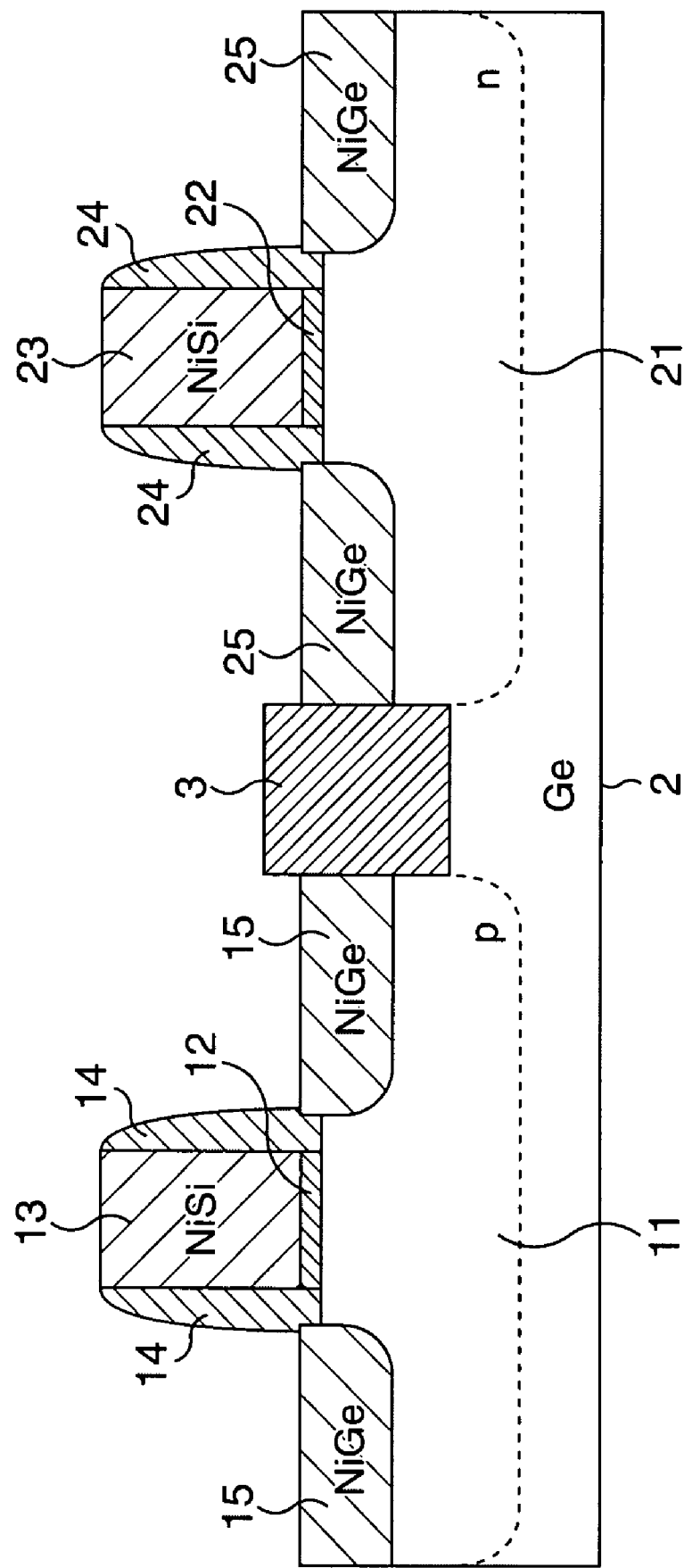
FIG. 18 is a schematic cross-sectional view, continued from FIG. 17, showing a major process in the manufacturing method of the Ge-channel CMOSFET according to the modified example of the first embodiment, in order of processes.
Figure 19:
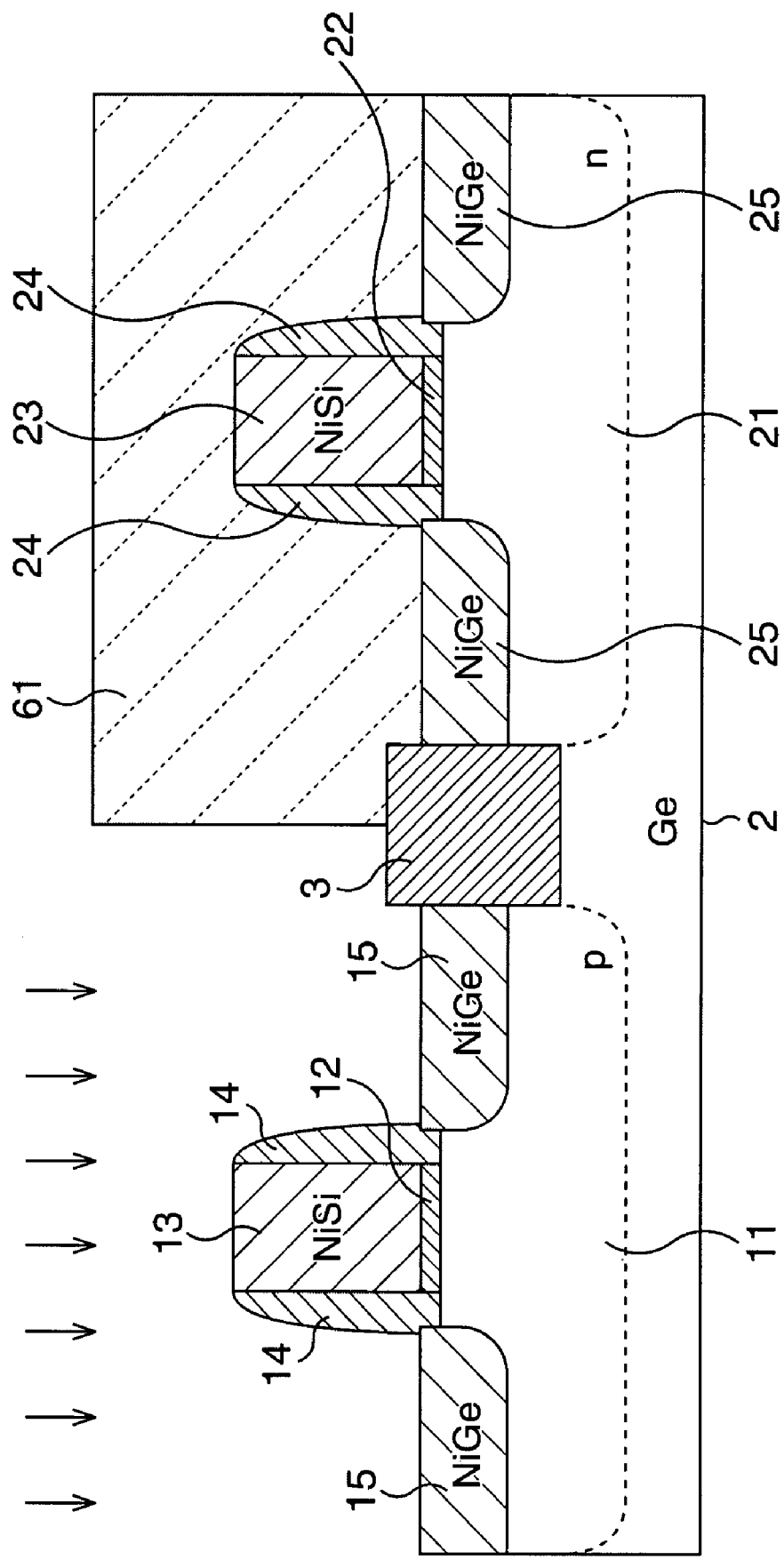
FIG. 19 is a schematic cross-sectional view, continued from FIG. 18, showing a major process in the manufacturing method of the Ge-channel CMOSFET according to the modified example of the first embodiment, in order of processes.

FIG. 17 to FIG. 19 are schematic cross-sectional views showing major processes in a method of manufacturing a Ge-channel CMOSFET according to the modified example of the first embodiment, in order of processes.

First, after a STI 3 is formed to form a p-well 11 and an n-well 21 as shown in FIG. 11, gate insulation films 12, 22, electrode layers 13a, 23a, and sidewalls 14, 24 are formed as shown in FIG. 12.

Subsequently, after a Ni film 62 with a thickness of about 15 nm is deposited on the whole surface as shown in FIG. 17, RTA is performed at a temperature within the proper temperature range described in the first embodiment for a predetermined time as shown in FIG. 18. Consequently, gate electrodes 13, 23 comprised of NiSi are formed by the silicidation of the electrode layers 13a and 23a, and NiGe layers 15, 25 to be source/drain regions with a thickness (junction depth) of about 30 nm are formed by the germanidation of a surface layer of a Ge substrate 2 on both sides of the electrode layers 13a, 23a.

Thereafter, the Ni film 62 which has not reacted is removed.

Then, after the gate electrodes 13, 23 and the NiGe layers 15, 25 are thus formed, a region for forming a pMOSFET 20 is masked with a resist 61, and P, As, Sb, or the like, or S, Se, Te, or the like is ion-implanted to a region for forming an nMOSFET 10 under a predetermined condition as shown in FIG. 19.

After the ion-implantation, the resist 61 is removed by ashing or the like.

Finally, RTA is performed under a predetermined condition to diffuse and segregate the ion-implanted atom. Consequently, first layers 16 are formed on junction interfaces between the NiGe layers 15 and the Ge substrate 2, and a second layer 17 is formed on an interface between the gate electrode 13 and the gate insulation film 12, similarly to the structure shown in FIG. 3. A diffusion coefficient of the ion-implanted atom is higher in the NiGe layers 15 than in the Ge substrate 2, and the atom ion-implanted after the NiGe layers 15 are formed diffuses in the NiGe layers 15 to form the first layers 16. Similarly, a diffusion coefficient of the ion-implanted atom is higher in the gate electrode (NiSi) 13 than in the electrode layer (Si) 13a, and the atom ion-implanted after the gate electrode 13 is formed diffuses in the gate electrode 13 to form the second layer 17.

Thereafter, in the usual manner, interlayer-insulation films, wirings, and so on are formed, whereby the Ge-channel CMOSFET 1 according to this modified example is completed.

In this modified example, the ion implantation to form the first and second layers 16, 17 comes after the formation of the NiGe layers 15, 25. The use of such a method makes it possible to set an accelerating voltage at the time of the ion implantation higher than that in a case where the ion implantation to form the first and second layers 16, 17 comes before the formation of the gate electrodes 13, 23 and the NiGe layers 15, 25 (see FIG. 11 to FIG. 14 of the first embodiment). Therefore, a selection range of apparatuses can be widened, for example, an ion-implanting apparatus whose lower limit of an accelerating voltage is high can be also used. Further, in this method, it is possible to form the first and second layers 16, 17 by utilizing a difference between the diffusion coefficient of the ion-implanted atom in the NiGe layers 15 and that in the Ge substrate 2, and a difference between the diffusion coefficient of the ion-implanted atom in the gate electrode (NiSi) 13 and that in the electrode layer (Si) 13a, but in forming the CMOSFET 1, full care should be given to amounts of the atom finally remaining in the NiGe layers 15 and the gate electrode 13 and to amounts of the atom reaching the junction interfaces between the NiGe layers 15 and the Ge substrate 2 and reaching the interface between the gate electrode 13 and the gate insulation film 12. Incidentally, the ion-implanted atom may exist in the NiGe layers 15 and the gate electrode 13, provided that the atom does not damage their crystal structures.

As described above, according to this modified example, in the Ge-channel CMOSFET, a high-speed operation is enabled by using Ge as a semiconductor material forming a channel and desired threshold voltage control and a high effective mobility characteristic are achieved by low-temperature and simple manufacturing processes.

Second Embodiment

Hereinafter, a second embodiment of the present invention will be described. A CMOSFET disclosed here is formed by using a GOI (Germanium On Insulator) substrate instead of the Ge substrate used in the first embodiment. For convenience of the description, the structure of the CMOSFET will be described along with a manufacturing method thereof.

FIG. 20 to FIG. 24 are schematic cross-sectional views showing major processes of the method of manufacturing the Ge-channel CMOSFET according to the second embodiment, in order of processes.

A GOI substrate 31 used here is structured such that a thin Ge layer 31c is formed on a support substrate 31a such as a Si substrate via an insulation film 31b of $SiO_2$ or the like. The GOI substrate 31 can be formed by, for example, a so-called oxidation and condensation method or the like which oxidizes a SiGe layer formed on a SOI (Silicon On Insulator) substrate to increase a Ge composition. Incidentally, a thickness of the Ge layer 31c of the GOI substrate 31 is selected according to a required characteristic and the like of a CMOSFET 30 to be fabricated.

Figure 20:
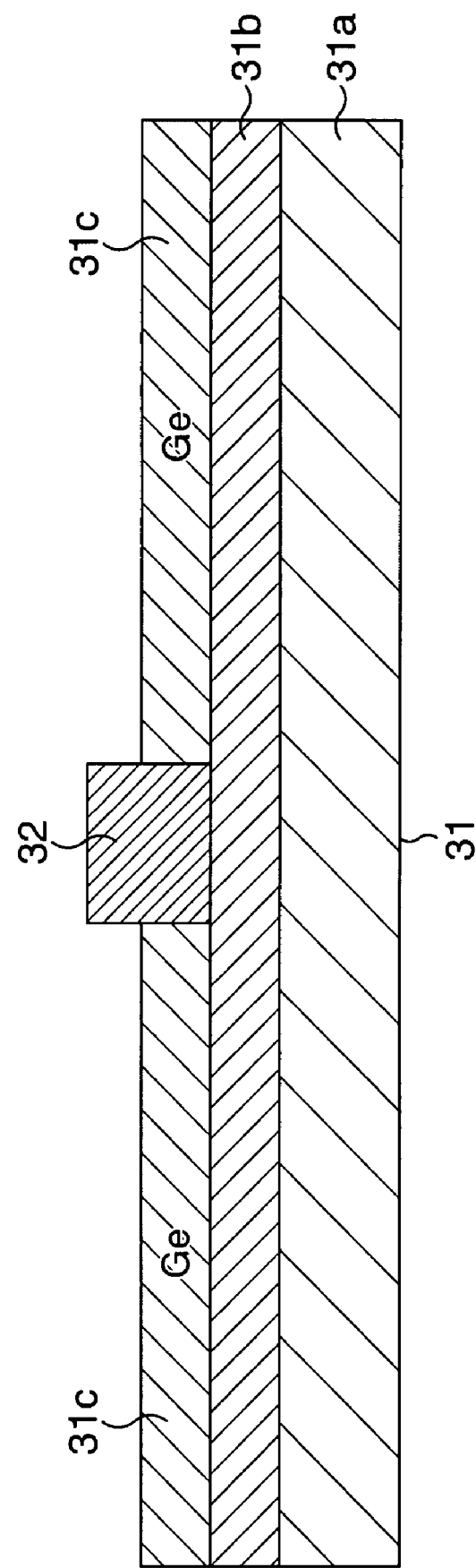
FIG. 20 is a schematic cross-sectional view showing a major process in a manufacturing method of a Ge-channel CMOSFET according to a second embodiment, in order of processes.

First, as shown in FIG. 20, a STI 32 demarcating regions for forming an nMOSFET 40 and a pMOSFET 50 is formed on the Ge layer 31c, which has an about 30 nm thickness, of the GOI substrate 31. Then, ion-implantation for threshold adjustment is performed to the regions demarcated by the STI 32.

Figure 21:
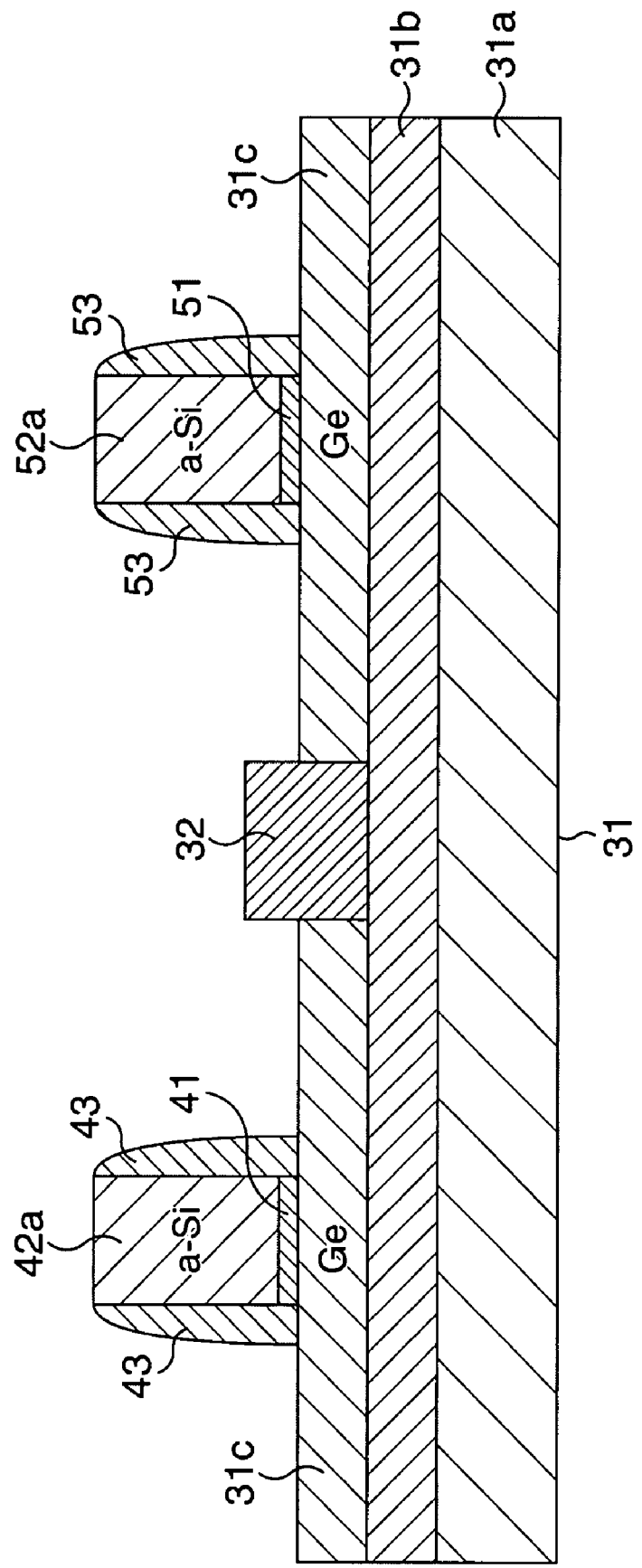
FIG. 21 is a schematic cross-sectional view, continued from FIG. 20, showing a major process in the manufacturing method of the Ge-channel CMOSFET according to the second embodiment, in order of processes.

Subsequently, as shown in FIG. 21, after a film of an insulative material such as GeON, $SiO_2$, SiON, or a high-k insulative material is formed on each of the regions for forming the nMOSFET 40 and the pMOSFET 50, amorphous Si is deposited thereon. A film of this amorphous Si is formed by, for example, a CVD method at a relatively low temperature, here, at about 525° C. Here, a film thickness of the amorphous Si is set to a value with which it completely becomes NiSi in a later-described silicidation process, here, about 40 nm.

Next, the amorphous Si and the insulative material are processed into an electrode shape to form gate insulation films 41, 51 and electrode layers 42a, 52a. Then, the whole surface is covered with an insulative material, and the insulative material is subjected to full anisotropic etching (etch-back) to form sidewalls 43, 53 on both side surfaces of the electrode layers 42a, 52a.

Figure 22:
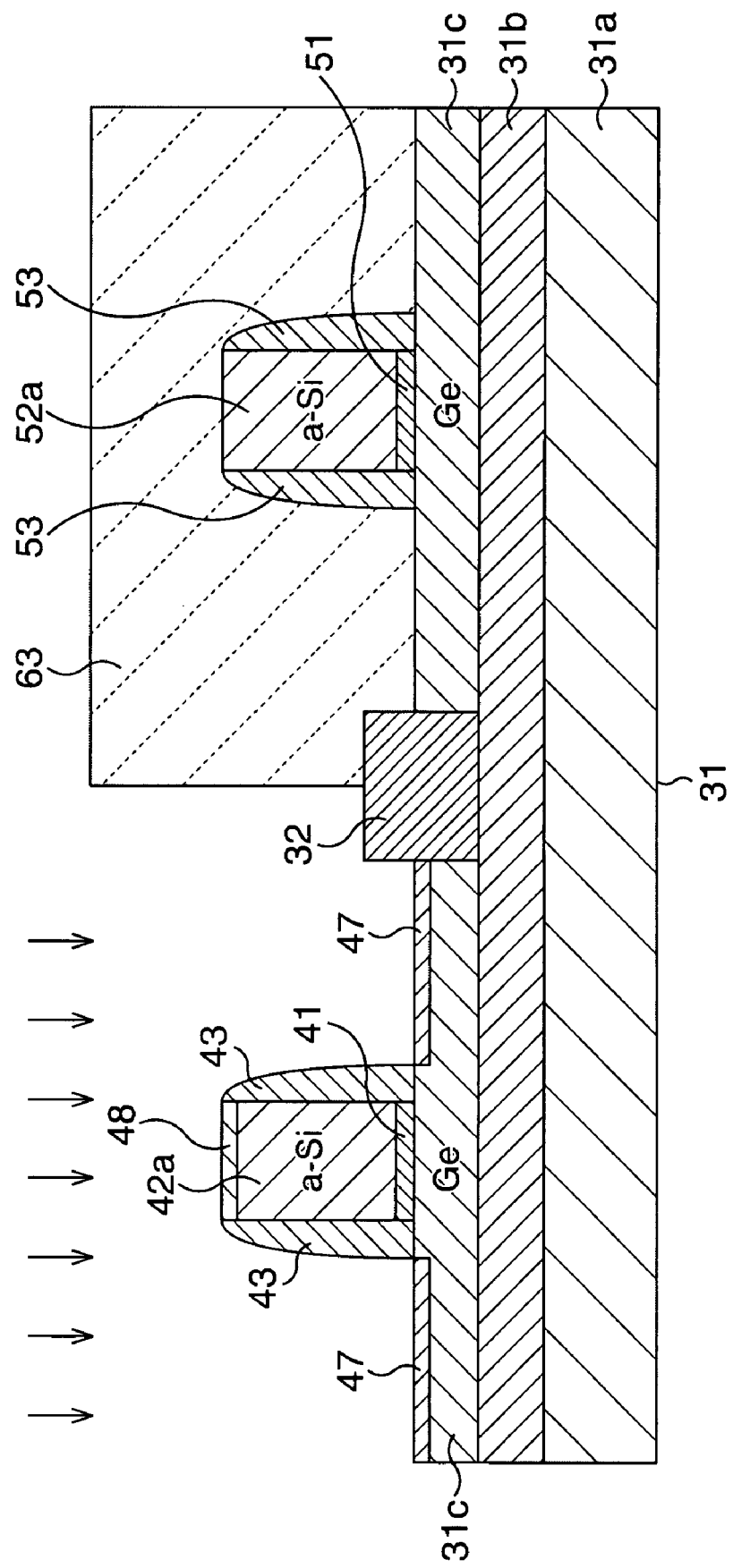
FIG. 22 is a schematic cross-sectional view, continued from FIG. 21, showing a major process in the manufacturing method of the Ge-channel CMOSFET according to the second embodiment, in order of processes.

Subsequently, as shown in FIG. 22, the region for forming the pMOSFET 50 is masked with a resist 63, and P, As, Sb, or the like, or S, Se, Te, or the like as a predetermined impurity atom is ion-implanted to the region for forming the nMOSFET 40. Consequently, implanted regions 47 are formed in a surface layer of the Ge layer 31c on both sides of the electrode layer 42a, and an implanted region 48 is formed in a surface layer of the electrode layer 42a. As conditions of the ion implantation, in a case where P, As, Sb, or the like is used as the impurity atom, an accelerating voltage is set to about 1 keV and a dose amount is set to about $2 \times 10^{14}/cm^2$ to about $1 \times 10^{15}/cm^2$, for instance. In a case where S, Se, Te, or the like is used as the impurity atom, the accelerating voltage is set to about 10 keV and the dose amount is set to about $5 \times 10^{13}/cm^2$ to about $1 \times 10^{15}/cm^2$.

After the ion implantation, the resist 63 is removed by ashing or the like.

Figure 23:
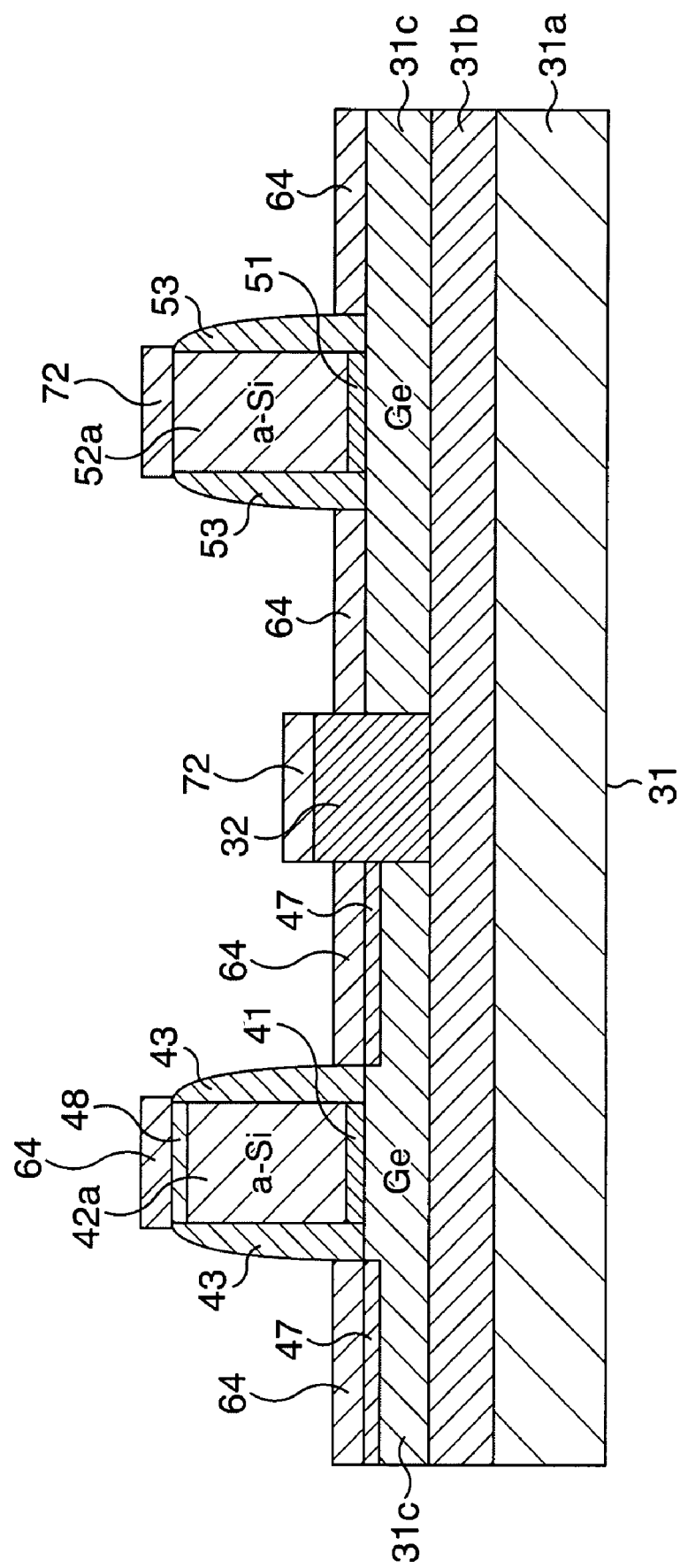
FIG. 23 is a schematic cross-sectional view, continued from FIG. 22, showing a major process in the manufacturing method of the Ge-channel CMOSFET according to the second embodiment, in order of processes.

Subsequently, as shown in FIG. 23, a Ni film 64 is deposited on the whole surface including the regions for forming the nMOSFET 40 and the pMOSFET 50 by a sputtering method or the like. A thickness of the Ni film 64 is set here to about 15 nm so that later-described NiGe layers 44, 54 have an optimum thickness (junction depth).

Then, after the Ni film 64 is deposited, RTA is performed in a $N_2$ atmosphere at a hold temperature of about 350° C. (the temperature is increased from room temperature in two minutes) for a hold time of about one minute, whereby the Ni film 64 is caused to react with the Ge layer 31c and the electrode layers 42a, 52a. The reason why the hold temperature for the RTA is set here to 350° is to make a value of the temperature fall within a range from 350° C. to 500° C. which is the proper temperature range obtained from the above studies by using FIG. 10.

Figure 24:
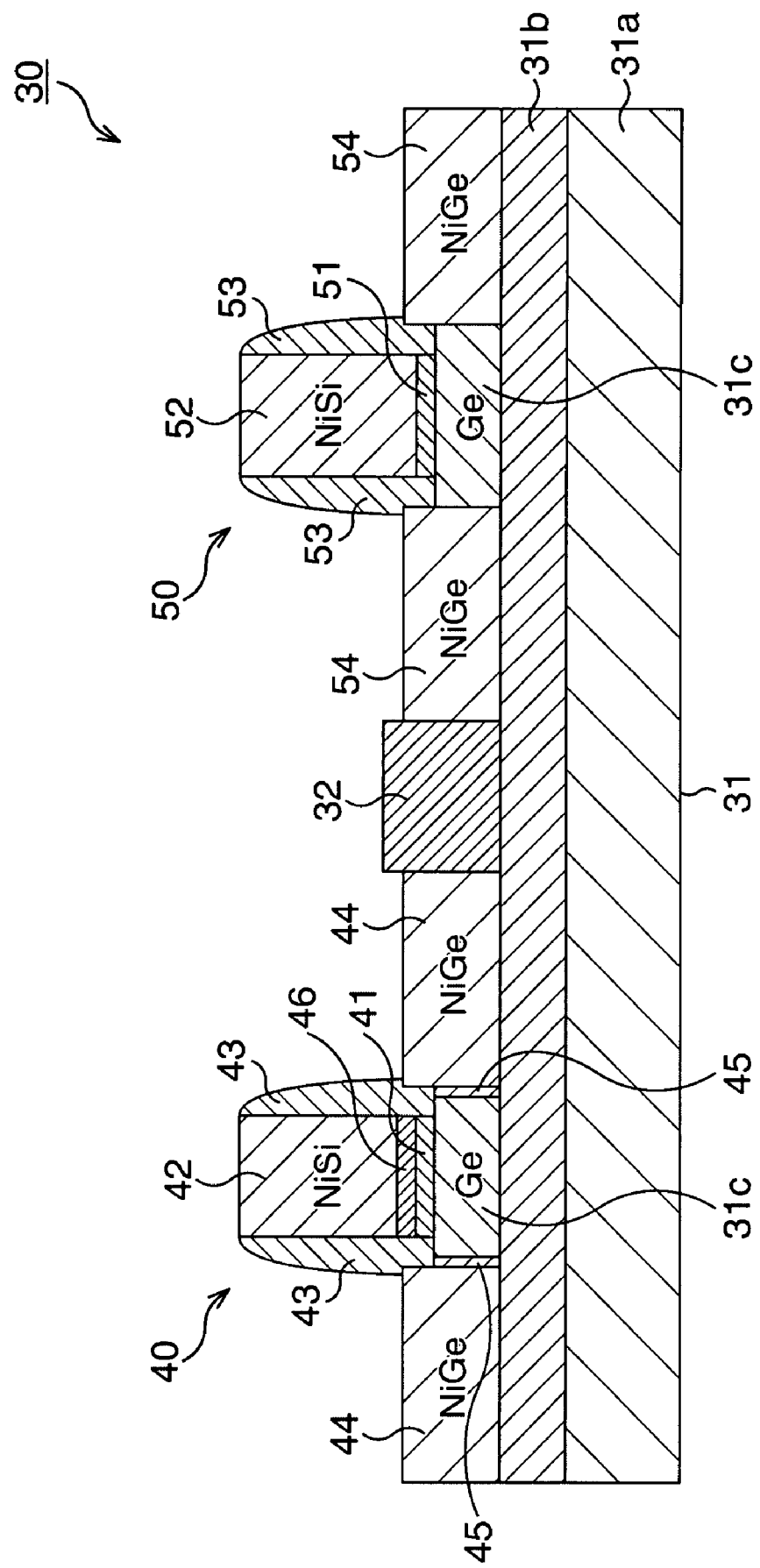
FIG. 24 is a schematic cross-sectional view, continued from FIG. 23, showing a major process in the manufacturing method of the Ge-channel CMOSFET according to the second embodiment, in order of processes.

Thereafter, the Ni film 64 which has not reacted is removed. Consequently, as shown in FIG. 24, gate electrodes 42, 52 of NiSi are formed by the silicidation of the electrode layers 42a, 52a, and the NiGe layers 44, 45 to be source/drain regions with a thickness (junction depth) of about 30 nm are formed by the germanidation of the surface layer of the Ge layer 31c on both sides of the electrode layers 42a, 52a. At this time, the impurity atom of the implanted regions 47 is further segregated on the junction interfaces of the NiGe layers 44 and the Ge layer 31c by being pressed by NiGe in the course of the reaction, thereby forming first layers 45, and the impurity atom of the implanted region 48 is segregated on the interface of the gate electrode 42 and the gate insulation film 41 by being pressed by NiGe in the course of the reaction, thereby forming a second layer 46.

Thereafter, interlayer insulation films, wirings, and so on are formed in the usual manner, whereby the Ge-channel CMOSFET 30 according to this embodiment is completed.

With this structure, it is possible to reduce the Schottky barrier height for electrons in the nMOSFET 40 and to obtain an appropriate threshold voltage not only for the pMOSFET 50 but also for the nMOSFET 40.

As described above, according to this embodiment, in the Ge-channel CMOSFET, a high-speed operation is enabled by using Ge as a semiconductor material forming a channel and desired threshold voltage control and a high effective mobility characteristic are achieved by low-temperature and simple manufacturing processes.

MODIFIED EXAMPLE

Here, a modified example of the second embodiment will be described. The same reference numerals and symbols are used here to designate the same constituent members and so on as those described in the first embodiment.

Figure 25:
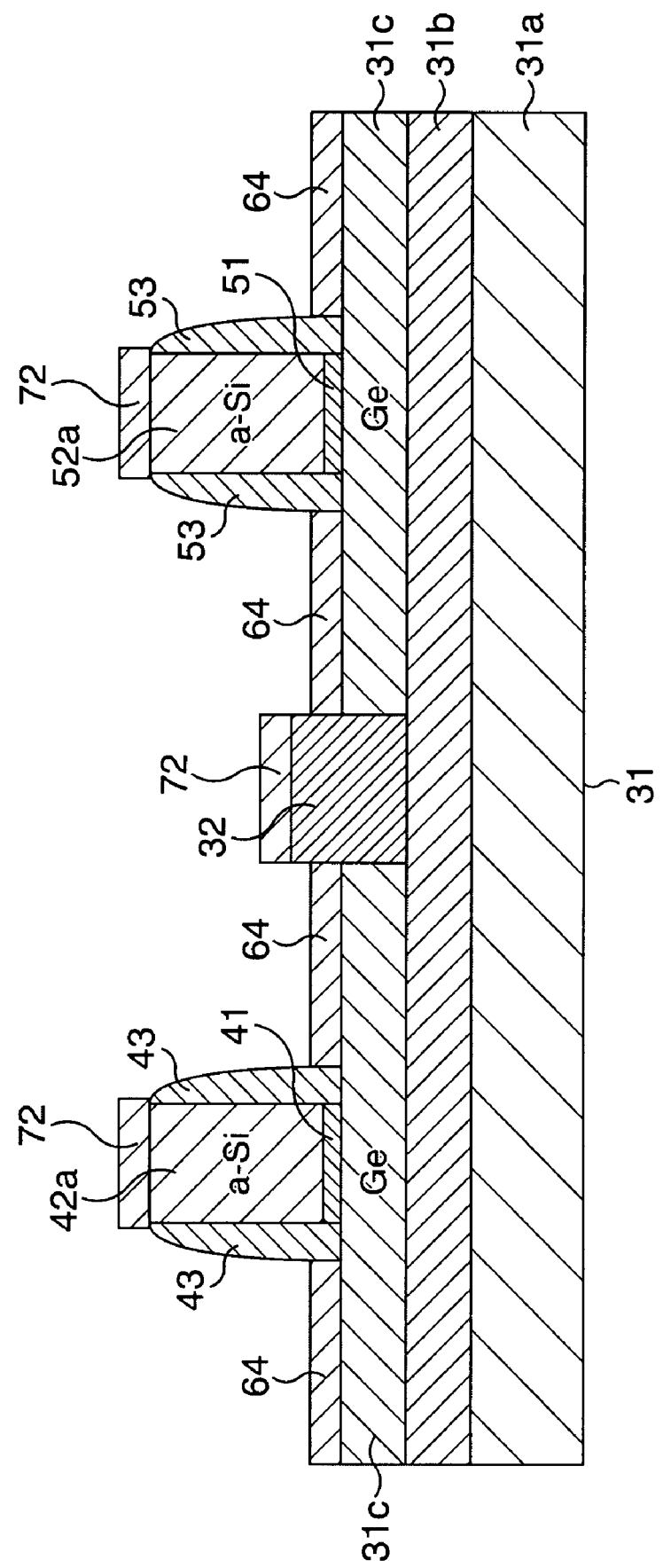
FIG. 25 is a schematic cross-sectional view showing a major process in a manufacturing method of a Ge-channel CMOSFET according to a modified example of the second embodiment, in order of processes.
Figure 26:
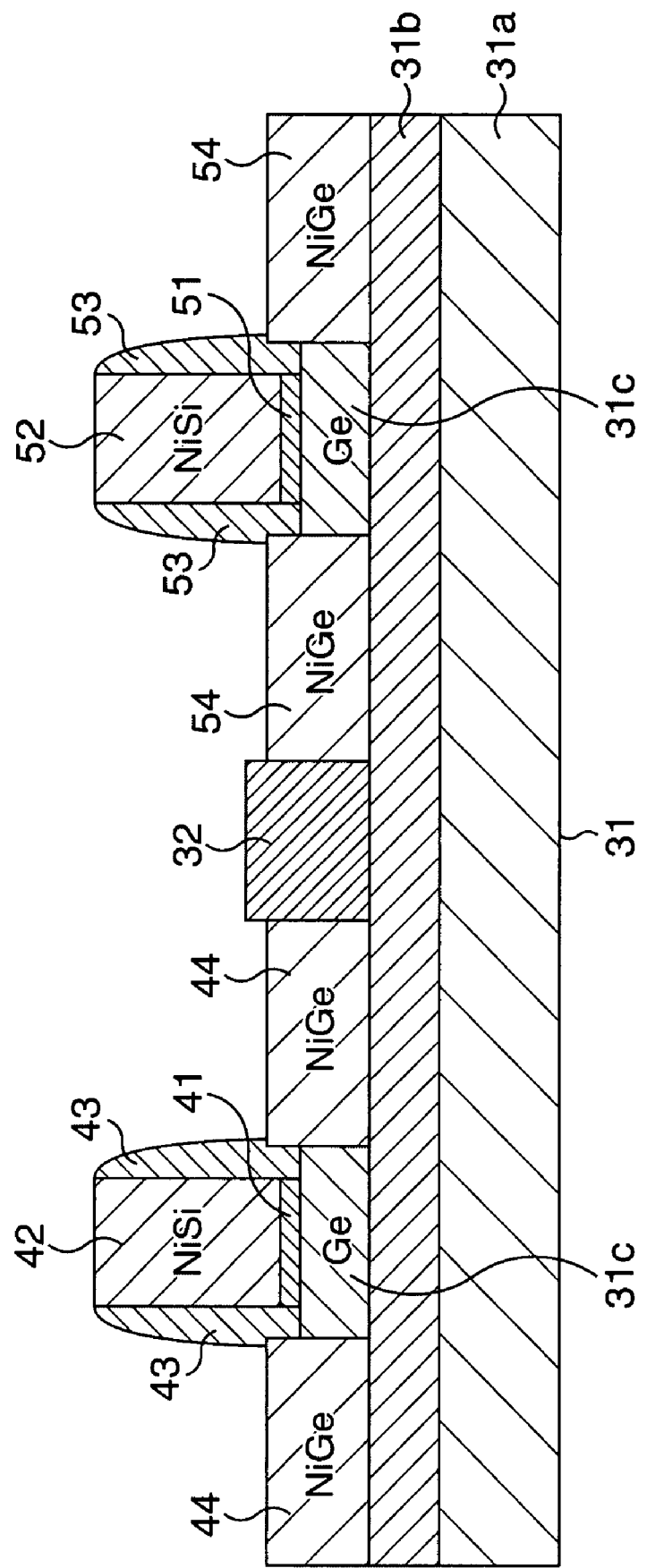
FIG. 26 is a schematic cross-sectional view, continued from FIG. 25, showing a major process in the manufacturing method of the Ge-channel CMOSFET according to the modified example of the second embodiment, in order of processes.
Figure 27:
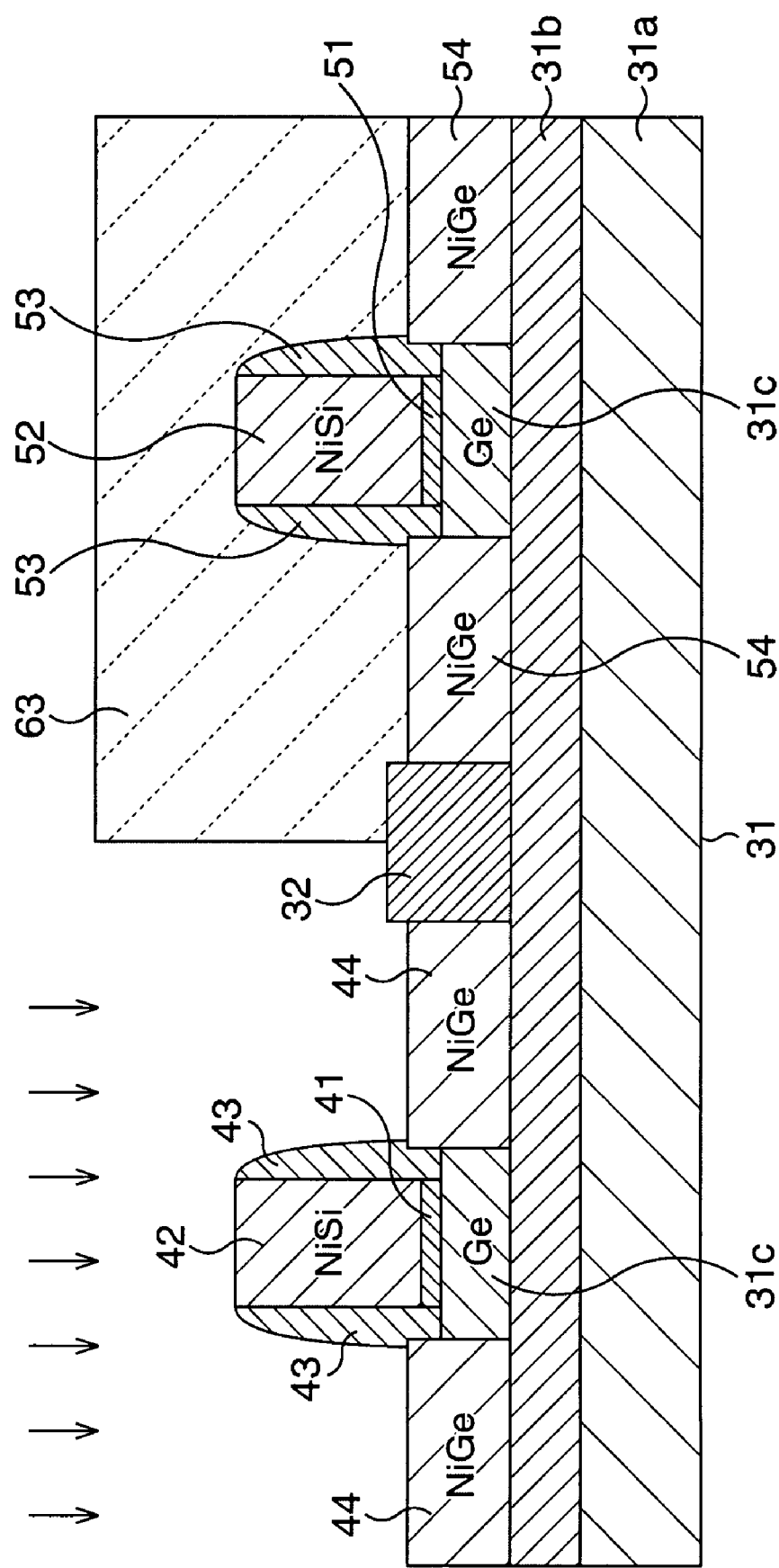
FIG. 27 is a schematic cross-sectional view, continued from FIG. 26, showing a major process in the manufacturing method of the Ge-channel CMOSFET according to the modified example of the second embodiment, in order of processes.

FIG. 25 to FIG. 27 are schematic cross-sectional views showing major processes in a method of manufacturing a Ge-channel CMOSFET according to the modified example of the second embodiment, in order of processes.

First, after a STI 32 is formed on an about 30 nm Ge layer 31c of a GOI substrate 31 and ion-implantation for threshold voltage adjustment is performed as shown in FIG. 20, gate insulation films 41, 51, gate electrodes 42, 52, and sidewalls 43, 53 are formed as shown in FIG. 21.

Then, after a Ni film 64 with a thickness of about 15 nm is deposited on the whole surface as shown in FIG. 25, RTA is performed at a temperature within the proper temperature range described in the second embodiment for a predetermined time as shown in FIG. 26. Consequently, gate electrodes 42, 52 of NiSi are formed by the silicidation of electrode layers 42a, 52a, and NiGe layers 44, 45 to be source/drain regions with a thickness (junction depth) of about 30 nm are formed by the germanidation of the surface layer of the Ge layer 31c on both sides of the electrode layers 42a, 52a.

Thereafter, the Ni film 64 which has not reacted is removed.

Then, after the gate electrodes 42, 52 and the NiGe layers 15, 25 are formed, a region for forming a pMOSFET 50 is masked with a resist 63, and P, As, Sb, or the like, or S, Se, Te, or the like is ion-implanted to a region for forming an nMOSFET 40 under a predetermined condition.

After the ion implantation, the resist 63 is removed by ashing or the like.

Finally, RTA is performed under a predetermined condition to diffuse and segregate the ion-implanted atom. Consequently, first layers 45 are formed on junction interfaces between the NiGe layers 44 and the Ge layer 31c, and a second layer 46 is formed on an interface between the gate electrode 42 and the gate insulation film 41, similarly to the structure shown in FIG. 24. A diffusion coefficient of the ion-implanted atom in the NiGe layers 44 is higher than in the Ge layer 31c, and the atom ion-implanted after the NiGe layers 44 are formed diffuses in the NiGe layers 44 to form the first layers 45. Similarly, a diffusion coefficient of the ion-implanted atom in the gate electrode (NiSi) 42 is higher than in the electrode layer (Si) 42a, and the atom ion-implanted after the gate electrode 42 is formed diffuses in the gate electrode 42 to form the second layer 46.

Thereafter, in the usual manner, interlayer-insulation films, wirings, and so on are formed, whereby the Ge-channel CMOSFET 30 according to this modified example is completed.

With this structure, it is possible to reduce the Schottky barrier height for electrons in the nMOSFET 40 and to obtain an appropriate threshold voltage not only for the pMOSFET 50 but also for the nMOSFET 40.

In this modified example, the ion implantation to form the first and second layers 45, 46 comes after the formation of the NiGe layers 44, 54. The use of such a method makes it possible to set an accelerating voltage at the time of the ion implantation higher than that when the ion implantation to form the first and second layers 45, 46 comes before the formation of the gate electrodes 42, 52 and the NiGe layers 44, 54 (see FIG. 20 to FIG. 24 of the second embodiment). Therefore, a selection range of apparatuses can be widened, for example, an ion-implanting apparatus whose lower limit of an acceleration voltage is high can be used. Further, in this method, it is possible to form the first and second layers 45, 46 by utilizing a difference between the diffusion coefficient of the ion-implanted atom in the NiGe layers 44 and that in the Ge layer 31c, and a difference between the diffusion coefficient of the ion-implanted atom in the gate electrode (NiSi) 42 and that in the electrode layer (Si) 42a, but in forming the CMOSFET, full care should be given to amounts of the atom finally remaining in the NiGe layers 44 and the gate electrode 42 and to amounts of the atom reaching junction interfaces between the NiGe layers 44 and the Ge layer 31c and reaching an interface between the gate electrode 42 and the gate insulation film 41. Incidentally, the ion-implanted atom may exist in the NiGe layers 44 and the gate electrode 42, provided that the atom does not damage their crystal structures.

As described above, according to this modified example, in the Ge-channel CMOSFET, a still higher-speed operation is enabled by using Ge as a semiconductor material forming a channel, here by using the GOI substrate 31, and desired threshold voltage control and a high effective mobility characteristic are achieved by low-temperature and simple manufacturing processes.

Third Embodiment

Hereinafter, a third embodiment of the present invention will be described. Here, disclosed is a case where, in the device structure in the first embodiment, the source/drain regions have a structure in which a NiGe layer and a p-type or n-type impurity diffusion layer partly overlap with each other. For convenience of the description, the structure of the CMOSFET will be described along with a manufacturing method thereof. The same reference numerals and symbols are used to designate the same constituent members and so on as those described in the first embodiment.

FIG. 28 to FIG. 33 are schematic cross-sectional views showing major processes of the method of manufacturing a Ge-channel CMOSFET according to the third embodiment, in order of processes.

First, after a STI 3 is formed to form a p-well 11 and an n-well 21 as shown in FIG. 11 of the first embodiment, gate insulation films 12, 22, electrode layers 13a, 23a, and sidewalls 14, 24 are formed as shown in FIG. 12.

Figure 28:
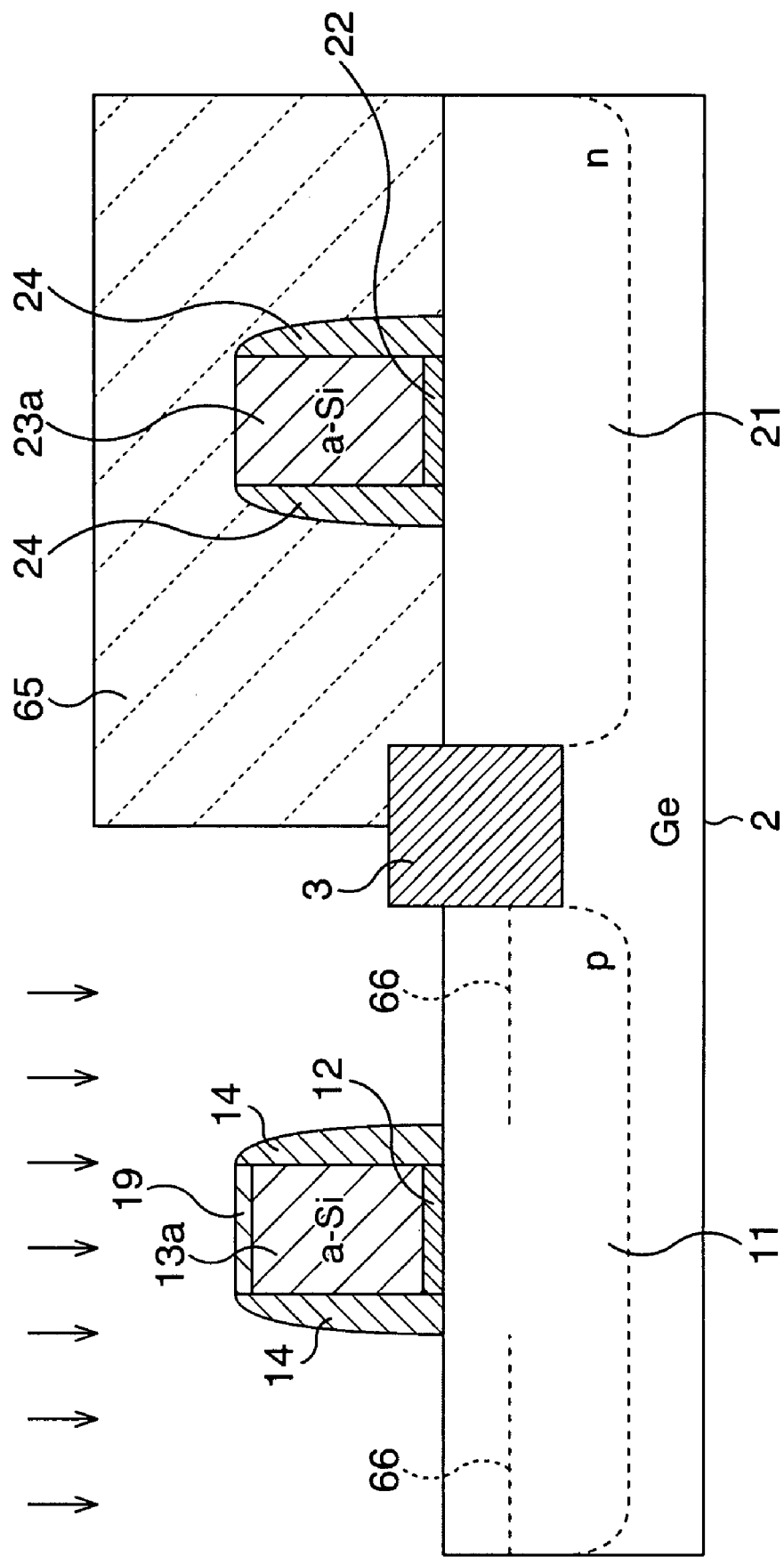
FIG. 28 is a schematic cross-sectional view showing a major process in a manufacturing method of a Ge-channel CMOSFET according to a third embodiment, in order of processes.

Then, as shown in FIG. 28, a region for forming a pMOSFET 80 is masked with a resist 65, and a predetermined n-type impurity, for example, phosphorus (P), is ion-implanted to a region for forming an nMOSFET 70 to form implanted regions 66 in a surface layer of a Ge substrate 2 on both sides of the sidewalls 14. As conditions of the ion implantation, an accelerating voltage is set to about 100 keV and a dose amount is set to about $4\times10^{15}/cm^2$, for instance.

Figure 29:
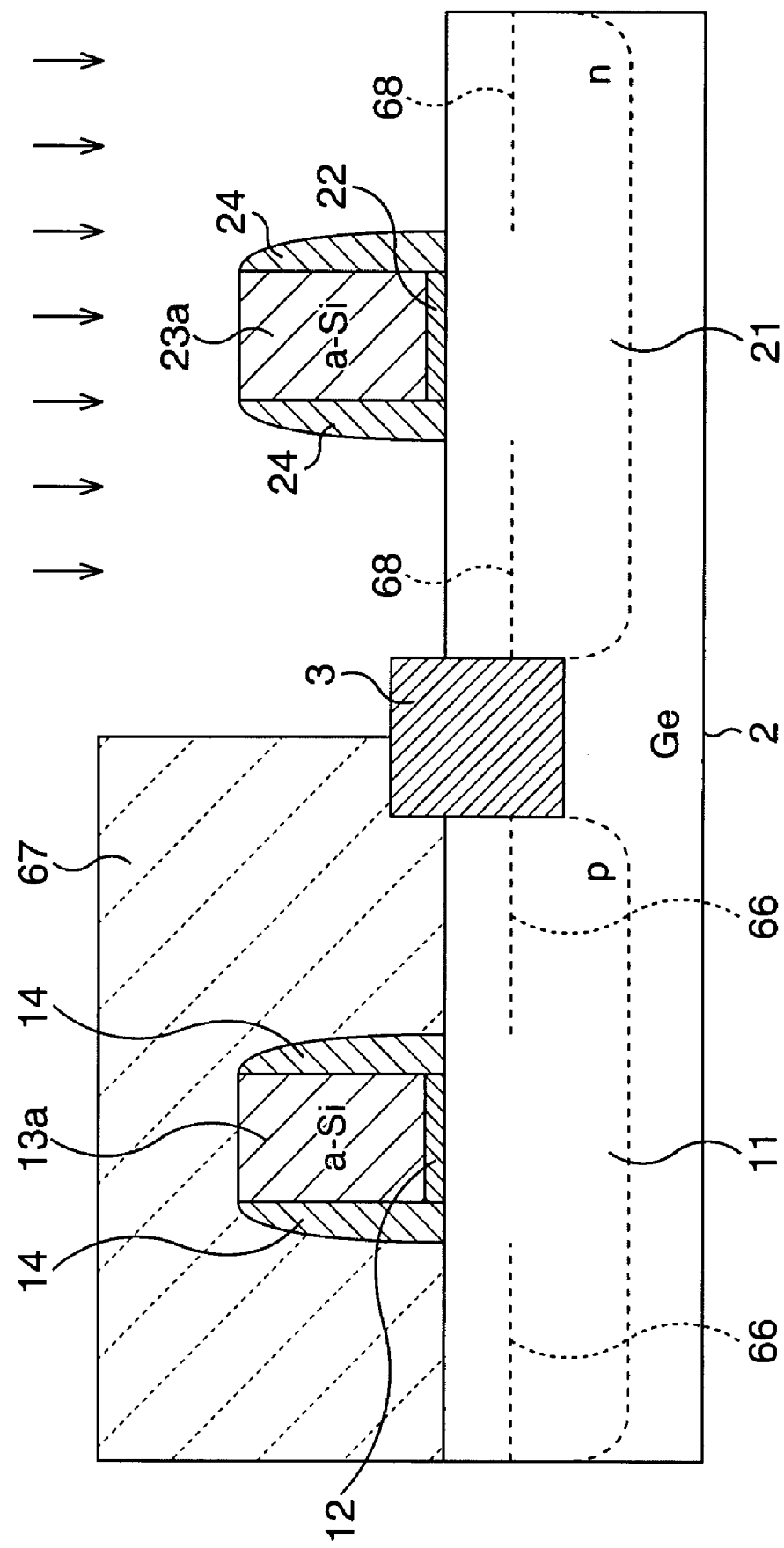
FIG. 29 is a schematic cross-sectional view, continued from FIG. 28, showing a major process in the manufacturing method of the Ge-channel CMOSFET according to the third embodiment, in order of processes.

Subsequently, after the resist 65 is removed by ashing or the like, the region for forming the nMOSFET 70 is masked with a resist 67, and a predetermined p-type impurity, for example, $BF_2$ is ion-implanted to the region for forming the pMOSFET 80 to form implanted regions 68 in the surface layer of the Ge substrate 2 on both sides of the sidewalls 24, as shown in FIG. 29. As conditions of the ion implantation, an accelerating voltage is set to about 50 keV and a dose amount is set to about $5\times10^{15}/cm^2$, for instance.

Figure 30:
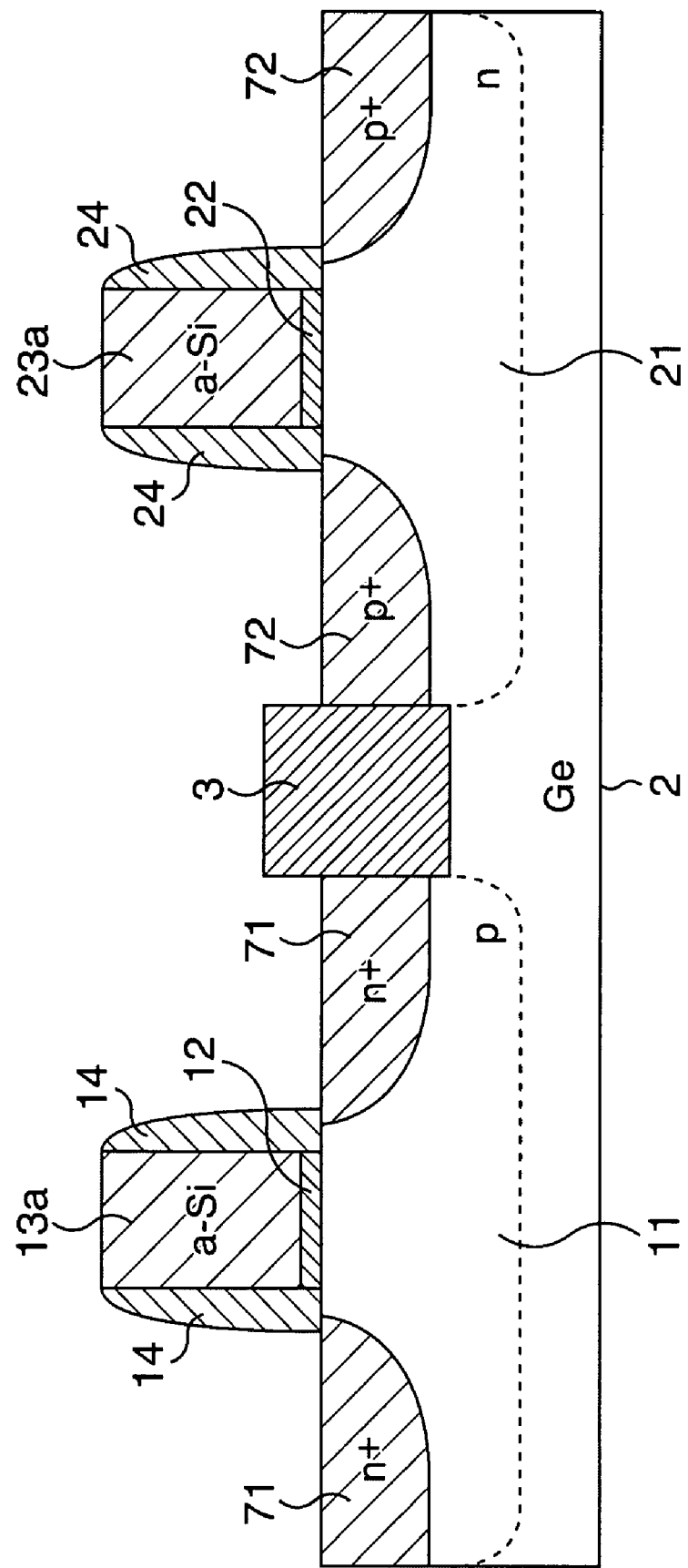
FIG. 30 is a schematic cross-sectional view, continued from FIG. 29, showing a major process in the manufacturing method of the Ge-channel CMOSFET according to the third embodiment, in order of processes.

Subsequently, after the resist 67 is removed by ashing or the like, annealing is performed in an $N_2$ atmosphere at a hold temperature of about 500° C. for a hold time of about one minute to activate the n-type impurity in the implanted regions 66 and the p-type impurity of the implanted regions 68, whereby deep source/drain regions 71, 72 are formed, as shown in FIG. 30.

Figure 31:
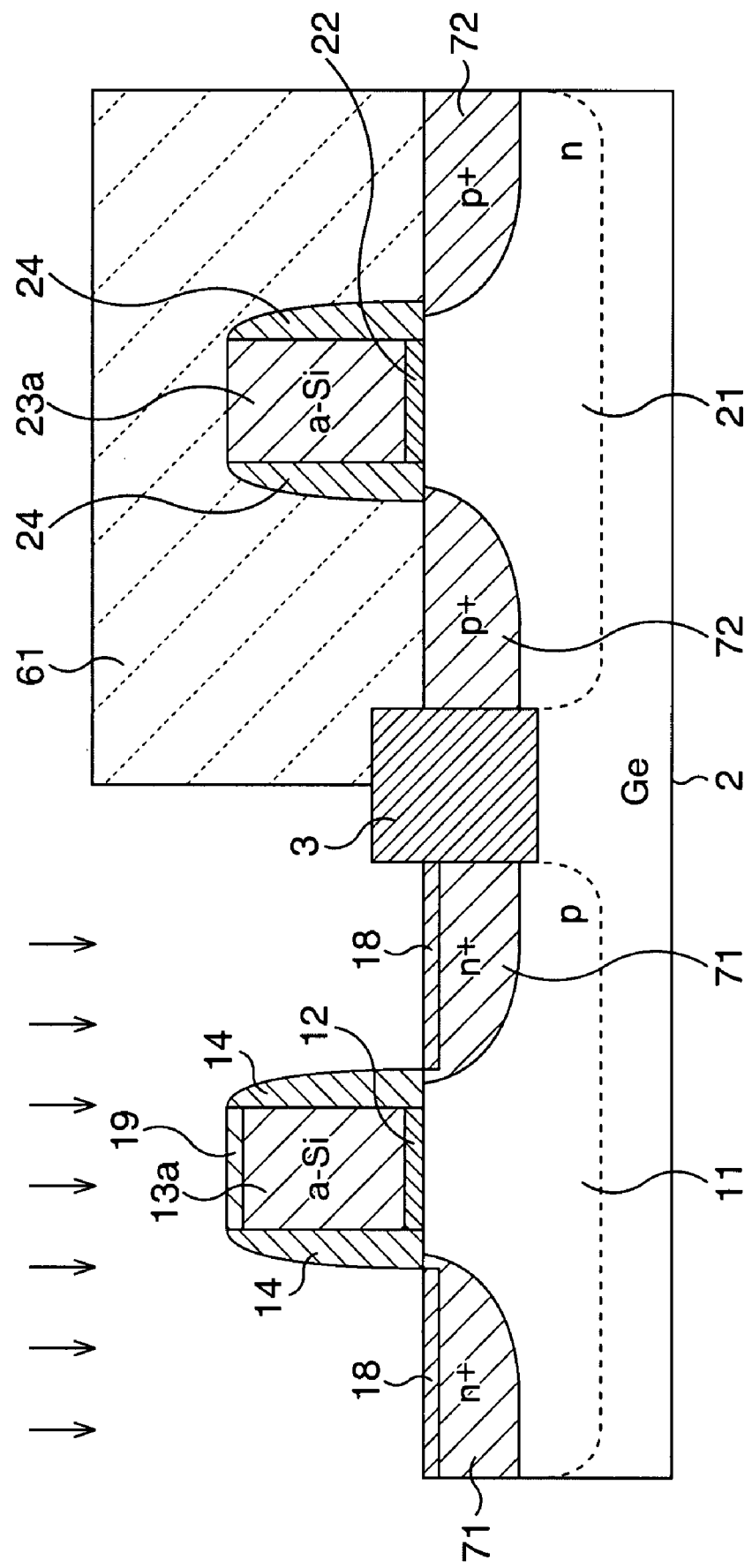
FIG. 31 is a schematic cross-sectional view, continued from FIG. 30, showing a major process in the manufacturing method of the Ge-channel CMOSFET according to the third embodiment, in order of processes.

Subsequently, as shown in FIG. 31, the region for forming the pMOSFET 80 is masked with a resist 61, and P, As, Sb, or the like, or S, Se, Te, or the like is ion-implanted as a predetermined impurity atom to the region for forming the nMOSFET 70. Consequently, implanted regions 18 overlapping with the deep source/drain regions 71 are formed in the surface layer of the Ge substrate 2 on both sides of the electrode layer 13a, and an implanted region 19 is formed in a surface layer of the electrode layer 13a. As conditions of the ion implantation, in a case where P, As, Sb, or the like is used as the impurity atom, an accelerating voltage is set to about 1 keV and a dose amount is set to about $2\times10^{14}/cm^2$ to about $1\times10^{15}/cm^2$, for instance. In a case where S, Se, Te, or the like is used as the impurity atom, the accelerating voltage is set to about 10 keV and the dose amount is set to about $5\times10^{13}/cm^2$ to about $1\times10^{15}/cm^2$, for instance.

After the ion implantation, the resist 61 is removed by ashing or the like.

Figure 32:
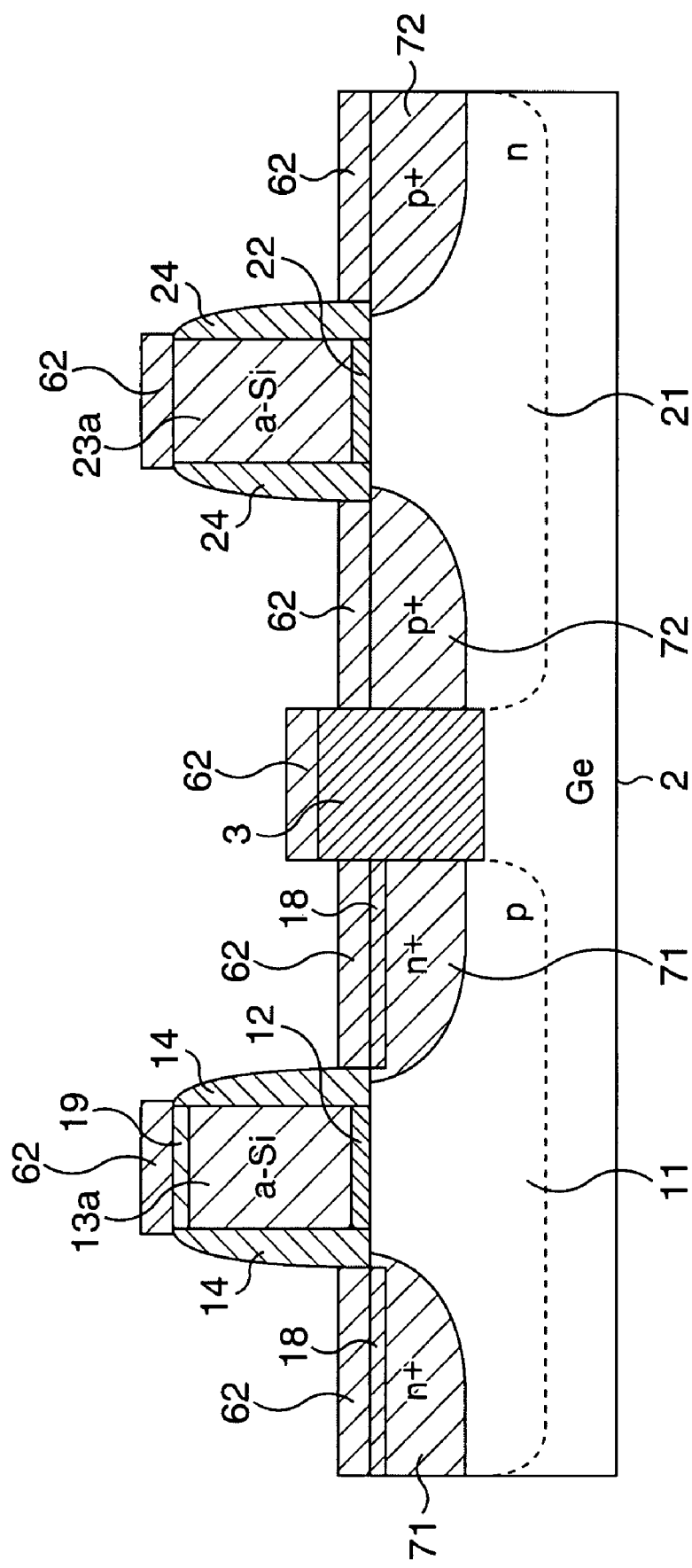
FIG. 32 is a schematic cross-sectional view, continued from FIG. 31, showing a major process in the manufacturing method of the Ge-channel CMOSFET according to the third embodiment, in order of processes.

Subsequently, as shown in FIG. 32, a Ni film 62 is deposited on the whole surface including the regions for forming the nMOSFET 70 and the pMOSFET 80 by a sputtering method or the like. A thickness of the Ni film 62 is set here to about 15 nm so that later-described NiGe layers 15, 25 have an optimum thickness (junction depth).

Then, after the Ni film 62 is deposited, RTA is performed in a $N_2$ atmosphere at a hold temperature of about 400° C. (the temperature is increased from room temperature in two minutes) for a hold time of about one minutes, whereby the Ni film 62 is caused to react with the Ge substrate 2 and the electrode layers 13a, 23a. The reason why the hold temperature for the RTA is set here to 400° is to make a value of the temperature fall within the proper temperature range from 350° C. to 500° C. which was obtained from the above studies by using FIG. 10.

Figure 33:
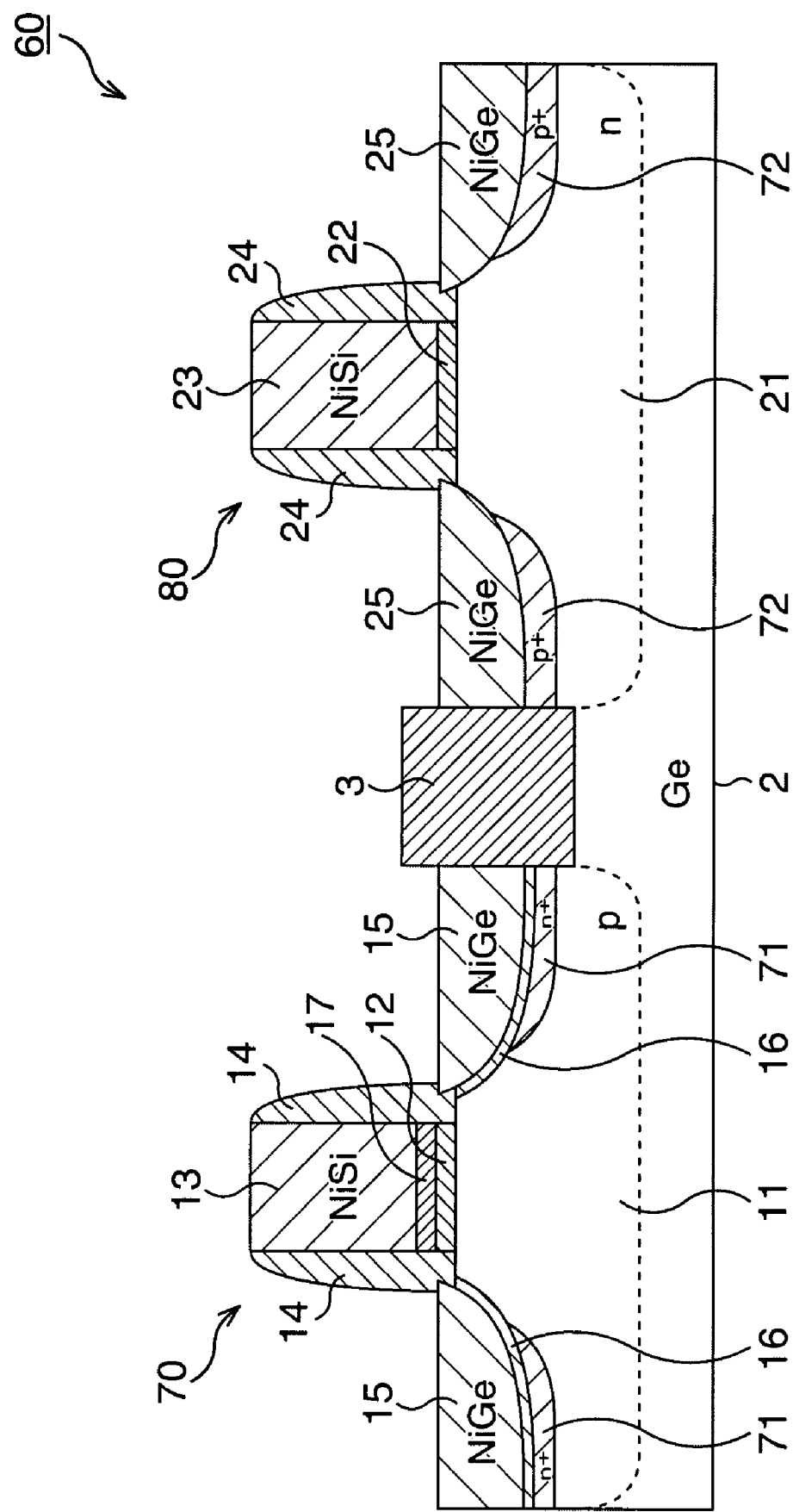
FIG. 33 is a schematic cross-sectional view, continued from FIG. 32, showing a major process in the manufacturing method of the Ge-channel CMOSFET according to the third embodiment, in order of processes.

Thereafter, the Ni film 62 which has not reacted is removed. Consequently, as shown in FIG. 33, gate electrodes 13, 23 of NiSi are formed by the silicidation of the electrode layers 13a, 23a and the NiGe layers 15, 25 with a thickness (junction depth) of about 30 nm are formed by the germanidation of the surface layer of the Ge substrate 2 on both sides of the electrode layers 13a, 23a. At this time, the NiGe layers 15, 25 are formed to partly overlap with upper portions of the deep source/drain regions 71, 72. The deep source/drain regions 71, 72 protrude downward from lower potions of the NiGe layers 15, 25, and end portions, of the NiGe layers 15, 25, on the gate electrodes 13, 23 side are positioned at places closer to the gate electrodes 15, 25 than end portions, of the deep source/drain regions 71, 72, on the gate electrodes 15, 25 side.

That is, in this embodiment, the NiGe layers 15, 25 are LDD (Light Doped Drain) regions or extension regions, and function as source/drain regions together with the deep sources/drains 71, 72. In a semiconductor device having Schottky junctions as source/drain regions, there sometimes occurs a problem of so-called junction leakage. In this embodiment, by the structure in which the NiGe layers 15, 25 and the deep sources/drains 71, 72 form the double-layered source/drain regions, it is possible to greatly reduce the junction leakage ascribable to the Schottky junction.

Further, at this time, on junction interfaces of the NiGe layers 15 with the Ge substrate 2 and with the source/drain regions 71, the impurity atom of the implanted regions 18 is segregated by being pressed by NiGe in the course of the reaction to form first layers 16, and on an interface between the gate electrode 13 and the gate insulation film 12, the impurity atom of the implanted region 19 is segregated by being pressed by NiGe in the course of the reaction to form a second layer 17.

Thereafter, interlayer insulation films, wirings, and so on are formed in the usual manner, whereby the Ge-channel CMOSFET 60 according to this embodiment is completed.

As described above, according to this embodiment, in the Ge-channel CMOSFET, a high-speed operation is enabled by using Ge as a semiconductor material forming a channel, the junction leakage ascribable to the Schottky junction is greatly reduced, and desired threshold voltage control and a high effective mobility characteristic are achieved by low-temperature and simple manufacturing processes.

MODIFIED EXAMPLES

Here, modified examples of the third embodiment will be described. The same reference numerals and symbols are used here to designate the same constituent members and so on as those described in the first embodiment.

Modified Example 1

Figure 34:
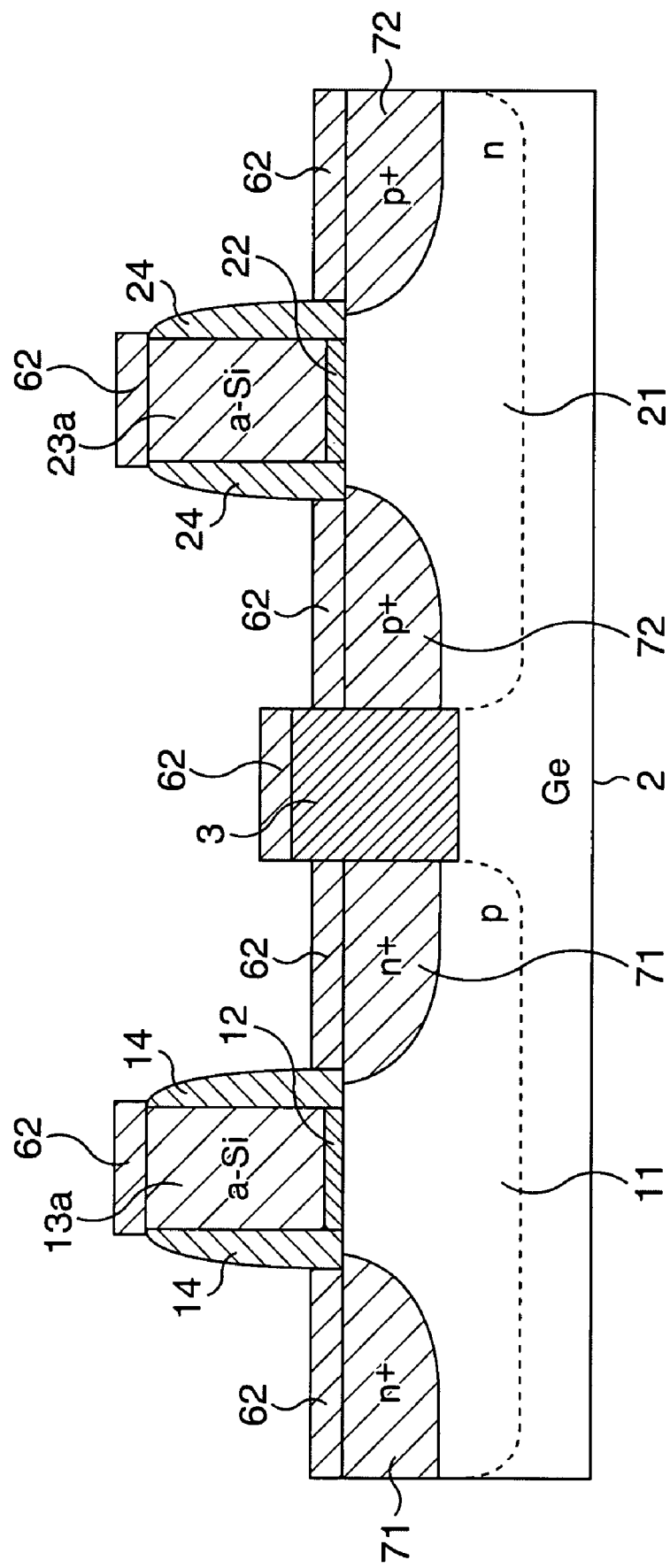
FIG. 34 is a schematic cross-sectional view showing a major process in a manufacturing method of a Ge-channel CMOSFET according to a modified example 1 of the third embodiment, in order of processes.
Figure 35:
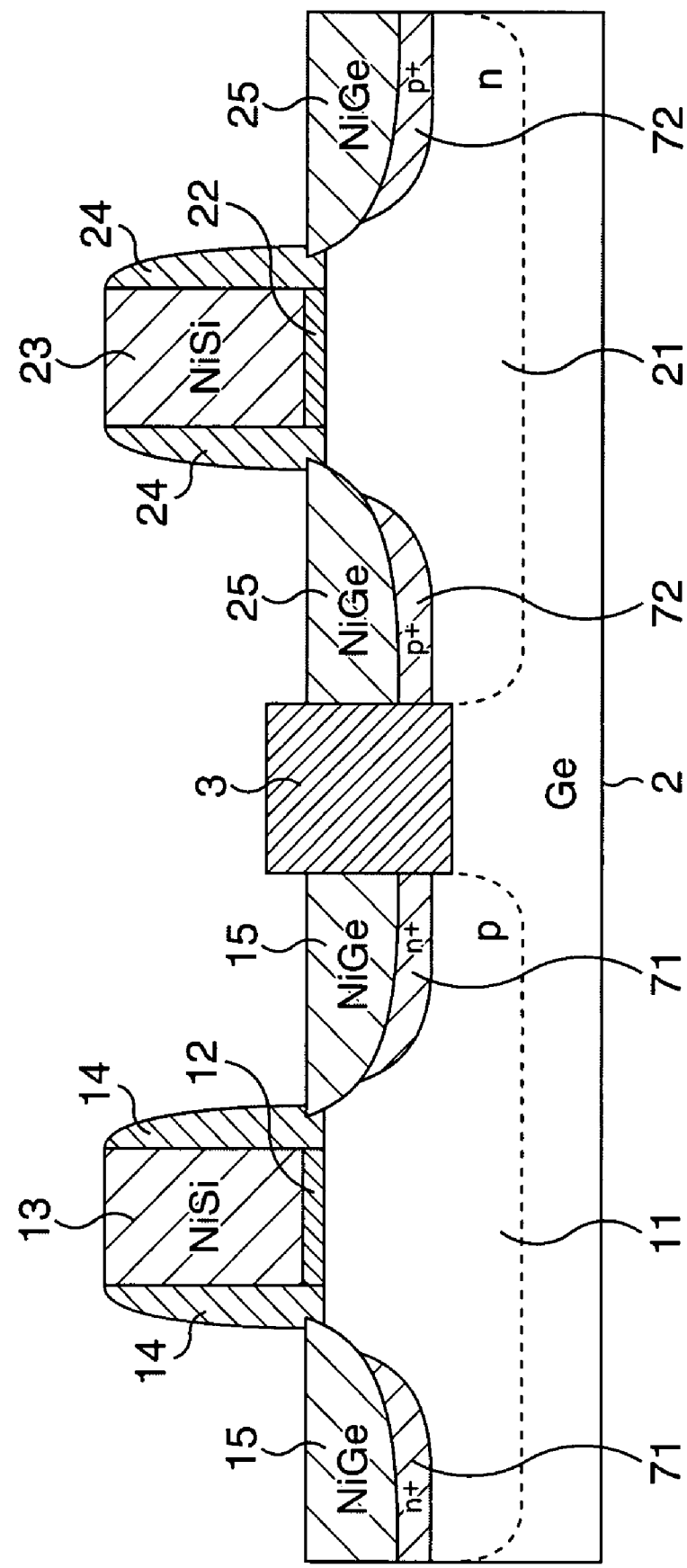
FIG. 35 is a schematic cross-sectional view, continued from FIG. 34, showing a major process in the manufacturing method of the Ge-channel CMOSFET according to the modified example 1 of the third embodiment, in order of processes.
Figure 36:
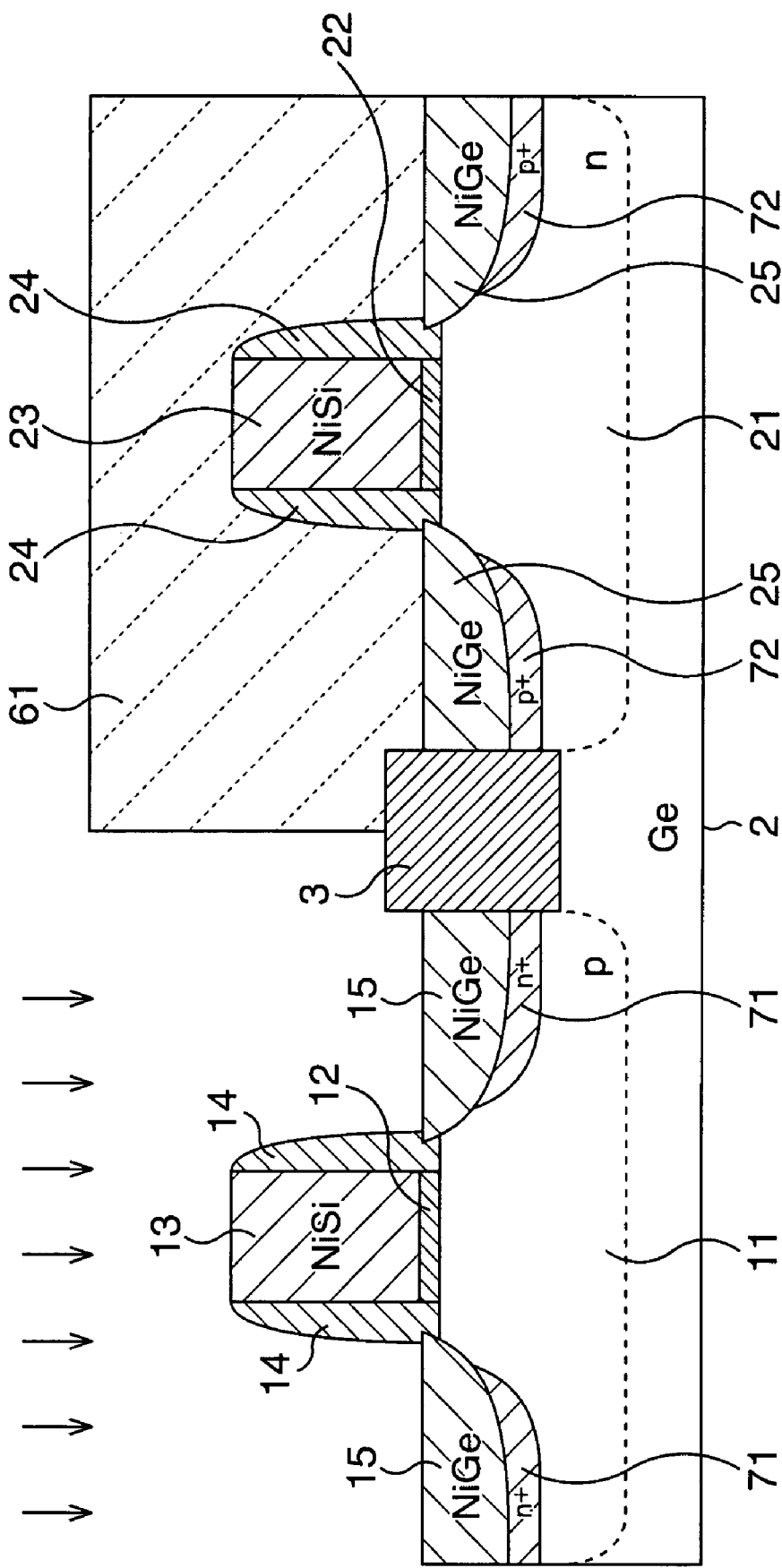
FIG. 36 is a schematic cross-sectional view, continued from FIG. 35, showing a major process in the manufacturing method of the Ge-channel CMOSFET according to the modified example 1 of third embodiment, in order of processes.

FIG. 34 to FIG. 36 are schematic cross-sectional views showing major processes in a method of manufacturing a Ge-channel CMOSFET according to a modified example 1 of the third embodiment, in order of processes.

First, after a STI 3 is formed to form a p-well 11 and an n-well 21 as shown in FIG. 11, gate insulation films 12, 22, electrode layers 13a, 23a, and sidewalls 14, 24 are formed as shown in FIG. 12. Thereafter, as shown in FIG. 28 to FIG. 30, deep source/drain regions 71, 72 are formed.

Then, after a Ni film 62 with a thickness of about 20 nm is deposited on the whole surface as shown in FIG. 34, RTA is performed at a temperature within the proper temperature range described in the first embodiment, for a predetermined time, as shown in FIG. 35. Consequently, gate electrodes 13, 23 of NiSi are formed by the silicidation of the electrode layers 13a, 23a and NiGe layers 15, 25 with a thickness (junction depth) of about 30 nm are formed by the germanidation of a surface layer of a Ge substrate 2 on both sides of the electrode layers 13a, 23a. At this time, the NiGe layers 15, 25 are formed to partly overlap with upper portions of the deep source/drain regions 71, 72. The deep source/drain regions 71, 72 protrude downward from lower potions of the NiGe layers 15, 25, and end portions, of the NiGe layers 15, 25, on the gate electrodes 13, 23 side are positioned at places closer to the gate electrodes 13, 23 than end portions, of the deep source/drain regions 71, 72, on the gate electrodes 13, 23 side.

That is, in this modified example 1, the NiGe layers 15, 25 are LDD (Light Doped Drain) regions or extension regions, and function as source/drain regions together with the deep sources/drains 71, 72. In a semiconductor device having Schottky junctions as source/drain regions, there sometimes occurs a problem of so-called junction leakage. In this modified example 1, by the structure in which the NiGe layers 15, 25 and the deep sources/drains 71, 72 form the double-layered source/drain regions, it is possible to greatly reduce the junction leakage ascribable to the Schottky junction.

Thereafter, the Ni film 62 which has not reacted is removed.

Then, after the gate electrodes 13, 23 and the NiGe layers 15, 25 are thus formed, a region for forming a pMOSFET 80 is masked with a resist 61, and P, As, Sb, or the like, or S, Se, Te, or the like is ion-implanted to a region for forming an nMOSFET 70 under a predetermined condition as shown in FIG. 36.

After the ion-implantation, the resist 61 is removed by ashing or the like.

Finally, RTA is performed under a predetermined condition to diffuse and segregate the ion-implanted atom. Consequently, first layers 16 are formed on junction interfaces of the NiGe layers 15 with the Ge substrate 2 and with the source/drain regions 71, and a second layer 17 is formed on an interface between the gate electrode 13 and the gate insulation film 12, similarly to the structure shown in FIG. 33. A diffusion coefficient of the ion-implanted atom in the NiGe layers 15 is higher than that in the Ge substrate 2, and the atom ion-implanted after the NiGe layers 15 are formed diffuses in the NiGe layers 15 to form the first layers 16. Similarly, a diffusion coefficient of the ion-implanted atom in the gate electrode (NiSi) 13 is higher than that in the electrode layer (Si) 13a, and the atom ion-implanted after the gate electrode 13 is formed diffuses in the gate electrode 13 to form the second layer 17.

Thereafter, in the usual manner, interlayer-insulation films, wirings, and so on are formed, whereby the Ge-channel CMOSFET 60 according to the modified example 1 is completed.

In this modified example, the ion implantation to form the first and second layers 16, 17 comes after the formation of the NiGe layers 15, 25. The use of such a method makes it possible to set an accelerating voltage at the time of the ion implantation higher than that when the ion implantation to form the first and second layers 16, 17 comes before the formation of the gate electrodes 13, 23 and the NiGe layers 15, 25 (see FIG. 28 to FIG. 33) of the third embodiment). Therefore, a selection range of apparatuses can be widened, for example, an ion-implanting apparatus whose lower limit of an acceleration voltage is high can be used. Further, in this method, it is possible to form the first and second layers 16, 17 by utilizing a difference between the diffusion coefficient of the ion-implanted atoms in the NiGe layers 15 and that in the Ge substrate 2, and a difference between the diffusion coefficient of the ion-implanted atoms in the gate electrode (NiSi) 13 and that in the electrode layer (Si) 13a, but in forming the CMOSFET, full care should be given to amounts of the atom finally remaining in the NiGe layers 15 and in the gate electrode 13 and to amounts of the atom reaching the junction interfaces between the NiGe layers 15 and the Ge substrate 2 and reaching the interface between the gate electrode 13 and the gate insulation film 12. Incidentally, the ion-implanted atom may exist in the NiGe layers 15 and the gate electrode 13, provided that the atom does not damage their crystal structures.

As described above, according to the modified example 1, in the Ge-channel CMOSFET, a high-speed operation is enabled by using Ge as a semiconductor material forming a channel, the junction leakage ascribable to the Schottky junction is greatly reduced, and desired threshold voltage control and a high effective mobility characteristic are achieved by low-temperature and simple manufacturing processes.

Modified Example 2

FIG. 37 to FIG. 44 are schematic cross-sectional views showing major processes in a method of manufacturing a Ge-channel CMOSFET according to a modified example 2 of the third embodiment, in order of processes.

First, as shown in FIG. 11, a STI 3 is formed to form a p-well 11 and an n-well 21.

Figure 37:
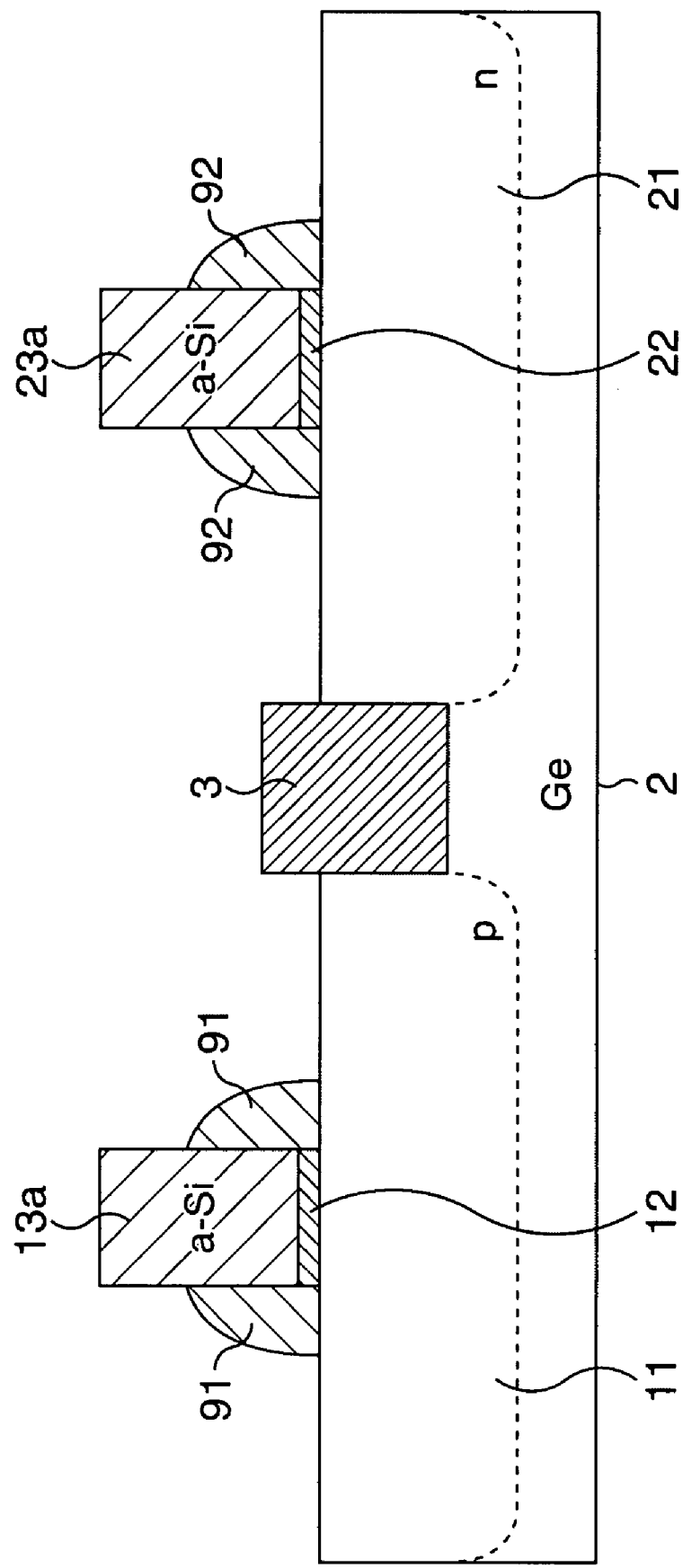
FIG. 37 is a schematic cross-sectional view showing a major process in a manufacturing method of a Ge-channel CMOSFET according to a modified example 2 of the third embodiment, in order of processes.

Subsequently, after gate insulation films 12, 22 and electrode layers 13a, 23a are formed in a similar manner as in FIG. 12, the whole surface is covered with an insulative material, and the insulative material is subjected to full anisotropic etching (etchback), whereby sidewalls 91, 92 are formed on both side surfaces of the electrode layers 13a, 23a, as shown in FIG. 37. These sidewalls 91, 92 are formed wider than the sidewalls 14, 24 and lower than the electrode layers 13a, 23a in FIG. 12. To form the sidewalls 91, 92 in this manner, a deposition thickness of the sidewalls 91, 92 is made larger than a deposition thickness of the sidewalls 14, 24.

Figure 38:
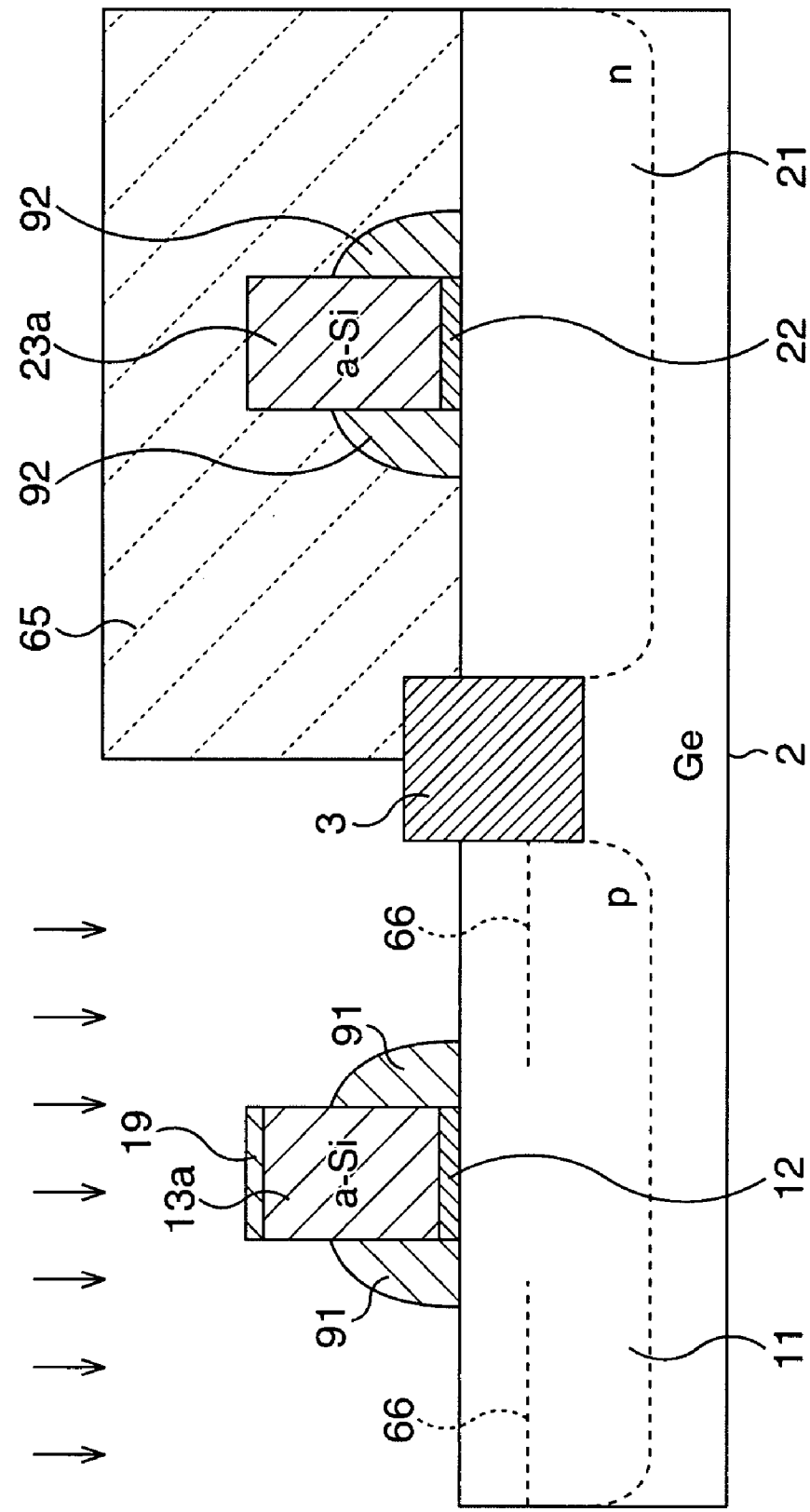
FIG. 38 is a schematic cross-sectional view, continued from FIG. 37, showing a major process in the manufacturing method of the Ge-channel CMOSFET according to the modified example 2 of the third embodiment, in order of processes.

Subsequently, as shown in FIG. 38, in a state where the sidewalls 91, 92 are formed, a region for forming a pMOSFET 110 is masked with a resist 65 and a predetermined n-type impurity, for example, phosphorus (P), is ion-implanted to a region for forming an nMOSFET 100. Consequently, implanted regions 66 are formed in a surface layer of a Ge substrate 2 on both sides of the sidewalls 91. As conditions of the ion implantation, an accelerating voltage is set to about 100 keV and a dose amount is set to about $4 \times 10^{15}/cm^2$, for instance.

Figure 39:
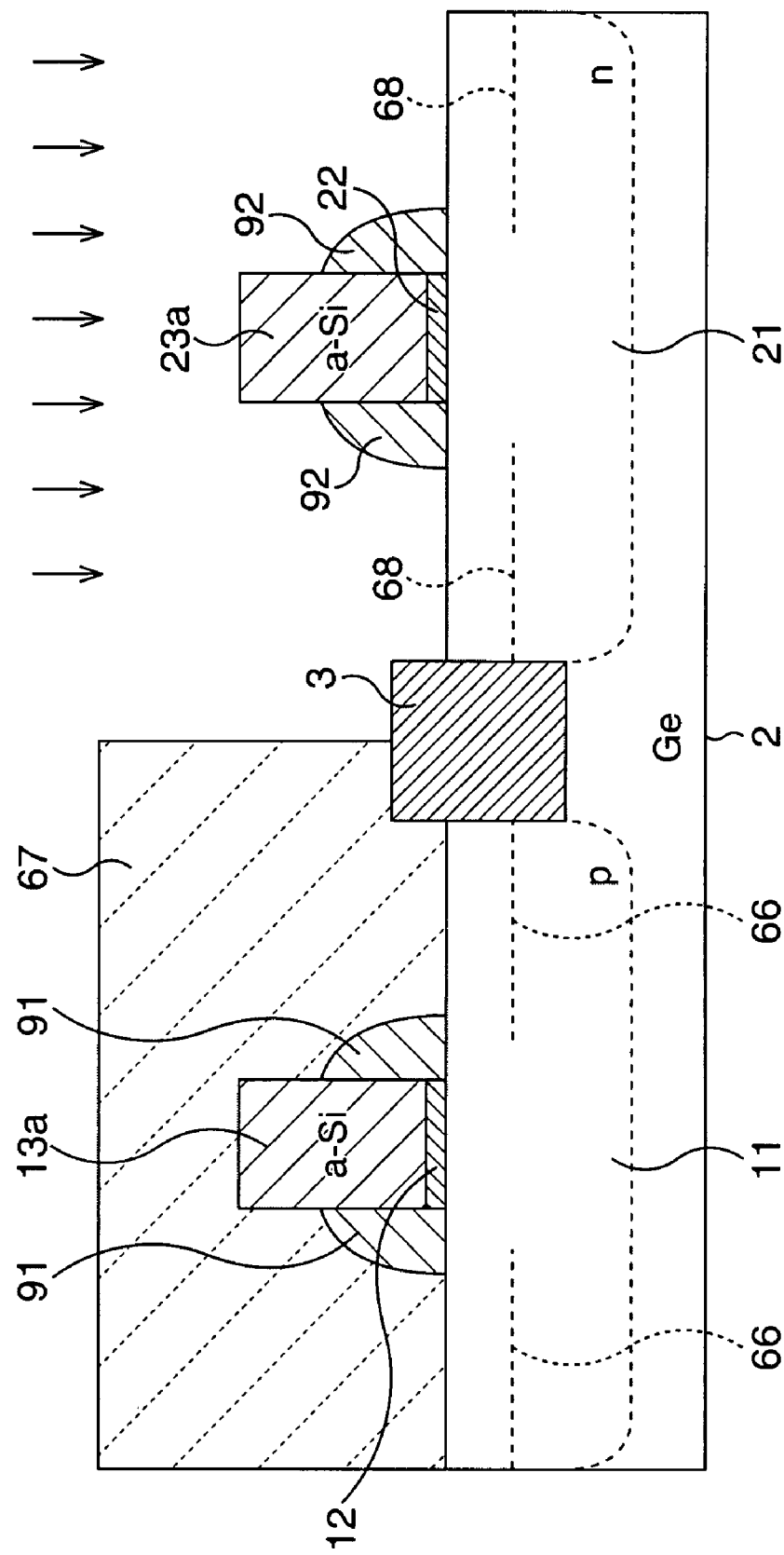
FIG. 39 is a schematic cross-sectional view, continued from FIG. 38, showing a major process in the manufacturing method of the Ge-channel CMOSFET according to the modified example 2 of the third embodiment, in order of processes.

Subsequently, after the resist 65 is removed by ashing or the like, the region for forming the nMOSFET 100 is masked with a resist 67, and a predetermined p-type impurity, for example $BF_2$, is ion-implanted to the region for forming the pMOSFET 110, whereby implanted regions 68 are formed in the surface layer of the Ge substrate 2 on both sides of the sidewalls 92, as shown in FIG. 39. As conditions of the ion implantation, an accelerating voltage is set to about 50 keV and a dose amount is set to about $5 \times 10^{15}/cm^2$, for instance.

Figure 40:
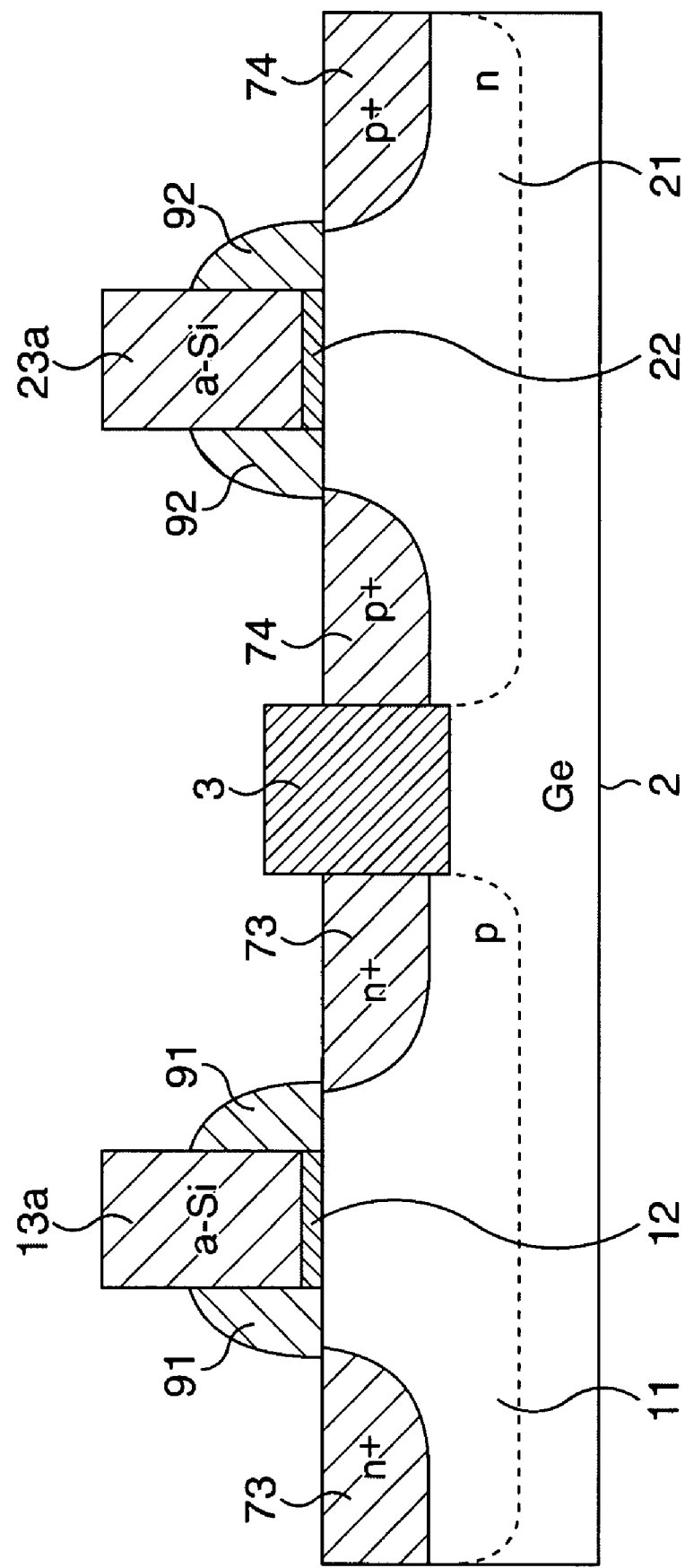
FIG. 40 is a schematic cross-sectional view, continued from FIG. 39, showing a major process in the manufacturing method of the Ge-channel CMOSFET according to the modified example 2 of the third embodiment, in order of processes.

Subsequently, after the resist 67 is removed by ashing or the like, annealing is performed in an $N_2$ atmosphere at a hold temperature of about 500° C. for a hold time of about one minute to activate the n-type impurity in the implanted regions 66 and the p-type impurity of the implanted regions 68, whereby deep source/drain regions 73, 74 are formed, as shown in FIG. 40. End portions, of these deep source/drain regions 73, 74, on the electrode layer 13a, 23a side are positioned by being restricted by widths of the sidewalls 91, 92. That is, in forming the sidewalls 91, 92, the widths thereof are adjusted to predetermined values, so that the formation positions of the end portions, of the deep source/drain regions 73, 74, on the electrode layer 13a, 23a side can be controlled as desired. Since the sidewalls 91, 92 are formed wider than the sidewalls 14, 24, the one-side end portions of the deep source/drain regions 73, 74 are positioned more apart from the electrode layers 13a, 23a than the one-side end portions of the source/drain regions 71, 72 in the third embodiment.

Figure 41:
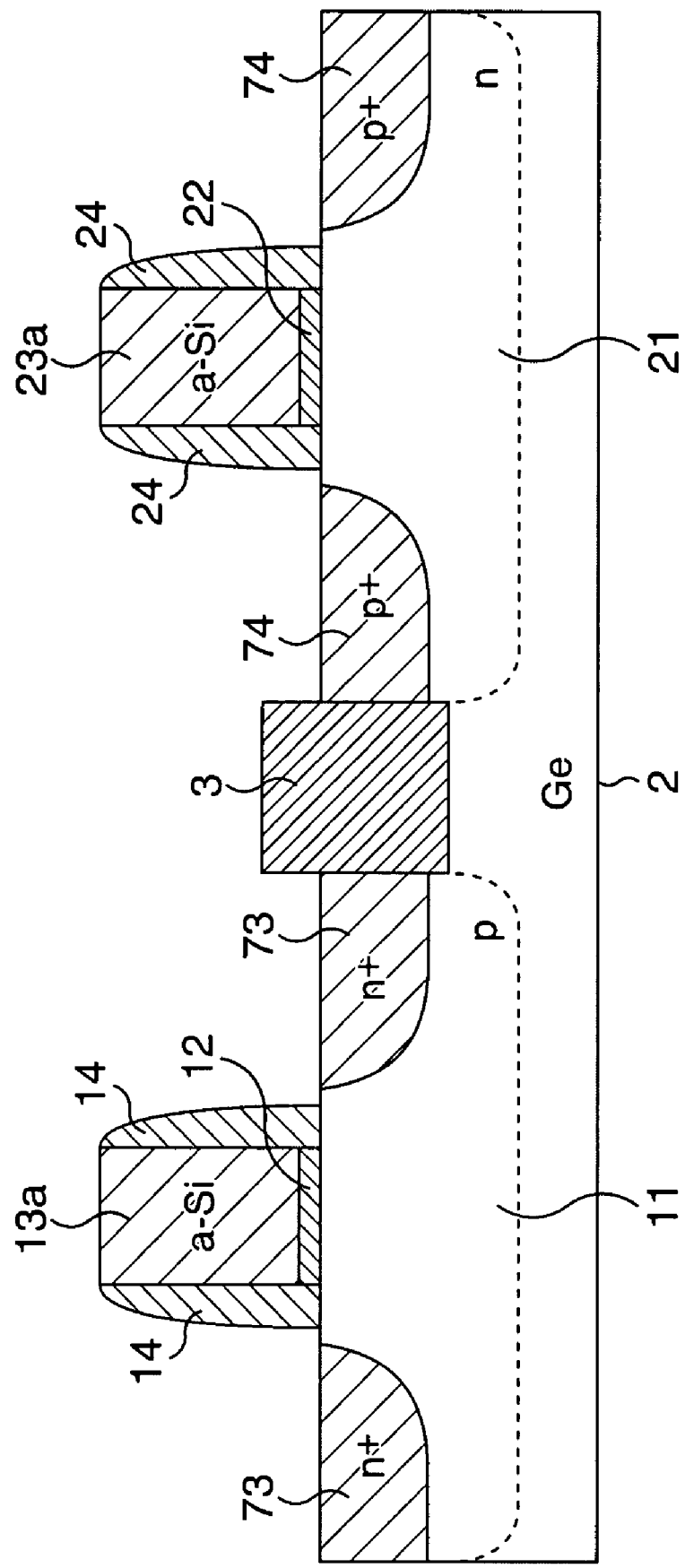
FIG. 41 is a schematic cross-sectional view, continued from FIG. 40, showing a major process in the manufacturing method of the Ge-channel CMOSFET according to the modified example 2 of the third embodiment, in order of processes.

Subsequently, the sidewalls 91, 92 are removed by wet etching or the like using a predetermined etching solution. Thereafter, as shown in FIG. 41, the whole surface is covered with an insulative material, and the insulative material is subjected to full anisotropic etching (etchback), whereby sidewalls 14, 24 are formed on both side surfaces of the electrode layers 13a, 23a. As described above, the sidewalls 14, 24 are formed narrower than the sidewalls 91, 92.

Figure 42:
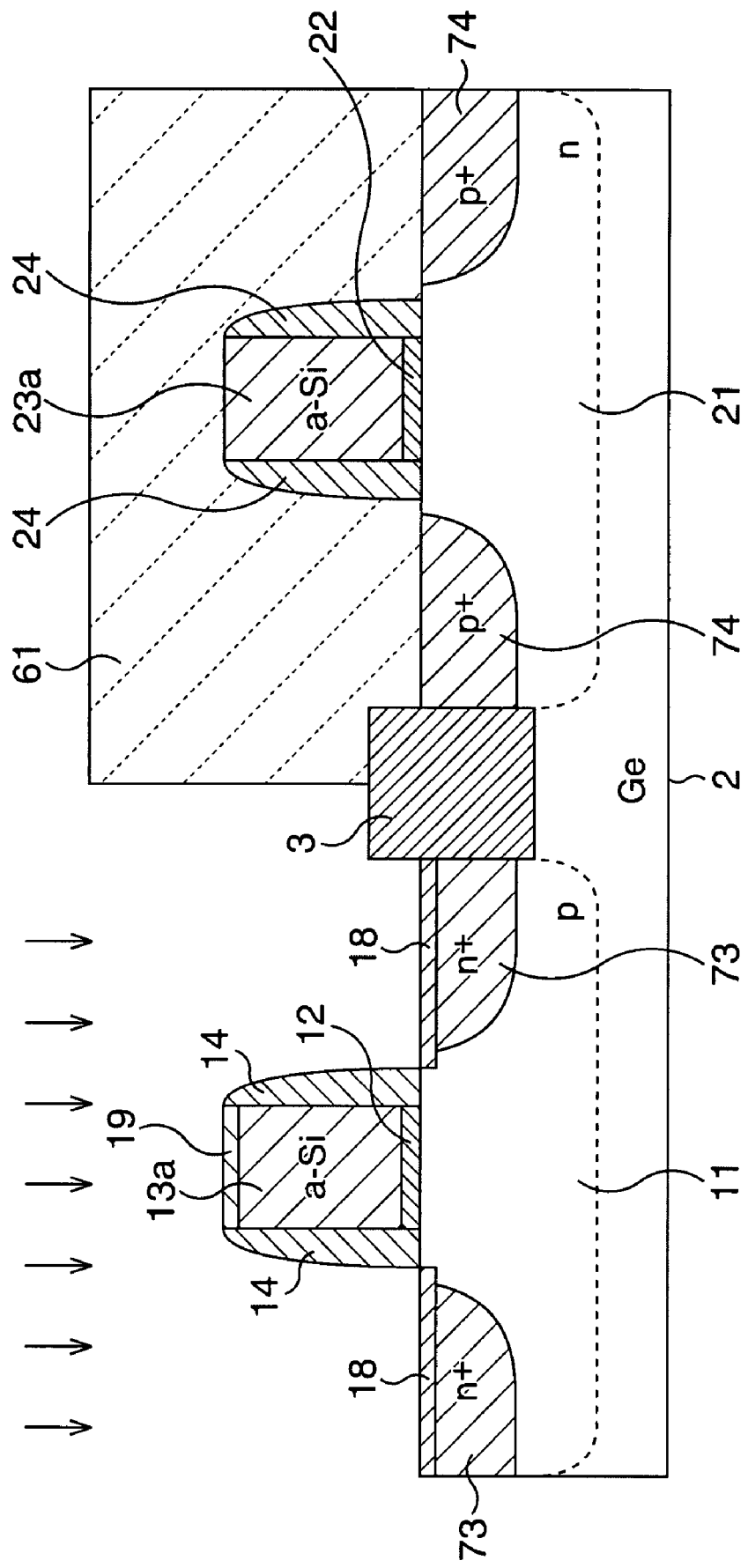
FIG. 42 is a schematic cross-sectional view, continued from FIG. 41, showing a major process in the manufacturing method of the Ge-channel CMOSFET according to the modified example 2 of the third embodiment, in order of processes.

Subsequently, as shown in FIG. 42, the region for forming the pMOSFET 110 is masked with a resist 61 and P, As, Sb, or the like, or S, Se, Te, or the like is ion-implanted as a predetermined impurity atom to the region for forming the nMOSFET 100. Consequently, implanted regions 18 overlapping with the deep source/drain regions 73 are formed in the surface layer of the Ge substrate 2 on both sides of the electrode layer 13a, and an implanted region 19 is formed in a surface layer of the electrode layer 13a. As conditions of this ion implantation, in a case where P, As, Sb or the like is used as the impurity atom, an accelerating voltage is set to about 1 keV and a dose amount is set to about $2 \times 10^{14}/cm^2$ to xabout $1 \times 10^{15}/cm^2$, for instance. Further, in a case where S, Se, Te, or the like is used as the impurity atom, the accelerating voltage is set to about 10 kV and the dose amount is set to about $5 \times 10^{13}/cm^2$ to about $1 \times 10^{15}/cm^2$, for instance.

After the ion implantation, the resist 61 is removed by ashing or the like.

Figure 43:
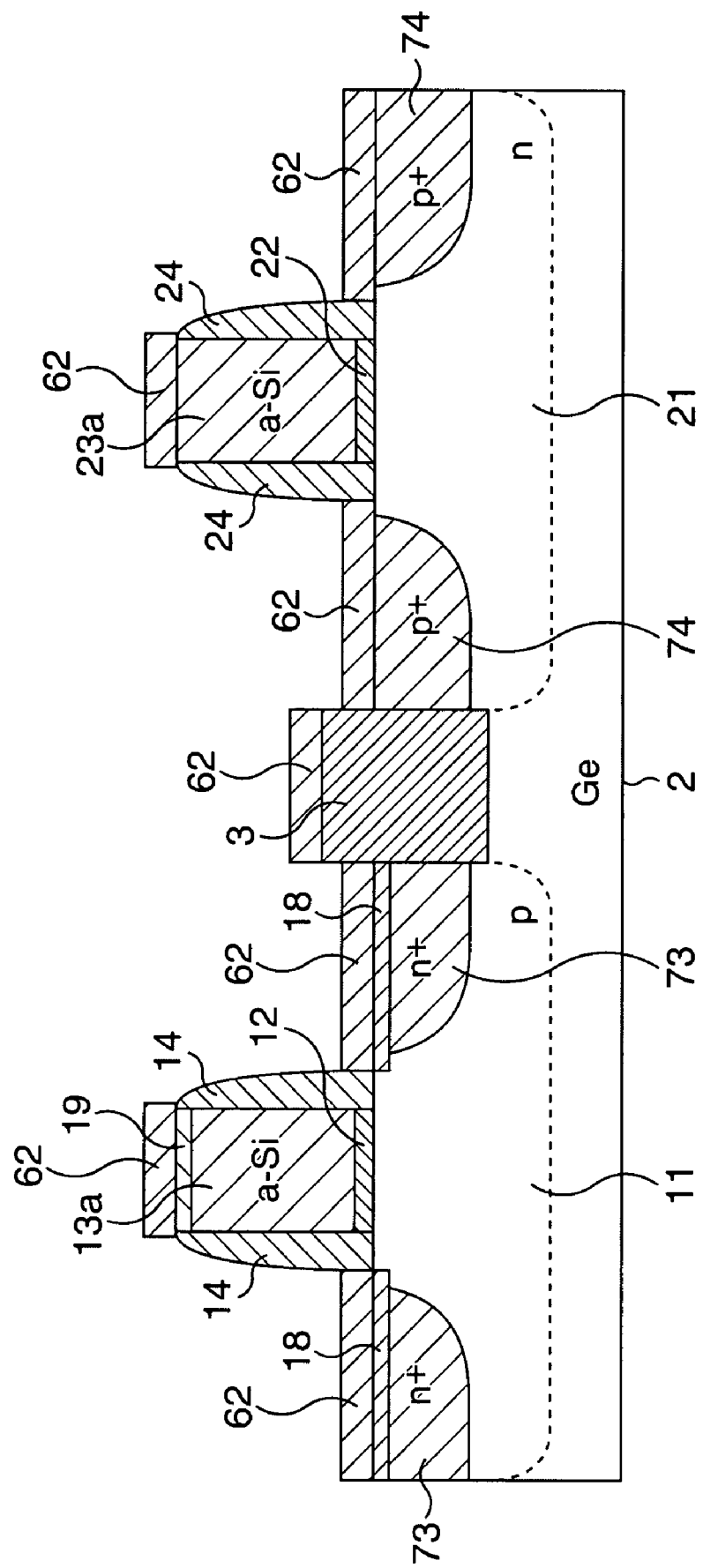
FIG. 43 is a schematic cross-sectional view, continued from FIG. 42, showing a major process in the manufacturing method of the Ge-channel CMOSFET according to the modified example 2 of the third embodiment, in order of processes.

Subsequently, as shown in FIG. 43, a Ni film 62 is deposited on the whole surface including the regions for forming the nMOSFET 100 and the pMOSFET 110 by a sputtering method or the like. A thickness of the Ni film 62 is set here to about 15 nm so that later-described NiGe layers 15, 25 have an appropriate thickness (junction depth).

Then, after the Ni film 62 is deposited, RTA is performed in a $N_2$ atmosphere at a hold temperature of about 400° C. (the temperature is increased from room temperature in two minutes) for a hold time of about one minute, whereby the Ni film 62 is caused to react with the Ge substrate 2 and the electrode layers 13a, 23a. Here, the reason why the hold temperature for the RTA is set to 400° is to make a value of the temperature fall within a range from 350° C. to 500° C. which is the proper temperature range obtained from the above studies by using FIG. 10.

Figure 44:
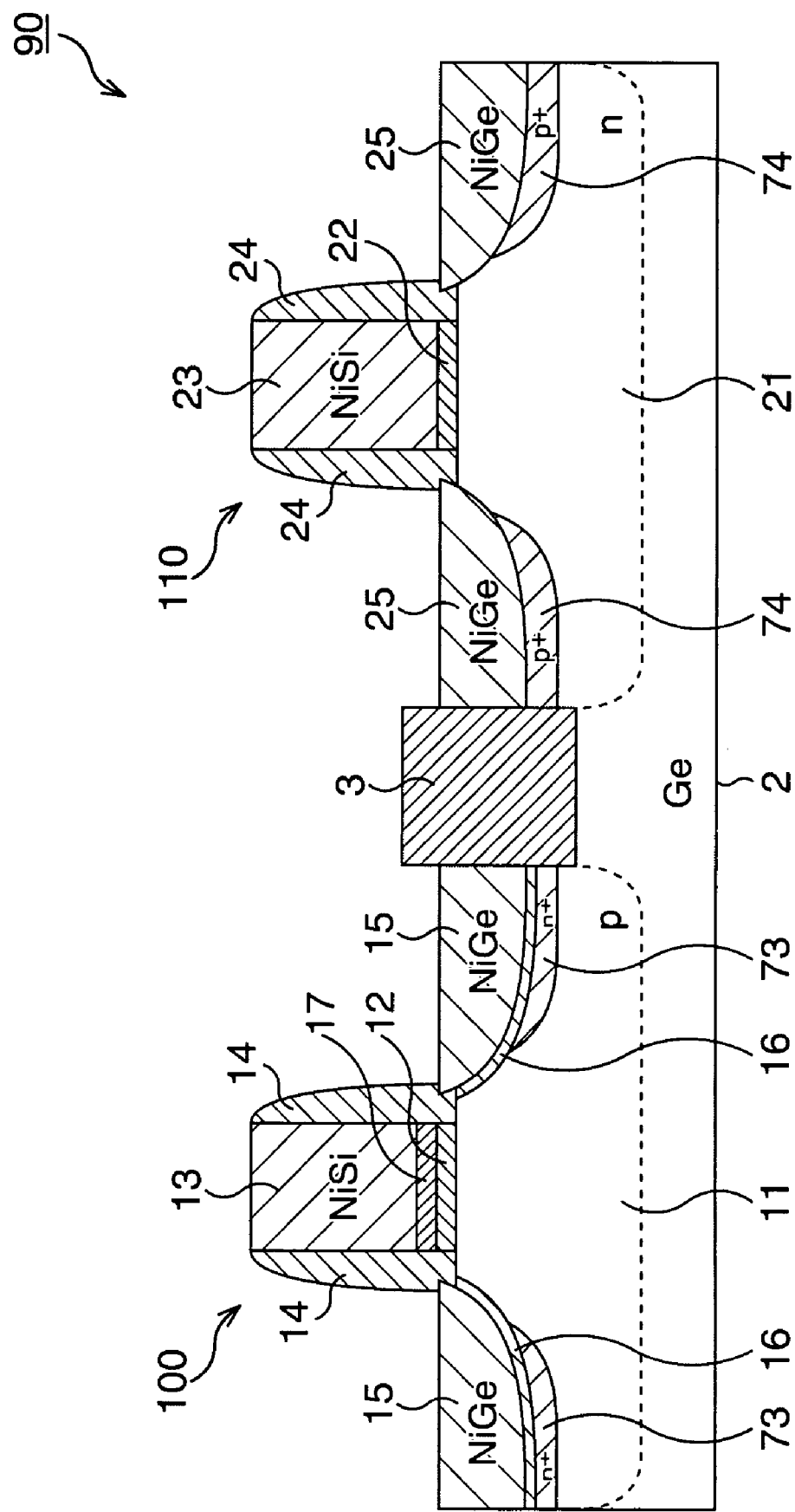
FIG. 44 is a schematic cross-sectional view, continued from FIG. 43, showing a major process in the manufacturing method of the Ge-channel CMOSFET according to the modified example 2 of the third embodiment, in order of processes.

Thereafter, the Ni film 62 which has not reacted is removed. Consequently, as shown in FIG. 44, gate electrodes 13, 23 of NiSi are formed by the silicidation of the electrode layers 13a, 23a, and the NiGe layers 15, 25 with a thickness (junction depth) of about 30 nm are formed by the germanidation of the surface layer of the Ge substrate 2 on both sides of the electrode layers 13a, 23a. At this time, the NiGe layers 15, 25 are formed to partly overlap with upper portions of the deep source/drain regions 73, 74, with the deep source/drain regions 73, 74 protruding downward from lower potions of the NiGe layers 15, 25. Further, the NiGe layers 15, 25 are formed at positions apart from the gate electrodes 13, 23 by a desired distance (positions closer to the gate electrodes 13, 23 than positions at which the deep source/drain regions 73, 74 are formed apart from the gate electrodes 13, 23 by a desired distance by being restricted by the sidewalls 91, 92) by being restricted by the sidewalls 14, 24. Therefore, according to the aforesaid restriction, end portions, of the NiGe layers 15, 25, on the gate electrodes 13, 23 side are positioned at places closer to the gate electrodes 15, 25 than the end portions, of the deep source/drain regions 73, 74, on the gate electrodes 15, 25 side accurately as restricted.

In the modified example 2, the positional relation of the deep source/drain regions 73, 74 and the NiGe layers 15, 25 is accurately restricted as described above, so that the NiGe layers 15, 25 become LDD (Light Doped Drain) regions or extension regions, and function as source/drain regions together with the sources/drains 73, 74. In a compound semiconductor device having Schottky junctions as source/drain regions, there sometimes occurs a problem of so-called junction leakage. In the modified example 2, by the structure in which the NiGe layers 15, 25 and the deep sources/drains 71, 72 form the double-layered source/drain regions, it is possible to greatly reduce the junction leakage ascribable to the Schottky junction.

Further, at this time, on junction interfaces of the NiGe layers 15 with the Ge substrate 2 and with the source/drain regions 71, the impurity atom of the implanted regions 18 is segregated by being pressed by NiGe in the course of the reaction to form first layers 16, and on an interface between the gate electrode 13 and the gate insulation film 12, the impurity atom of the implanted region 19 is segregated by being pressed by NiGe in the course of the reaction to form a second layer 17.

Thereafter, interlayer insulation films, wirings, and so on are formed in the usual manner, whereby the Ge-channel CMOSFET 90 according to the modified example 2 is completed.

As described above, according to the modified example 2, in the Ge-channel CMOSFET, a high-speed operation is enabled by using Ge as a semiconductor material forming a channel, the junction leakage ascribable to the Schottky junction is greatly reduced by accurately forming the LDD structure or the extension structure, and desired threshold voltage control and a high effective mobility characteristic are achieved by low-temperature and simple manufacturing processes.

In the modified example 2, after the formation of the deep source/drain regions 73, 74, the removal of the sidewalls 91, 92, and the formation of the sidewalls 14, 24, P, As, Sb, or the like, or S, Se, Te, or the like may be ion-implanted as the predetermined impurity atom, followed by the formation of the Ni film 62 and the RTA, as in the modified example 1.

Further, the first to third embodiments and the modified examples thereof described above show, as examples, the cases where Ge is used as the channel region, that is, the cases where the channel region is formed in the Ge substrate 2 or the Ge layer 31c, but $Si_xGe_{1-x}$ (0<x<1) may be used as the channel region instead of Ge. Here, it is preferable to use $Si_xGe_{1-x}$ (0<x≦0.3) to form a SiGe channel with the concentration of Ge being as high as 70% or higher. In the SiGe channel region, if a ratio of Ge is lower than 70%, it becomes difficult to obtain desired Schottky barrier height and threshold voltage.

Further, the cases where the Ni film 62 or 64 is used as metal which forms the intermetallic compound with Ge and Si are shown as examples, but in a case where the Schottky barrier height and a threshold voltage of the nMOSFET are modulated, Pt, titanium (Ti), cobalt (Co), or the like may be used instead of Ni. For example, when Ti or Co is used, it is possible to form a good titanium germanide (TiGe) layer or a cobalt germanium (CoGe) by performing RTA at a predetermined temperature after Ti or Co is deposited on Ge. Further, when Pt is used, it is possible to form a good PtGe layer under the same conditions as when Ni is used.

Further, the cases where the Schottky barrier height and the threshold voltage of each of the nMOSFETs 10, 40, 70, 100 are modulated is described, but the Schottky barrier height and the threshold voltage of each of the pMOSFETs 20, 50, 80 can be similarly modulated by using an appropriate impurity atom.

Concretely, to modulate the Schottky barrier height of the pMOSFETs 20, 50, 80, 110, it is preferable to use Er, Yb, or the like as metal forming the intermetallic compound which will form the source/drain regions, and to use, as the appropriate impurity atom, for example, one of an atom of group III and an atom of group VI, alternatively, an atom of group III and an atom of group VI, for example, B, indium (In), Ga, S, and so on independently or in appropriate combination.

Further, the cases where (amorphous) Si is used as the material of the gate electrodes 13, 23, 42, 52 are shown as examples, but Ge or $Si_xGe_{1-x}$ (0<x<1) may be used instead of Si as the material of the gate electrode. In a case where, for example, Ge is used as the material of the gate electrode, the germanidation for forming the source/drain regions and the germanidation for forming the gate electrode are performed.

According to the present invention, in a CMOSFET, a high-speed operation is enabled by using Ge or SiGe as a semiconductor material forming a channel, and desired threshold voltage control and a high effective mobility characteristic are achieved by low-temperature and simple manufacturing processes.

What is claimed is:

1. A semiconductor device which is a complementary semiconductor device comprising an n-channel transistor and a p-channel transistor,
wherein each of said n-channel transistor and said p-channel transistor comprises:
a semiconductor region comprised of germanium (Ge) or $Si_xGe_{1-x}$ (0<x<1);
a gate electrode which is formed on the semiconductor region via a gate insulation film and comprised of an intermetallic compound containing silicon (Si), germanium (Ge), or $Si_xGe_{1-x}$ (0<x<1); and
a pair of first junction regions formed in the semiconductor region on both sides of the gate electrode and each made of an intermetallic compound containing germanium (Ge).

2. The semiconductor device according to claim 1,
wherein one of said n-channel transistor and said p-channel transistor further comprises:
first layers provided on junction interfaces between said first junction regions and said semiconductor region respectively and each containing an element which modulates a Schottky barrier height formed by the junctions; and
a second layer provided on an interface between said gate electrode and the gate insulation film and containing the same element as the element of said first layers.

3. The semiconductor device according to claim 2,
wherein metals of the intermetallic compounds forming said gate electrode and said first junction regions contain nickel (Ni) or platinum (Pt),
wherein said first layers and said second layer are formed in said n-channel transistor, and
wherein the element of said first layers and said second layer is at least one kind selected from an atom of group V, an atom of group VI, and an atom of group VII.

4. The semiconductor device according to claim 2,
wherein metals of the intermetallic compounds forming said gate electrode and said first junction regions contain erbium (Er) or ytterbium (Yb),
wherein said first layers and said second layer are formed in said p-channel transistor, and
wherein the element of said first layers and said second layer is at least one kind selected from an atom of group III and an atom of group VI.

5. The semiconductor device according to claim 1,
wherein said n-channel transistor includes a pair of second junction regions each of which is formed by introducing an n-type impurity and which are formed in said semiconductor region to partly overlap with said first junction regions respectively and to protrude downward under said first junction regions respectively, and
wherein said p-channel transistor includes a pair of third junction regions each of which is formed by introducing a p-type impurity and which are formed in said semiconductor region to partly overlap with said first junction regions respectively and to protrude downward under said first junction regions respectively.

6. The semiconductor device according to claim 5, wherein end portions, of said first junction regions, on the gate electrode side are positioned at places closer to said gate electrodes than end portions, of said second junction regions and said third junction regions, on the gate electrode side.

7. The semiconductor device according to claim 1, wherein each of said semiconductor regions is comprised of $Si_xGe_{1-x}$ (0<x≦0.3).

8. A method of manufacturing a complementary semiconductor device including an n-channel transistor and a p-channel transistor, the method comprising:
depositing an electrode film comprised of silicon (Si), germanium (Ge), or $Si_xGe_{1-x}$ (0<x<1) on a semiconductor region comprised of silicon (Si), germanium (Ge), or $Si_xGe_{1-x}$ (0<x<1) via a gate insulation film, thereafter processing the electrode film into an electrode shape, and leaving the electrode film both in a region for forming the n-channel transistor and a region for forming the p-cannel transistor in the semiconductor region;
forming sidewall insulation films on both side surfaces of each of the electrode films;
depositing a metal film which is capable of forming an intermetallic compound with silicon (Si) and germanium (Ge), on an entire surface of the semiconductor region including the electrode films; and
performing heat treatment, thereby making the metal film react with portions, of the electrode films, in contact with the metal film to form gate electrodes each comprised of an intermetallic compound containing silicon (Si), germanium (Ge), or $Si_xGe_{1-x}$ (0<x<1), as well as making the metal film react with portions, of the semiconductor region, in contact with the metal film to form a pair of first junction regions each comprised of an intermetallic compound containing germanium (Ge) in a surface layer of the semiconductor region on both sides of each of the electrode films.

9. The method of manufacturing the semiconductor device according to claim 8, wherein each of the electrode films is an amorphous silicon (Si) film.

10. The method of manufacturing the semiconductor device according to claim 8, further comprising before depositing the metal film after forming the sidewall insulation films, introducing an element which modulates a Schottky barrier height formed on a junction interface between each of the first junction regions and the semiconductor region, to one of the region for forming the n-channel transistor and the region for forming the p-channel transistor in the semiconductor region, and wherein, after the metal film is deposited, the heat treatment is performed, thereby forming the first junction regions, and at the same time, segregating the element on the junction interfaces between the first junction regions and the semiconductor region to form first layers and segregating the element on an interface between the gate electrode and the gate insulation film to form a second layer.

11. The method of manufacturing the semiconductor device according to claim 10, wherein the metal film contains nickel (Ni) or platinum (Pt), and wherein, in forming the first layers and the second layer in the region for forming the n-channel transistor, the element of the first layers and the second layer is at least one kind selected from an atom of group V, an atom of group VI, and an atom of group VII.

12. The method of manufacturing the semiconductor device according to claim 10, wherein the metal film contains erbium (Er) or ytterbium (Yb), and wherein, in forming the first layers and the second layer in the region for forming the p-channel transistor, the element of the first layers and the second layer is at least one kind selected from an atom of group III and an atom of group VI.

13. The method of manufacturing the semiconductor device according to claim 8, further comprising before depositing the metal film after forming the sidewall insulation films, introducing an n-type impurity to a surface layer of the semiconductor region on both sides of the electrode film in the region for forming the n-type channel transistor, with the electrode film in the electrode shape used as a mask, to form a pair of second junction regions, and introducing a p-type impurity to the surface layer of the semiconductor region on both sides of the electrode film in the region for forming the p-channel transistor, with the electrode film in the electrode shape used as a mask, to form a pair of third junction regions, wherein after the metal film is deposited, the first junction regions are formed by the heat treatment, the first junction regions in the region for forming the n-channel transistor being partly overlapped with the second junction regions, with the second junction regions protruding downward therefrom, and the first junction regions in the region for forming the p-channel transistor being partly overlapped with the third junction regions, with the third junction regions protruding downward therefrom.

14. The method of manufacturing the semiconductor device according to claim 13, wherein, in forming the first junction regions, end portions, of the first junction regions, on the gate electrode side are positioned at places closer to the gate electrodes than end portions, of the second junction regions and the third junction regions, on the gate electrode side.

15. The method of manufacturing the semiconductor device according to claim 14, further comprising:

before forming the sidewall insulation films after processing the electrode films, forming adjustment sidewall insulation films which are wider than the sidewall insulation films, on the both side surfaces of the electrode films in order to adjust formation positions of the second junction regions and the third junction regions; and after forming the second junction regions and the third junction regions in a state where the adjustment sidewall insulation films are formed, removing the adjustment sidewall insulation films, and wherein, after the adjustment sidewall insulation films are removed, the sidewall insulation films are formed and the first junction regions are formed.

16. The method of manufacturing the semiconductor device according to claim 8, wherein the semiconductor region is comprised of $Si_xGe_{1-x}$ ($0 < x \leqq 0.3$).

* * * * *